US012066758B2

(12) United States Patent
Vles et al.

(10) Patent No.: US 12,066,758 B2
(45) Date of Patent: Aug. 20, 2024

(54) PELLICLE AND PELLICLE ASSEMBLY

(71) Applicants:ASML NETHERLANDS B.V., Veldhoven (NL); ASML HOLDING N.V., Veldhoven (NL)

(72) Inventors: David Ferdinand Vles, Eindhoven (NL); Erik Achilles Abegg, Eindhoven (NL); Aage Bendiksen, Fairfield, CT (US); Derk Servatius Gertruda Brouns, Herentals (BE); Pradeep K. Govil, Norwalk, CT (US); Paul Janssen, Eindhoven (NL); Maxim Aleksandrovich Nasalevich, Eindhoven (NL); Arnoud Willem Notenboom, Rosmalen (NL); Mária Péter, Eindhoven (NL); Marcus Adrianus Van De Kerkhof, Helmond (NL); Willem Joan Van Der Zande, Bussum (NL); Pieter-Jan Van Zwol, Eindhoven (NL); Johannes Petrus Martinus Bernardus Vermeulen, Leende (NL); Willem-Pieter Voorthuijzen, 's-Hertogenbosch (NL); James Norman Wiley, Menlo Park, CA (US)

(73) Assignees: ASML NETHERLANDS B.V., Veldhoven (NL); ASML HOLDING N.V., Veldhoven (NL)

( * ) Notice: Subject to any disclaimer, the term of this patent is extended or adjusted under 35 U.S.C. 154(b) by 0 days.

(21) Appl. No.: 17/728,608

(22) Filed: Apr. 25, 2022

(65) Prior Publication Data

US 2022/0252974 A1 Aug. 11, 2022

Related U.S. Application Data

(63) Continuation of application No. 17/206,649, filed on Mar. 19, 2021, now Pat. No. 11,347,142, which is a
(Continued)

(30) Foreign Application Priority Data

Dec. 17, 2015 (EP) .................................... 15200767

(51) Int. Cl.
*G03F 7/20* (2006.01)
*G03F 1/22* (2012.01)
(Continued)

(52) U.S. Cl.
CPC .................. *G03F 1/64* (2013.01); *G03F 1/22* (2013.01); *G03F 1/62* (2013.01); *G03F 7/7085* (2013.01);
(Continued)

(58) Field of Classification Search
CPC ..... G03F 1/64; G03F 1/22; G03F 1/62; G03F 7/7085; G03F 7/70916; G03F 7/70983
See application file for complete search history.

(56) References Cited

U.S. PATENT DOCUMENTS 6,197,454 B1 3/2001 Yan
9,927,715 B2 3/2018 Roset et al.
(Continued)

FOREIGN PATENT DOCUMENTS

CN 102193333 9/2011
EP 2246738 11/2010
(Continued)

OTHER PUBLICATIONS

International Search Report and Written Opinion issued for International Patent Application No. PCT/EP2016/079599, dated Jun. 8, 2017.
(Continued)

*Primary Examiner* — Mesfin T Asfaw
(74) *Attorney, Agent, or Firm* — Pillsbury Winthrop Shaw Pittman, LLP

(57) ABSTRACT

A pellicle suitable for use with a patterning device for a lithographic apparatus. The pellicle comprising at least one
(Continued)

breakage region which is configured to preferentially break, during normal use in a lithographic apparatus, prior to breakage of remaining regions of the pellicle. At least one breakage region comprises a region of the pellicle which has a reduced thickness when compared to surrounding regions of the pellicle.

20 Claims, 17 Drawing Sheets

Related U.S. Application Data continuation of application No. 16/667,956, filed on Oct. 30, 2019, now Pat. No. 10,983,431, which is a continuation of application No. 16/062,017, filed as application No. PCT/EP2016/079599 on Dec. 2, 2016, now Pat. No. 10,466,585.

(60) Provisional application No. 62/365,524, filed on Jul. 22, 2016, provisional application No. 62/328,291, filed on Apr. 27, 2016.

(51) Int. Cl.
 G03F 1/62 (2012.01)
 G03F 1/64 (2012.01)
 G03F 7/00 (2006.01)

(52) U.S. Cl.
 CPC ...... *G03F 7/70916* (2013.01); *G03F 7/70983* (2013.01)

(56) References Cited

U.S. PATENT DOCUMENTS

| | | |
|---|---|---|
| 2002/0126269 A1 | 9/2002 | Sato |
| 2005/0045262 A1 | 3/2005 | Eschbach |
| 2009/0246644 A1 | 10/2009 | Chakravorty et al. |
| 2010/0059083 A1* | 3/2010 | Tsou .................. G03F 1/82 |
| | | 134/1 |
| 2011/0014577 A1 | 1/2011 | Hashimoto |
| 2012/0219654 A1 | 8/2012 | Kim et al. |
| 2014/0253887 A1 | 9/2014 | Wu et al. |
| 2014/0370423 A1 | 12/2014 | Goldfarb |
| 2015/0160569 A1 | 6/2015 | Oliveros |
| 2015/0168844 A1 | 6/2015 | Schaffer |
| 2015/0192861 A1 | 7/2015 | Banine et al. |
| 2015/0212434 A1 | 7/2015 | Lairson et al. |
| 2016/0274471 A1 | 9/2016 | Lee |

FOREIGN PATENT DOCUMENTS

| | | |
|---|---|---|
| JP | 62-055654 | 3/1987 |
| JP | 2-195355 | 8/1990 |
| JP | H04159551 | 2/1992 |
| JP | 7-271016 | 10/1995 |
| JP | 8-76361 | 3/1996 |
| JP | H1038814 | 2/1998 |
| JP | H10239830 | 9/1998 |
| JP | 2005-165141 | 6/2005 |
| JP | 2005-309129 | 11/2005 |
| JP | 2010-045283 | 2/2010 |
| JP | 2010-186167 | 8/2010 |
| JP | 2011-022308 | 2/2011 |
| JP | 2013-123018 | 6/2013 |
| JP | 2015204339 | 11/2015 |
| WO | 2005/124836 | 12/2005 |
| WO | 2009122972 | 10/2009 |
| WO | 2015/082214 | 6/2015 |
| WO | 2015/112310 | 7/2015 |

OTHER PUBLICATIONS

Unknown, "Research Disclosure," Mason Publications, Hampshire, GB, vol. 594, No. 72, Oct. 1, 2013, 4 pages.
Search Report and Written Opinion issued for corresponding Netherlands Patent Application No. 2020114, dated Jun. 29, 2018.
Unknown, "Research Disclosure," Mason Publications, Hampshire, GB, vol. 600, No. 53, Apr. 1, 2014, 4 pages.
Unknown, "Research Disclosure," Mason Publications, Hampshire, GB, vol. 599, No. 29, Mar. 1, 2014, 5 pages.
Unknown, "Research Disclosure," Mason Publications, Hampshire, GB, vol. 587, No. 13, Mar. 1, 2013, 6 pages.
Search Report dated Jun. 14, 2019 issued in corresponding Netherlands Application No. NL 2022101.
Search Report dated Jun. 13, 2019 issued in corresponding Netherlands Application No. NL 2022099.
Florian Dhalluin et al., "Grid-supported EUV pellicles: A theoretical investigation for added value", Proc. of SPIE vol. 9658, pp. 96580J-1-96580J-11 (2015).
Search Report dated Apr. 15, 2020 issued in corresponding Netherlands Application No. 2023682.
Notice of Reasons for Rejection dated Mar. 1, 2022, issued in corresponding Japanese Patent Application No. 2021-068842 with English translation (9 pgs.).
First Office Action dated Sep. 3, 2021, issued in corresponding Chinese Patent Application No. 201680082151.3 with English translation (13 pgs.).
Notice of Reasons for Refusal dated Sep. 27, 2022, issued in corresponding Japanese Patent Application No. 2021-068842 with English translation (6 pgs.).
Office Action issued in corresponding Japanese Patent Application No. 2023-64665, dated Apr. 9, 2024.

\* cited by examiner

FIG. 12A  FIG. 12B

PELLICLE AND PELLICLE ASSEMBLY

This application is a continuation of U.S. patent application Ser. No. 17/206,649, filed on Mar. 19, 2021, now allowed, which is a continuation of U.S. patent application Ser. No. 16/667,956, filed on Oct. 30, 2019, now U.S. Pat. No. 10,983,431, which is a continuation of U.S. patent application Ser. No. 16/062,017, filed on Jun. 13, 2018, now U.S. Pat. No. 10,466,585, which is a U.S. national phase entry of PCT/EP2016/079599, filed on Dec. 2, 2016, which claims the benefit of priority of European patent application no. 15200767.0, filed on Dec. 17, 2015, of U.S. provisional application No. 62/328,291, filed on Apr. 27, 2016, and of U.S. provisional application No. 62/365,524, filed on Jul. 22, 2016, each of the foregoing applications is incorporated herein in its entirety by reference.

FIELD

The present description relates to a pellicle and a pellicle assembly. A pellicle assembly may comprise a pellicle and a frame for supporting the pellicle. A pellicle may be suitable for use with a patterning device for a lithographic apparatus. The present description has particular, but not exclusive, use in connection with EUV lithographic apparatus and EUV lithographic tools.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g., a mask) onto a layer of radiation-sensitive material (resist) provided on a substrate.

The wavelength of radiation used by a lithographic apparatus to project a pattern onto a substrate determines the minimum size of features that can be formed on that substrate. A lithographic apparatus that uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

A pattern may be imparted to a radiation beam in a lithographic apparatus using a patterning device. A patterning device may be protected from particle contamination by a pellicle. The pellicle may be supported by a pellicle frame.

The use of pellicles in lithography is well-known and well-established. A typical pellicle in a DUV lithographic apparatus is a membrane which is located away from the patterning device and is out of the focal plane of a lithographic apparatus in use. Because the pellicle is out of the focal plane of the lithographic apparatus, contamination particles which land on the pellicle are out of focus in the lithographic apparatus. Consequently, images of the contamination particles are not projected onto the substrate. If the pellicle were not present, then a contamination particle which landed on the patterning device would be projected onto the substrate and would introduce a defect into the projected pattern.

It may be desirable to use a pellicle in an EUV lithographic apparatus. EUV lithography differs from DUV lithography in that it is typically performed in a vacuum and the patterning device is typically reflective rather than being transmissive.

It may be desirable to provide a pellicle and a pellicle assembly which overcome or mitigate a problem associated with the prior art. Embodiments which are described herein may have use in an EUV lithographic apparatus. Embodiments may have use in a DUV lithographic apparatus or another form of lithographic apparatus.

SUMMARY

According to an aspect, there is provided a pellicle suitable for use with a patterning device for a lithographic apparatus, the pellicle comprising at least one breakage region which is configured to preferentially break, during normal use in a lithographic apparatus, prior to breakage of remaining regions of the pellicle.

Including a breakage region in the pellicle advantageously allows a position on the pellicle which breaks first to be pre-determined. A breakage region of a pellicle may be structurally weaker than surrounding portions of the pellicle. A breakage region may be configured such that the pellicle breaks in a controlled manner which limits contamination of the surrounding environment with any pellicle debris. Additionally or alternatively a breakage region provides a region of the pellicle which can be monitored for signs of impending failure of the pellicle. Breakage of the breakage region may indicate that the remainder of the pellicle will soon fail and, when detected, may be acted upon to remove the pellicle from operation.

The at least one breakage region may comprise a region of the pellicle which has a reduced thickness when compared to surrounding regions of the pellicle.

The at least one breakage region may comprise a region of the pellicle which has been exposed to radiation so as to structurally weaken the breakage region when compared to the remaining regions of the pellicle.

The at least one breakage region may comprise a region of the pellicle in which one or more holes and/or cracks are formed.

The at least one breakage region may comprise a region of the pellicle which has been exposed to a substance configured to structurally weaken the breakage region when compared to the remaining regions of the pellicle.

The pellicle may further comprise a reinforced region positioned adjacent a breakage region, wherein the reinforced region has an increased thickness when compared to the remaining regions of the pellicle.

The reinforced region may trace out a curved shape on the pellicle.

The at least one breakage region may comprise a fracture line which is configured to preferentially break prior to breakage of remaining regions of the pellicle so as to form a crack in the pellicle along the fracture line.

The pellicle may further comprise a sensor configured to monitor the at least one breakage region and detect breakage of the at least on breakage region.

According to an aspect, there is provided a pellicle assembly comprising: a pellicle as described above; and a frame configured to support the pellicle; wherein the pellicle comprises a perimeter portion which is supported by the frame and an unsupported portion which is enclosed by the perimeter portion.

A fracture line may extend between sections of the perimeter portion of the pellicle which is supported by the frame.

The fracture line may enclose a portion of the pellicle which is positioned at an edge of the unsupported portion.

Part of a reinforced portion of the pellicle may contact the frame.

The increased thickness of a reinforced portion causes the reinforced portion to be heated to higher temperatures than other portions of the pellicle. Contact between the reinforced portion of the pellicle and the frame provides a thermal connection between the reinforced portion and the frame which allows conductance of heat out of the pellicle and into the frame.

The at least one breakage region may form part of the perimeter portion of the pellicle which is supported by the frame.

According to an aspect, there is provided a pellicle assembly suitable for use with a patterning device for a lithographic apparatus, the pellicle assembly comprising: a frame configured to support a pellicle; and a pellicle attached to the frame, wherein the pellicle comprises at least a first layer having a first tension and a second layer having a second tension wherein the first tension is higher than the second tension such that in the event of breakage of the pellicle the difference between the first and second tensions causes the pellicle to roll up.

A pellicle which rolls up on itself when it breaks advantageously contains any pellicle debris within itself. This reduces contamination of the surrounding environment with pellicle debris.

The pellicle may further comprise at least one breakage region which is configured to preferentially break, during normal use in a lithographic apparatus, prior to breakage of remaining regions of the pellicle, the at least one breakage region being positioned such that breakage of the pellicle at the at least one breakage region ensures that the pellicle rolls up.

According to an aspect, there is provided a pellicle suitable for use with a patterning device for a lithographic apparatus, the pellicle comprising: at least one electrically conductive layer; and a plurality of electrical contacts at which an electrical connection to the electrically conductive layer can be established, thereby allowing the electrical resistance of the electrically conductive layer between contacts to be measured.

According to an aspect, there is provided a pellicle failure detection apparatus comprising: a pellicle as described above; and a sensor connected to at least two of the electrical contacts on the pellicle, the sensor being configured to measure the resistance between the electrical contacts.

The electrically conductive layer in the pellicle may be configured to emit thermal energy from the pellicle so as to regulate the temperature of the pellicle. Over time the electrically conductive layer may become oxidized. Oxidation of the electrically conductive layer causes a reduction in the emissivity of the layer and thus a reduction in the efficiency with which thermal energy is emitted from the pellicle. Oxidation of the electrically conductive layer also increases the electrical resistance of the layer. The sensor may detect an increase in the electrical resistance of the electrically conductive layer which is indicative of oxidation of the layer and a reduction in the emissivity of the layer. If the electrical resistance of the electrically conductive layer increases above a threshold amount, then the pellicle may no longer be suitable for use and the pellicle may be replaced.

An increase in the electrical resistance of the electrically conductive layer may additionally or alternatively be indicative of a crack in the pellicle. Monitoring the resistance of the electrically conductive layer with the sensor may therefore allow a crack in the pellicle to be identified.

According to an aspect, there is provided a pellicle failure detection apparatus comprising a sensor assembly arranged to detect a change in a property associated with a pellicle situated on a pellicle frame, wherein a change in the property associated with the pellicle is indicative of damage to the pellicle.

The sensor assembly may be configured to detect a change in optical transmission or optical reflection of radiation by the pellicle.

The sensor assembly may comprise: a radiation source configured to couple a radiation beam into the pellicle such that radiation is transmitted along the pellicle; and a radiation sensor configured to receive radiation which is reflected back through the pellicle or to receive radiation which is transmitted through the pellicle, a change in the reflected or transmitted radiation received by the sensor being indicative of damage to the pellicle.

The sensor assembly may be configured to detect a change in acoustic transmission or acoustic reflection of sound waves by the pellicle.

The sensor assembly may comprise: a transducer configured to generate sound waves in the pellicle; and a sensor configured to receive sound waves reflected back through the pellicle or to receive sound waves transmitted through the pellicle, a change in the reflected or transmitted sound waves received by the sensor being indicative of damage to the pellicle.

The sensor assembly may comprise a stress sensor configured to measure a stress to which a pellicle is subjected.

The sensor may comprise a strain gauge configured to measure the strain which a pellicle undergoes.

According to an aspect, there is provide a pellicle suitable for use with a patterning device for a lithographic apparatus, the pellicle comprising: a first layer having a first ductility; a second layer having a second ductility; and a third layer having a third ductility, wherein the third layer is situated in between the first and second layers and wherein the third ductility is less than the first ductility and less than the second ductility.

The third layer has a ductility which is less than the ductility of the first and second layers. The third layer is therefore relatively brittle when compared to the first and second layers. When the pellicle is placed under a tensile stress, the third layer will break before the first and second layers break. Breakage of the third layer causes energy to be dissipated prior to critical breakage of the pellicle. The first and second layers may undergo further strain after breakage of the third layer leading to further dissipation of energy. Since the third layer is situated in between the first and second layers, broken pieces of the third layer will be advantageously contained by the first and second layers and will not therefore contaminate the surrounding environment.

According to an aspect, there is provided a debris mitigation apparatus comprising a debris steering device arranged close to a pellicle for a lithographic apparatus, the debris steering device being configured to direct debris resulting from breakage of the pellicle in a preferred direction.

The debris mitigation apparatus further comprises a sensor configured to monitor a pellicle and detect breakage of the pellicle, wherein the debris steering device is configured to react to a detection of breakage of the pellicle and direct debris resulting from breakage of the pellicle in a preferred direction.

The debris steering device may comprise: an enclosed chamber positioned close to the pellicle wherein the inside of the chamber is held at a pressure which is lower than the pressure at which the pellicle is held; and an actuator configured to open the chamber in reaction to a detection of breakage of the pellicle thereby causing the debris resulting from the broken pellicle to be sucked into the chamber.

The debris steering device may comprise: an enclosed chamber positioned close to the pellicle wherein the inside of the chamber is held at a pressure which is higher than the pressure at which the pellicle is held; and an actuator configured to open the chamber in reaction to a detection of breakage of the pellicle thereby causing the debris resulting from the broken pellicle to be blown away from the chamber and in a preferential direction.

The debris steering device may comprise an electrically charged surface positioned close to the pellicle such that in the event of breakage of the pellicle debris from the pellicle is directed towards the electrically charged surface by electrostatic attraction.

According to an aspect, there is provided a debris mitigation apparatus comprising: a sensor configured to monitor a pellicle held by a frame and detect damage to the pellicle; and a tension controlling device configured to react to detection of damage to the pellicle and reduce the tension in the pellicle, thereby limiting further damage to the pellicle.

The tension controlling device may comprise a plurality of actuators configured to compress a frame on which the pellicle is held, thereby reducing the tension in the pellicle which held by the frame.

The tension controlling device may comprise a temperature controlling device configured to increase the temperature of the pellicle, thereby reducing the tension in the pellicle.

The temperature controlling device may be configured to increase the temperature of the pellicle by resistive heating.

The temperature controlling device may comprise a radiation source configured to illuminate all or part of the pellicle so as to increase the temperature of the pellicle.

According to an aspect, there is provided a pellicle frame configured to support a pellicle around a perimeter portion of the pellicle so as to enclose a suspended region of the pellicle, wherein the pellicle frame comprises: a first pair of side portions positioned at opposite edges of the suspended region of the pellicle and extending along the edges of the suspended region of the pellicle in a first direction; and a second pair of side portions positioned at opposite edges of the suspended region of the pellicle and extending along the edges of the suspended region of the pellicle in a second direction, which is substantially perpendicular to the first direction; wherein the first pair of side portions are configured to have a compliance in the second direction which is greater than a compliance of the second pair of side portions in the first direction such that a pellicle supported by the pellicle frame has an initial tension in the second direction which is less than an initial tension of the pellicle in the first direction.

The first pair of side portions may each have thicknesses in the second direction which are less than thicknesses of the second pair of side portions in the first direction.

The first pair of side portions may each include slits which extend in the first direction along the first pair of side portions.

According to an aspect, there is provided a pellicle failure detection apparatus comprising: a radiation source configured to illuminate, with a radiation beam, a portion of a pellicle arranged to protect a patterning device; a sensor arranged to detect a portion of the radiation beam reflected from the pellicle; and a controller in communication with the sensor and configured to detect failure of the pellicle from the detection of reflected radiation made by the sensor.

The pellicle failure detection apparatus may advantageously be used to remotely monitor for failure of a pellicle. The radiation source may be separate to a radiation source provided in a lithographic apparatus and which is used for the purposes of performing lithographic exposures. The radiation source may, for example, comprise a laser. The radiation source may emit a radiation beam having a wavelength which is longer than wavelengths associated with ultraviolet radiation.

The radiation source may be configured such that the radiation beam is incident on the pellicle at a non-normal angle of incidence.

By illuminating a pellicle with radiation at a non-normal angle of incidence, the position of reflected radiation depends on whether the radiation has been reflected from the pellicle or the patterning device, which is situated behind the pellicle. Radiation which is reflected from the pellicle may therefore be distinguished from radiation which is reflected from the patterning device (on the basis of the position of the reflected radiation). Radiation which is reflected from the pellicle may therefore be measured independently of radiation which is reflected from the patterning device. Such a measurement may allow failure of the pellicle to be detected from measurements of the radiation reflected form the pellicle.

The sensor may be arranged to detect diffuse reflection of the radiation beam from the pellicle.

The sensor may be arranged to detect specular reflection of the radiation beam from the pellicle.

The controller may be configured to detect failure of the pellicle when a measure, made by the sensor, of the intensity of the portion of the radiation beam reflected from the pellicle falls below a threshold value.

The sensor may be further configured to detect a portion of the radiation beam reflected from the patterning device, the portion of the radiation beam reflected from the patterning device being incident on the sensor at a different position to the portion of the radiation beam reflected from the pellicle.

The sensor may comprise a first sensor region configured to detect radiation reflected from the pellicle and a second sensor region configured to detect radiation reflected from the patterning device.

According to an aspect, there is provided a pellicle failure detection apparatus comprising: a radiation source configured to illuminate, with a radiation beam, a portion of a patterning device protecting by a pellicle, wherein the radiation beam is transmitted through the pellicle; a sensor apparatus arranged to receive and measure at least a portion of the radiation beam transmitted through the pellicle a controller in communication with the sensor apparatus and configured to detect failure of the pellicle when a measure of the intensity of the radiation received by the sensor apparatus increases.

The radiation source may, for example, emit EUV radiation. The radiation source may form part of a lithographic apparatus and may otherwise be used for the purpose of performing lithographic exposures. The radiation provided by the radiation source may be directed to be incident on the patterning device by one or more other components which may be considered to form an illumination system.

The patterning device may include a reflective fiducial and the sensor apparatus may be configured to measure a portion of the radiation beam which is reflected from the fiducial.

The sensor apparatus and the controller may be further configured to determine an alignment of a feature formed in the portion of the radiation beam reflected from the fiducial.

The sensor apparatus and the controller may be further configured to determine wavefront aberrations in the portion of the radiation beam reflected from the fiducial.

According to an aspect, there is provided a pellicle suitable for use with a patterning device for a lithographic apparatus, the pellicle comprising a plurality of termination features, wherein the termination features are configured such that, in the event that a crack in the pellicle, having a crack tip, propagates into the termination feature, the crack tip experiences a decrease in a stress at the crack tip.

The termination features may advantageously terminate the propagation of the crack through the pellicle. This may prevent the crack from damaging further portions of the pellicle and may prevent complete failure of the pellicle (i.e. the crack extending across substantially the whole pellicle). By terminating a crack using a termination feature, the creation of pellicle debris may be reduced. The termination features therefore advantageously reduce contamination of surrounding compounds with pellicle debris in the event of failure of the pellicle.

The termination features may be configured such when the pellicle is placed under tension the resulting stress in the termination features is less than the resulting stress in regions of the pellicle outside of the termination features.

The termination features may be arranged in a substantially regular pattern.

The termination features may comprise holes formed in the pellicle.

The holes may be substantially circular holes.

The holes may have a lateral dimension which is greater than about 10 nanometers.

The lateral dimension may, for example, be a radius of a hole.

The holes may have a lateral dimension which is greater than about 20 nanometers.

The termination features may comprise doped regions of the pellicle which are doped with a doping material.

In some embodiments, a doping material may be a p-type dopant. In some embodiments, a doping material may be an s-type dopant.

In some embodiments the pellicle may comprise silicon (e.g. a polysilicon film). In such embodiments the doping material may be a p-type dopant such as a dopant comprising one or more of boron, aluminum, nitrogen, gallium and/or indium. Additionally or alternatively, the doping material may be an n-type dopant such as a dopant comprising phosphorus, arsenic, antimony, bismuth and/or lithium.

In some embodiments the pellicle may comprise graphene. In such embodiments the doping material may comprise one or more of boron, nitrogen, titanium, chromium, platinum, cobalt, indium and/or sulfur. Additionally or alternatively the doping material may comprise one or more of organic molecules, acids, bases and/or halides. In some embodiments the doping material may comprise a transition metal such as copper, nickel, ruthenium, molybdenum and/or platinum.

The doping material may comprise boron.

The doped regions may be substantially circular.

The termination features may comprise a plurality of stripes of doped regions which are doped with a doping material.

The stripes of doped regions may be arranged substantially parallel to each other.

The doped regions may have a lateral dimension of greater than about 10 nanometers.

The doped regions may have a lateral dimension which is greater than about 20 nanometers.

The pellicle may include a termination feature comprising a border portion of the pellicle which is doped with a doping material, wherein the border portion is arranged around the perimeter of a suspended region of the pellicle, the suspended region being a region which is configured to be suspended across a pellicle frame.

According to an aspect, there is provided a load stage for a lithographic apparatus, the load stage comprising: a chamber configured to receive a patterning device protected by a pellicle; a sensor apparatus configured to measure the position of at least a portion of the pellicle situated in the chamber; and a pressure changing apparatus configured to change the pressure inside the chamber, wherein the pressure changing apparatus is configured to control the rate at which the pressure inside the chamber is changed in response to the measurements of the positions of at least a portion of the pellicle.

The pressure changing apparatus may be configured to reduce the rate at which the pressure inside the chamber is changed in response to measurements indicating that the position of the pellicle lies outside a desired range of the position of the pellicle.

The desired range of the position of the pellicle may lie between a minimum distance from a patterning device and a maximum distance from the patterning device.

The sensor apparatus may comprise a radiation source configured to illuminate at least a portion of a pellicle with radiation and a radiation sensor arranged to receive and measure radiation reflected from the pellicle.

The radiation source may be configured to illuminate the pellicle at a non-normal angle of incidence and wherein the radiation sensor is configured to measure the position at which reflected radiation is incident on the radiation sensor.

The sensor apparatus may comprise a confocal imaging sensor.

The sensor apparatus may be positioned outside of the chamber and the chamber may include a window configured to allow radiation to propagate into and out of the chamber.

The pressure changing apparatus may be configured to pump the chamber to vacuum pressure conditions when loading a patterning device into the lithographic apparatus.

The pressure changing apparatus may be configured to vent the chamber to atmospheric pressure conditions when unloading a patterning device from a lithographic apparatus.

The load stage may further comprise a controller configured to record a change in the position of the pellicle as a function of pressure inside the chamber.

The controller may be further configured to detect fatigue of the pellicle from the recorded change in the position of the pellicle as a function of pressure inside the chamber.

According to an aspect, there is provided a method of treating a pellicle, the method comprising: heating at least a portion of the pellicle to a temperature greater than a ductile to brittle transition temperature of the pellicle; and placing the pellicle under tension, wherein the tension in the pellicle is sufficient to cause plastic deformation of at least a portion of the heated portion of the pellicle.

Heating at least a portion of the pellicle may comprise locally heating only some portions of the pellicle.

Heating at least a portion of the pellicle may comprise heating a pellicle frame to which the pellicle is attached.

Heating at least a portion of the pellicle may comprise illuminating at least a portion of the pellicle with radiation.

Heating at least a portion of the pellicle may comprise illuminating at least a portion of the pellicle with a laser beam.

Placing the pellicle under tension may comprise suspending the pellicle across a pellicle frame.

Placing the pellicle under tension further comprises creating a pressure difference across the pellicle.

According to an aspect, there is provided a pellicle assembly suitable for use with a patterning device for a lithographic apparatus, the pellicle assembly comprising: a frame configured to support a pellicle; a pellicle attached to the frame, wherein the pellicle comprises at least one electrically conductive layer; and a current source connected across the at least one electrically conductive layer and configured to generate an electrical current through the at least one electrically conductive layer, wherein the current source is configured to generate a current which heats the pellicle through resistive heating such that the temperature of the pellicle is greater than a threshold temperature.

The threshold temperature may be about 120 degrees Celsius.

The current source may be configured to generate a substantially continuous current through the at least one electrically conductive layer.

According to an aspect, there is provided a pellicle assembly suitable for use with a patterning device for a lithographic apparatus, the pellicle assembly comprising: a frame configured to support a pellicle; a pellicle attached to the frame; and a tension controlling apparatus configured to adjust the tension in the pellicle.

The tension controlling apparatus may comprise at least one heater configured to heat a component of the pellicle assembly, wherein heating the component of the pellicle assembly causes an increase in the tension in the pellicle.

The at least one heater may be configured to heat at least a portion of the pellicle frame. A heater may be provided on each side of the pellicle frame.

The pellicle frame may comprise a first layer having a first Young's modulus and a first coefficient of thermal expansion and a second layer having a second Young's modulus greater than the first Young's modulus and a second coefficient of thermal expansion greater than the first coefficient of thermal expansion, wherein the second layer is arranged closer to the pellicle than the first layer.

The at least one heater may be configured to heat at least a portion of the pellicle.

The pellicle may comprise a first layer having a first Young's modulus and a first coefficient of thermal expansion and a second layer having a second Young's modulus greater than the first Young's modulus and a second coefficient of thermal expansion greater than the first coefficient of thermal expansion, wherein the first layer is arranged closer to the pellicle frame than the second layer.

The pellicle may include at least one region in which the thickness of the pellicle is greater than the thickness of the remainder of the pellicle.

The at least one region may be proximate to the edge of the pellicle.

In the at least one region, the thickness of the second layer may be greater than the thickness of the second layer in the remainder of the pellicle.

The at least one heater may be configured to locally heat the at least one region of the pellicle having a thickness which is greater than the thickness of the remainder of the pellicle.

The heater may be configured to heat at least one component of the pellicle assembly through resistive heating.

The tension controlling apparatus may comprise at least one actuator configured to apply a force to the pellicle frame so as to stretch the pellicle frame and increase the tension in the pellicle.

According to an aspect, there is provided a method of strengthening a pellicle comprising temporarily subjecting the pellicle to tension.

The pellicle may be subjected to tension for less than a second.

The tension may be applied as a shock load.

Features of different aspects of the invention may be combined with features of other aspects of the invention.

BRIEF DESCRIPTION OF THE DRAWINGS

Embodiments of the invention will now be described, by way of example only, with reference to the accompanying schematic drawings, in which:

FIGS. 12A-12D are schematic illustrations of a pellicle failure detection apparatuses according to embodiments;

DETAILED DESCRIPTION

Figure 1:
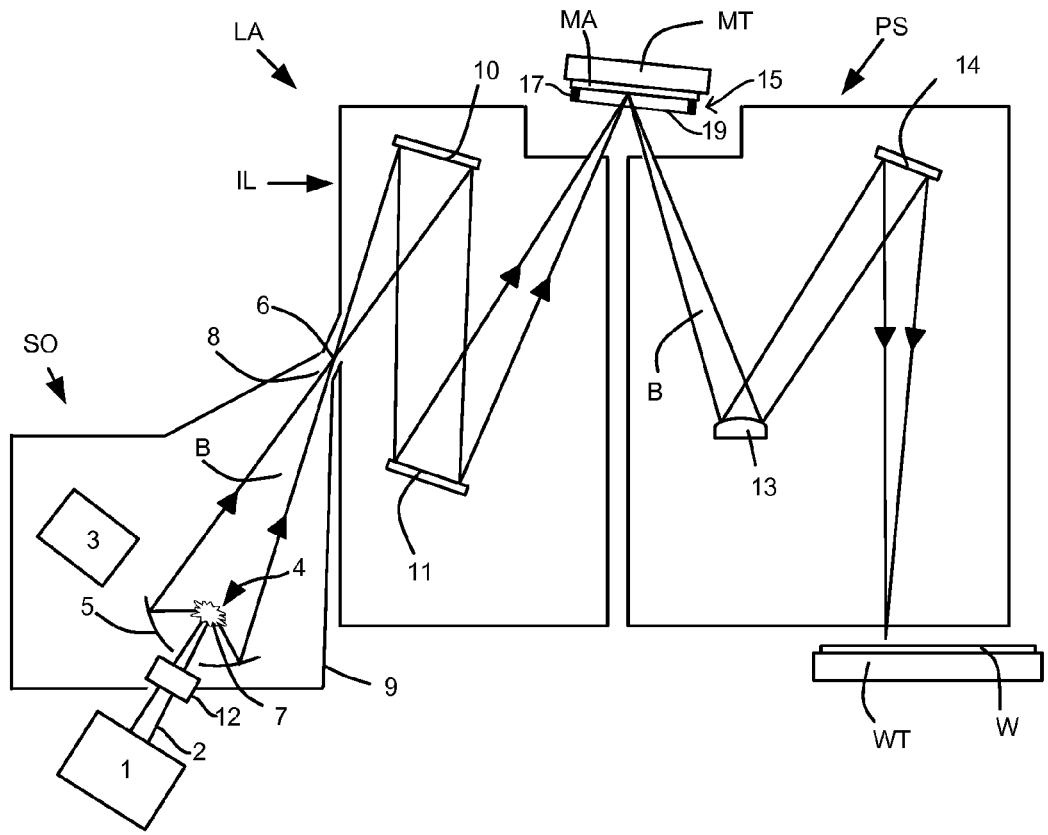
FIG. 1 is a schematic illustration of a lithographic system comprising a lithographic apparatus and a radiation source.

FIG. 1 shows a lithographic system including a pellicle assembly 15 according to one embodiment. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA, a projection system PS and a substrate table WT configured to support a substrate W. The illumination system IL is configured to condition the radiation beam B before it is incident upon the patterning device MA. The projection system is configured to project the radiation beam B (now patterned by the patterning device MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in the illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type that may be referred to as a laser produced plasma (LPP) source. A laser 1, which may for example be a CO2 laser, is arranged to deposit energy via a laser beam 2 into a fuel, such as tin (Sn) that is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, for example, in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure that is arranged to reflect EUV radiation (e.g. EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

In other embodiments of a laser produced plasma (LPP) source the collector 5 may be a so-called grazing incidence collector that is configured to receive EUV radiation at grazing incidence angles and focus the EUV radiation at an intermediate focus. A grazing incidence collector may, for example, be a nested collector, comprising a plurality of grazing incidence reflectors. The grazing incidence reflectors may be disposed axially symmetrically around an optical axis O.

The radiation source SO may include one or more contamination traps (not shown). For example, a contamination trap may be located between the plasma formation region 4 and the radiation collector 5. The contamination trap may for example be a rotating foil trap, or may be any other suitable form of contamination trap.

The laser 1 may be separated from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA is protected by a pellicle 19, which is held in place by a pellicle frame 17. The pellicle 19 and the pellicle frame 17 together form a pellicle assembly 15. The patterning device MA (which may for example be a mask) reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors that are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors in FIG. 1, the projection system may include any number of mirrors (e.g. six mirrors).

The lithographic apparatus may, for example, be used in a scan mode, wherein the support structure (e.g. mask table) MT and the substrate table WT are scanned synchronously while a pattern imparted to the radiation beam is projected onto a substrate W (i.e. a dynamic exposure). The velocity and direction of the substrate table WT relative to the support structure (e.g. mask table) MT may be determined by the demagnification and image reversal characteristics of the projection system PS. The patterned radiation beam that is incident upon the substrate W may comprise a band of radiation. The band of radiation may be referred to as an exposure slit. During a scanning exposure, the movement of the substrate table WT and the support structure MT may be such that the exposure slit travels over an exposure field of the substrate W.

The radiation source SO and/or the lithographic apparatus that is shown in FIG. 1 may include components that are not illustrated. For example, a spectral filter may be provided in the radiation source SO. The spectral filter may be substantially transmissive for EUV radiation but substantially blocking for other wavelengths of radiation such as infrared radiation.

In other embodiments of a lithographic system the radiation source SO may take other forms. For example, in alternative embodiments the radiation source SO may comprise one or more free electron lasers. The one or more free electron lasers may be configured to emit EUV radiation that may be provided to one or more lithographic apparatus.

As was described briefly above, the pellicle assembly 15 includes a pellicle 19 that is provided adjacent to the patterning device MA. The pellicle 19 is provided in the path of the radiation beam B such that radiation beam B passes through the pellicle 19 both as it approaches the patterning device MA from the illumination system IL and as it is reflected by the patterning device MA towards the projection system PS. The pellicle 19 comprises a thin film that is substantially transparent to EUV radiation (although it will absorb a small amount of EUV radiation). The pellicle 19 acts to protect the patterning device MA from particle contamination. The pellicle 19 may be herein referred to as an EUV transparent pellicle.

Whilst efforts may be made to maintain a clean environment inside the lithographic apparatus LA, particles may still be present inside the lithographic apparatus LA. In the absence of a pellicle 19, particles may be deposited onto the patterning device MA. Particles on the patterning device MA may disadvantageously affect the pattern that is imparted to the radiation beam B and the pattern that is transferred to the substrate W. The pellicle 19 advantageously provides a barrier between the patterning device MA and the environment in the lithographic apparatus LA in order to prevent particles from being deposited on the patterning device MA.

The pellicle 19 is positioned at a distance from the patterning device MA that is sufficient that any particles that are incident upon the surface of the pellicle 19 are not in the focal plane of the radiation beam B. This separation between the pellicle 19 and the patterning device MA, acts to reduce the extent to which any particles on the surface of the pellicle 19 impart a pattern to the radiation beam B. It will be appreciated that where a particle is present in the beam of radiation B, but at a position that is not in a focal plane of the beam of radiation B (i.e., not at the surface of the patterning device MA), then any image of the particle will not be in focus at the surface of the substrate W. In some embodiments, the separation between the pellicle 19 and the patterning device MA may, for example, be between 2 mm and 3 mm (e.g. around 2.5 mm).

Figure 2:
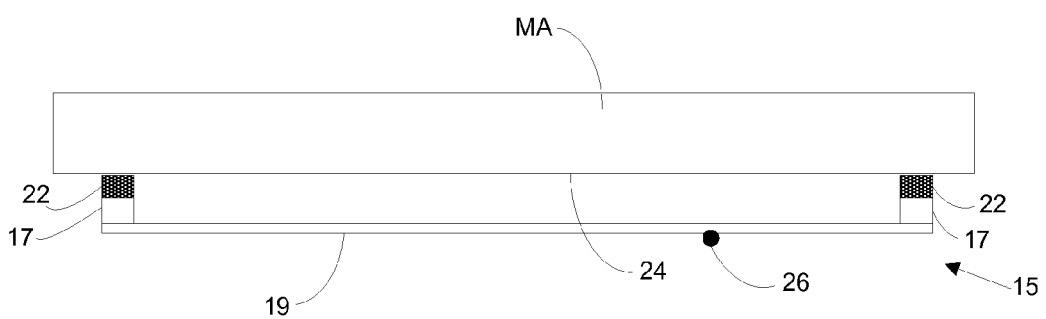
FIG. 2 is a schematic illustration of a patterning device and a pellicle assembly.

FIG. 2 is a schematic illustration of the pellicle assembly 15 and the patterning device MA in cross-section and in more detail. The patterning device MA has a patterned surface 24. The pellicle frame 17 supports the pellicle 19 around a perimeter portion of the pellicle 19. The pellicle frame 17 may include an attachment mechanism 22 configured to allow the pellicle frame to be removably attachable to the patterning device MA (i.e. to allow the pellicle frame to be attachable to and detachable from the patterning device MA). The attachment mechanism 22 is configured to engage with an attachment feature (not shown) provided on the patterning device MA. The attachment feature may, for example, be a protrusion which extends from the patterning device MA. The attachment mechanism 22 may, for example, comprise a locking member which engages with the protrusion and secures the pellicle frame 17 to the patterning device MA.

A plurality of attachment mechanisms and associated attachment features may be provided. The attachment mechanisms may be distributed around the pellicle frame 17 (e.g. two on one side of the frame and two on an opposite side of the frame). Associated attachment features may be distributed around the perimeter of the patterning device MA.

A contamination particle 26 is schematically shown in FIG. 2. The contamination particle 26 was incident upon the pellicle 19 and is held by the pellicle 19. The pellicle 19 holds the contamination particle sufficiently far from the patterned surface 24 of the mask MA that it is not imaged onto substrates by the lithographic apparatus LA.

A pellicle assembly according to an embodiment may allow a mask pattern (on the patterning device) to be provided which remains substantially defect free during use (the mask pattern is protected from contamination by the pellicle). In some embodiments a separation may be provided between the pellicle frame and the mask (e.g. in the form of slits) which allow some gas to flow into and out of the space between the pellicle and the mask. This allows pumping down and venting of the mask assembly to be performed without damaging the pellicle 19.

Figure 3:
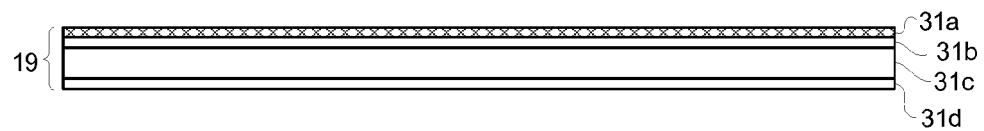
FIG. 3 is a schematic illustration of a pellicle according to an embodiment.

FIG. 3 is a schematic illustration of the pellicle 19 in cross-section and in more detail. The pellicle 19 comprises a thin membrane formed from a plurality of layers 31a-31d. In the embodiment shown in FIG. 3, the pellicle comprises four layers 31a-31d. However, in other embodiments a pellicle 19 may comprise more than or fewer than four layers. For ease of illustration the thicknesses of the layers 31a-31d which are shown in FIG. 3 are exaggerated with respect to the width of the pellicle 19. The layers 31a-31d which are shown in FIG. 3 are not therefore a scale representation of the layers 31a-31d.

The pellicle 19 comprises a main film layer 31c. The main film layer may have a thickness which is greater than the thickness of each of the other layers 31a, 31b, 31d which form the pellicle 19 (as is represented schematically in FIG. 3). The main film layer 31c may comprise a material such as polysilicon (pSi) film. Polysilicon (pSi) film is substantially transparent to EUV radiation and is therefore suitable for use in an EUV lithographic apparatus. The main film layer 31c may have a thickness which is of the order of approximately 40 nm.

The main film layer 31c may alternatively be formed from some other material which is substantially transparent to EUV radiation, for example graphene, silicene, etc. References made herein to a pellicle or layer of a pellicle which is substantially transparent to EUV radiation are intended to mean that the pellicle or layer of a pellicle transmits at least 65% of incident EUV radiation, preferably at least 80% and more preferably at least 90% of incident EUV radiation.

The pellicle 19 further comprises a first capping layer 31b and a second capping layer 31d. The first and second capping layers 31b, 31d are situated either side of the main film layer 31c so as to encapsulate the main film layer 31c. The capping layers 31b, 31d serve to protect the main film layer 31c from substances to which the pellicle 19 may be exposed and which may cause damage to the main film layer 31c if brought into contact with the main film layer 31c. For example, the capping layers 31b, 31d may serve to protect the main film layer 31c from exposure to hydrogen radicals, plasma and traces of oxygen which may cause damage to the main film layer 31c if brought into contact with the main film layer 31c. The capping layers 31b, 31d may therefore serve to reduce any damage which is caused to the pellicle 19 due to exposure to damaging substances. The first 31b and/or the second capping layer 31c may, for example, have thicknesses which are approximately of the order of 5 nm. For example, the first 31b and/or the second capping layer 31c may have thicknesses which are greater than approximately 3 nm. The thicknesses of the first 31b and/or the second capping layer 31c may be less than approximately 7 nm.

The pellicle 19 further comprises an emissive layer 31a. The emissive layer may be formed from a material which has a relatively high thermal emissivity. For example, the emissive layer 31a may be formed from a metal (e.g. a transition metal such as ruthenium). In some embodiments the emissive layer 31a may be formed from graphene. The emissive layer 31a may in some embodiments be electrically conductive and may alternatively be referred to as an electrically conductive layer. An emissive layer 31a which is electrically conductive may allow electrical connections to be made to the emissive layer 31a, for example in order to measure the electrical resistance of the emissive layer 31a.

During use of a pellicle 19 in a lithographic apparatus LA, the pellicle is exposed to radiation (e.g. EUV radiation). Whilst the pellicle 19 is configured to be substantially transparent to the radiation (e.g. EUV radiation) to which it is exposed, some radiation is absorbed by the pellicle which acts to heat the pellicle. It is desirable that the temperature of the pellicle does not reach a temperature at which damage may be caused to the pellicle. The relatively high thermal emissivity of the emissive layer 31a promotes emission of thermal energy from the pellicle 19, thereby regulating the temperature of the pellicle 19. The emissive layer 31a may allow the pellicle 19 to be exposed to radiation of increased power (relative to a pellicle which does not include an emissive layer) without the temperature of the pellicle 19 exceeding a temperature at which significant damage to the pellicle 19 may be caused.

The layers 31a-31d of the pellicle 19 may be formed by a deposition process. For example, a first layer may be deposited onto a substrate and the remaining layers may be sequentially deposited on top of the first layer. A suitable deposition process by which the layers may be deposited may be a chemical vapor deposition (CVD) process.

FIG. 4 schematically shows a method of manufacturing a pellicle assembly 15. Referring first to FIG. 4A a pellicle 19 is formed on a substrate 50 (e.g. a silicon wafer). For example, chemical vapor deposition (CVD) may be used to deposit layers (e.g. the layers 31a-31d described above with reference to FIG. 3) on to the substrate 50. A rectangular area of the substrate 50 is then etched away, leaving behind the pellicle 19 being supported around a perimeter portion 55 of the pellicle 19 by the remaining substrate 50.

The presence of the substrate 50 around the perimeter portion 55 of the pellicle 19 is advantageous because it provides a rigid frame which preserves tautness of the pellicle 19. That is the pellicle 19 is stretched by the rigid frame such that there is a tension in the pellicle 19. The pellicle 19 is taut when it is created due to the manner in which it is formed (e.g. during a CVD process). If the substrate 50 did not provide a rigid frame to support the pellicle 19, and instead a frame with flexibility was provided, then the tension in the pellicle 19 would bend the frame inwards. As a result of this inward bending the tension in the pellicle 19 would be lost. The remaining steps of the method allow the outer portion of the substrate 50 to be removed without tension in the pellicle 19 being lost. If tension in the pellicle 19 were to be lost, then uncontrolled sagging of the pellicle 19 would occur and wrinkles would be seen in the pellicle 19.

A portion of the pellicle which is supported by the substrate 50 which extends around the outer edge of the membrane of the pellicle 19 may be referred to as a perimeter portion 55 of the pellicle. An outer edge of the perimeter portion 55 is indicated by a dashed line. An inner edge of the perimeter portion 55 is defined by the inner extent of the substrate 50 supporting the pellicle 19 and is shown with a solid line in FIG. 4A.

Figure 4A:
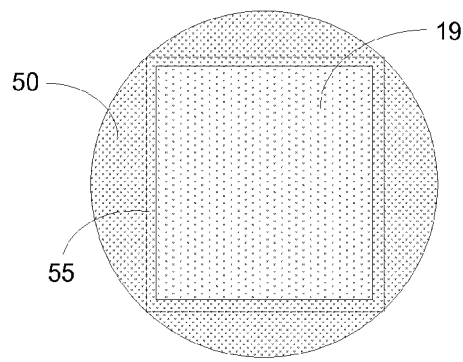
FIGS. 4A-4D are schematic illustrations of stages of a process for forming a pellicle according to an embodiment.
Figure 4B:
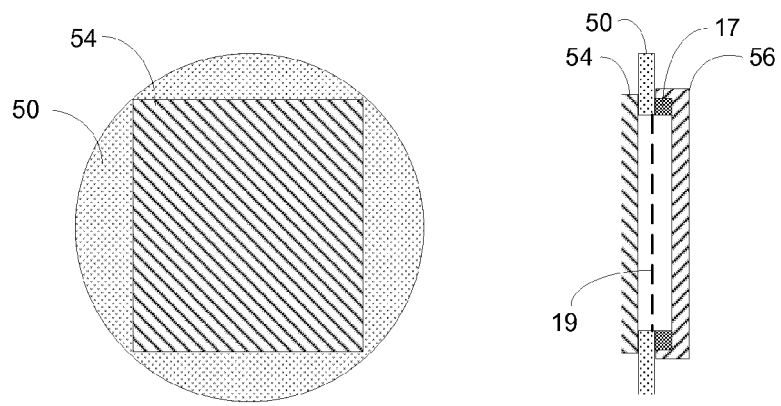

FIG. 4B schematically illustrates covers which may be clamped to the substrate 50. The drawing on the left-hand side of FIG. 4B shows a top side cover 54 and the substrate 50 viewed from above. The drawing on the right-hand side of FIG. 4B shows the top side cover 54, the substrate 50 and other components viewed in cross-section. The top side cover 54 is pressed against the substrate 50 on the side of the pellicle 19 which will be furthest from a patterning device MA in use.

The dashed line on the right-hand side of FIG. 4B indicates the location of the pellicle 19. In this embodiment the pellicle 19 is situated at the bottom side of the substrate 50. This is because the etch that was used to remove the rectangular area of the substrate 50 was applied to the top side of the wafer. In such an embodiment there is a clearance between the pellicle 19 and the top side cover 54. The top side cover 54 may therefore have a flat inner surface. In an alternative embodiment the pellicle 19 is at the top side of the substrate 50 (the etch was applied to the bottom side of the substrate). In such an embodiment there is no clearance between the pellicle 19 and the top side cover 54, and the top side cover will therefore include a recess to accommodate sagging of the pellicle.

A pellicle frame 17 and a bottom side cover 56 are provided on the opposite side of the substrate 50. The pellicle frame 17 is fixed to the perimeter portion 55 of the pellicle 19. The frame 17 is sufficiently rigid that it is capable of resisting inward bending and thus can preserve the tension of the pellicle 19. The frame 17 may be fixed to the perimeter portion 55 using glue or any other suitable means. The bottom side cover 56 is pressed against the substrate 50 and covers both the bottom side of the pellicle 19 and the frame 17. The portions of the pellicle 19 which is not in contact with the frame 17 may be referred to as an unsupported portion.

From FIG. 4B it may be seen that the top side cover 54 covers the pellicle 19 on the top side, and the bottom side cover 56 covers the pellicle 19 on the bottom side. Thus, between them the covers 54, 56 form a sealed enclosure which contains the pellicle 19 attached to the pellicle frame 17. The top side cover 54 and the bottom side cover 56 and frame 17 are fitted to the substrate 50 in clean conditions in order to minimize the possibility of contamination being introduced into the environment of the pellicle 19 when they are attached to the substrate 50. Indeed, the entire process of fabricating the pellicle 19 and then fitting the frame 17 and covers 54, 56 may be performed in clean conditions.

Figure 4C:
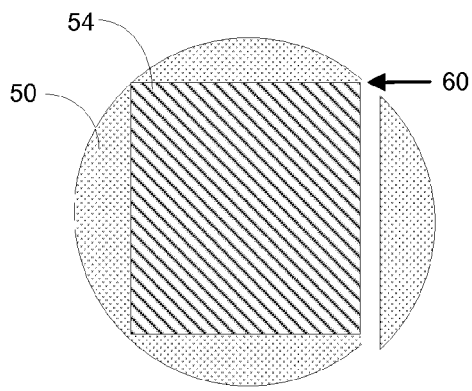

As schematically depicted in FIG. 4C, a cutting tool (e.g. a milling machine) is used to trim away parts of the substrate 50 which extend beyond the bottom side cover 56. In FIG. 4C the right-hand portion of the substrate 50 has already been removed. The top portion of the substrate 50 is about to be removed by cutting in the direction indicated by the arrow 60. Other portions of the substrate 50 will then be removed. Because the pellicle 19 is contained within a sealed environment this cutting away of the substrate 50 does not risk introducing contamination onto the pellicle 19.

Figure 4D:
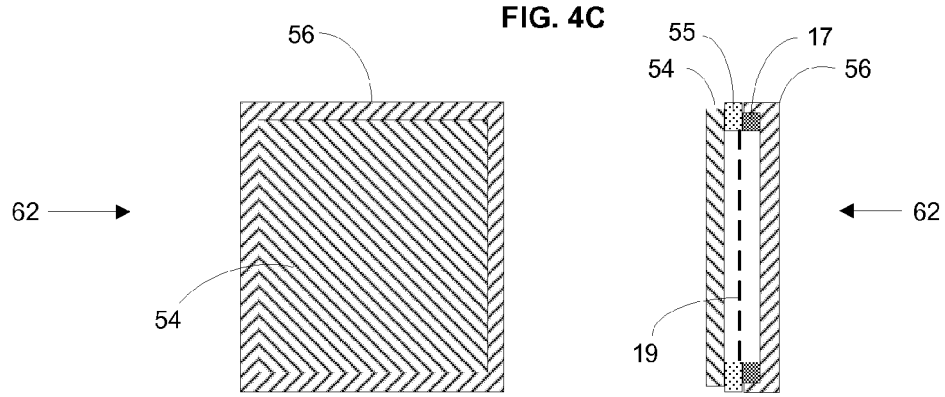

Once the edges of the substrate 50 have been trimmed away, the remaining assembly is a pellicle transport assembly 62 as shown in FIG. 4D. The pellicle transport assembly 62 comprises a pellicle membrane 19, a portion of a substrate 50, a pellicle frame 17, a top side cover 54 and a bottom side cover 56. The pellicle transport assembly 62 holds the pellicle 19 in a sealed environment into which contamination cannot enter. The frame 17 supports the pellicle and maintains the tension in the pellicle 19.

The steps described and illustrated in connection with FIG. 4 provide a pellicle transport assembly 62 which maintains tension in the pellicle and prevents pellicle contamination. The pellicle transport assembly 62 may, for example, be manufactured at a single location. This is advantageous compared with, for example, manufacturing a pellicle at a first manufacturing location and then transporting that pellicle to a second location to be fitted on to a supporting frame (contamination might be introduced during transportation to the second location).

The pellicle transport assembly 62 may, for example, be shipped from the pellicle manufacturing location to a mask shop where the pellicle is fitted to a patterning device MA (e.g. a mask) for use by a lithographic apparatus. The pellicle 19 and the pellicle frame 17 may be removed the remainder of the pellicle transport assembly 62 and may be attached to patterning device MA. The rigidity of the pellicle frame 17 maintains the tension in the pellicle 19 and holds the pellicle 19 taut when positioned in proximity to the patterning device MA (as can be seen, for example, in FIG. 2).

As was described above with reference to FIG. 4, the pellicle 19 is formed such that there is tension in the pellicle 19. The tension in each layer of the pellicle 19 is established during the deposition of the layers onto the substrate 50 and is maintained by the pellicle frame 17 which is subsequently attached to the pellicle 19. The tension in each layer of the pellicle 19 may, for example, be determined by properties of the deposition process. For example, the temperature and/or the pressure at which deposition (e.g. by CVD) of a layer of the pellicle 19 is carried out may determine the tension in the deposited layer. The tension in each layer may therefore be controlled by controlling one or more properties (e.g. temperature and/or pressure) of a deposition process by which the layer is deposited.

The tension in each layer of the pellicle 19 also depends on the composition of the layer with respect to a material on which the layer is deposited. For example, a layer comprising ruthenium which is deposited on a polysilicon layer will have a different tension to a layer comprising ruthenium which is deposited on a silicon nitride layer under the same deposition conditions (e.g. the temperature and pressure at which the deposition is performed). The tension in each layer of a pellicle 19 may therefore additionally or alternatively be controlled by selecting the materials which form different layers of the pellicle 19.

During use in a lithographic apparatus LA a pellicle 19 may be subjected to forces and/or conditions which cause wear to the pellicle 19 and may result in damage to the pellicle 19. For example, a pellicle 19 and/or the pellicle frame 17 may undergo changes in temperature (e.g. due to exposure to radiation) which causes expansion and/or contraction of the pellicle 19 and/or the pellicle frame 17. Expansion and/or contraction of the pellicle 19 and/or the pellicle frame may place additional stress on the pellicle 19 and may lead to wear and ultimately damage to the pellicle 19.

A pellicle 19 may also be exposed to substances and/or conditions which may chemically alter the pellicle 19. For example, over time an emissive layer 31a of a pellicle 19 may undergo oxidation. Oxidation of an emissive layer 31a may reduce the emissivity of the emissive layer 31a and may reduce the effectiveness with which the emissive layer 31a regulates the temperature of the pellicle 19, thereby leading to further damage to the pellicle 19. In a lithographic apparatus LA the pellicle 19 may be exposed to substances such as hydrogen radicals which may chemically alter the pellicle 19 and structurally weaken the pellicle 19.

During the lifetime of a pellicle 19, the pellicle 19 may be subjected to pressure changes. For example, a pellicle 19 may experience atmospheric pressure conditions outside of a lithographic apparatus LA and may be pumped down to vacuum pressure conditions for use in a lithographic apparatus LA. Changes in pressure conditions which a pellicle 19 experiences may lead to the pellicle 19 experiencing differences in pressure across the pellicle 19. Pressure differences across a pellicle 19 may apply additional stress to the pellicle 19 and may act to bend the pellicle 19 towards or away from a patterning device MA.

The processes described above and/or other processes not described herein will over time weaken a pellicle 19 until the pellicle 19 breaks. For example, one or more cracks may form in a pellicle 19 which may rupture the pellicle 19. A broken pellicle may break into several pieces. Broken pieces of pellicle may contaminate the surrounding environment. For example, a broken pellicle may contaminate a patterning device MA and may render the patterning device unusable.

In order to limit contamination caused by a broken pellicle 19 it may be desirable to monitor a pellicle 19 in order to detect that a pellicle 19 may be close to breaking and/or detect that a pellicle 19 has broken. Actions may then be taken to remove the pellicle 19 from use and/or to mitigate any potential contamination which may be caused by the pellicle 19. Additionally or alternatively it may be desirable to configure a pellicle 19 such that when the pellicle 19 does break it does so in a controlled manner which results in little or no contamination.

Embodiments which are contemplated herein include features of a pellicle 19 and/or a pellicle frame which allow for detection of imminent breakage of a pellicle and/or breakage of a pellicle 19. Embodiments are also contemplated in which a pellicle 19 is configured to break in a controlled manner. Further embodiments include apparatus configured to mitigate contamination which results from a broken pellicle 19.

Figure 5:
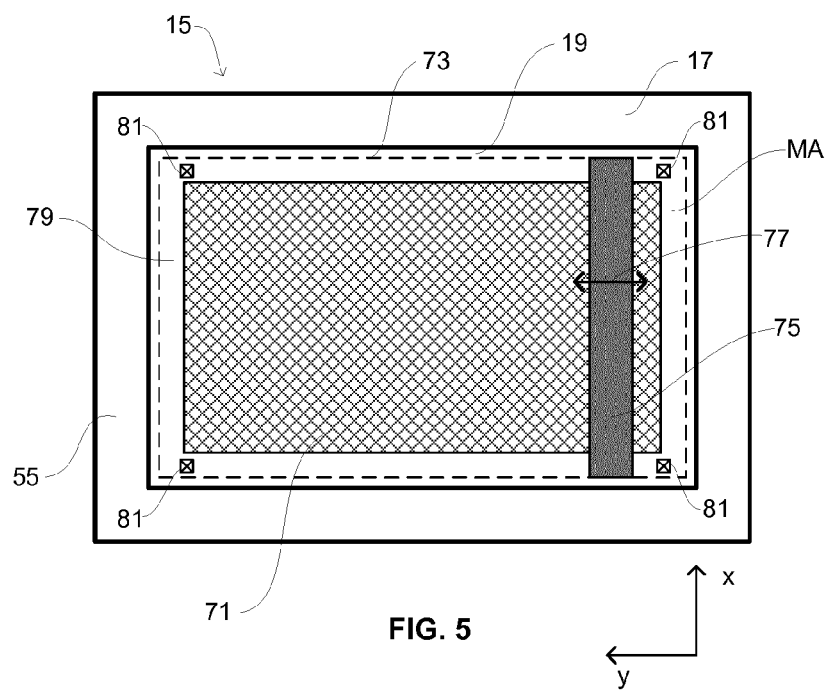
FIG. 5 is a schematic illustration of a pellicle assembly and a patterning device.

FIG. 5 is a schematic illustration of a pellicle assembly 15 including a pellicle 19 and a pellicle frame 17, which is attached to a patterning device MA. The pellicle 55 includes a perimeter portion 55 which is attached to the frame 17. The patterning device MA includes a patterned region 71 on which a pattern to be transferred to a substrate W is formed. An exposure field 73 of the patterning device MA is exposed to radiation (e.g. EUV radiation) during a lithographic exposure. The exposure field 73 may be exposed to radiation by scanning an exposure slit 75 of radiation across the exposure field 73. The exposure slit may be scanned in a y-direction (which may be referred to as a scanning direction) as indicated in Figure with a double-headed arrow 77. An x-direction perpendicular to the y-direction is also indicated in FIG. 5. The x-direction may be referred to as a non-scanning direction. The exposure slit 75 may be scanned over the exposure field 73 through movement of the patterning device MA relative to the exposure slit 75.

As can be seen in FIG. 5, the pellicle 19 includes a region 79 which lies within the exposure field 73 but which does not overlie the patterned region 71. This region 79 of the pellicle 19 is therefore subjected to the same conditions (including heating by exposure to radiation) as the pellicle 19 which overlies the patterned region 71. However, the modification to this region 79 of the pellicle 19 will not affect the radiation which is incident on the patterned region 71 or the patterned radiation beam which is reflected from the patterned region 71. The region 79 of the pellicle 19 which lies within the exposure field 73 but which does not overlie the patterned region 71 may be referred to as an available region 79. Modifications to the available region 79 of the pellicle 19 may be made without affecting the radiation which is incident on the patterned region 71 or the patterned radiation beam which is reflected from the patterned region 71. Modifications which may be made to the pellicle 19 in the available region 79 may include features which may be monitored for signs that the pellicle 19 may be about to fail. Modifications which may be made to the pellicle 19 in the available region 79 may include features which cause the pellicle 19 to break in a controlled manner.

The patterning device MA may additionally include markers (e.g. fiducials) 81. The markers 81 may, for example, be used for alignment measurements in order to determine the alignment of the patterning device MA. The markers 81 may lie within the available region 79 of the pellicle. It may be desirable for any modifications to the pellicle 19 in the available region 81 to not interfere with any alignment measurements which use the markers 81.

Figure 6:
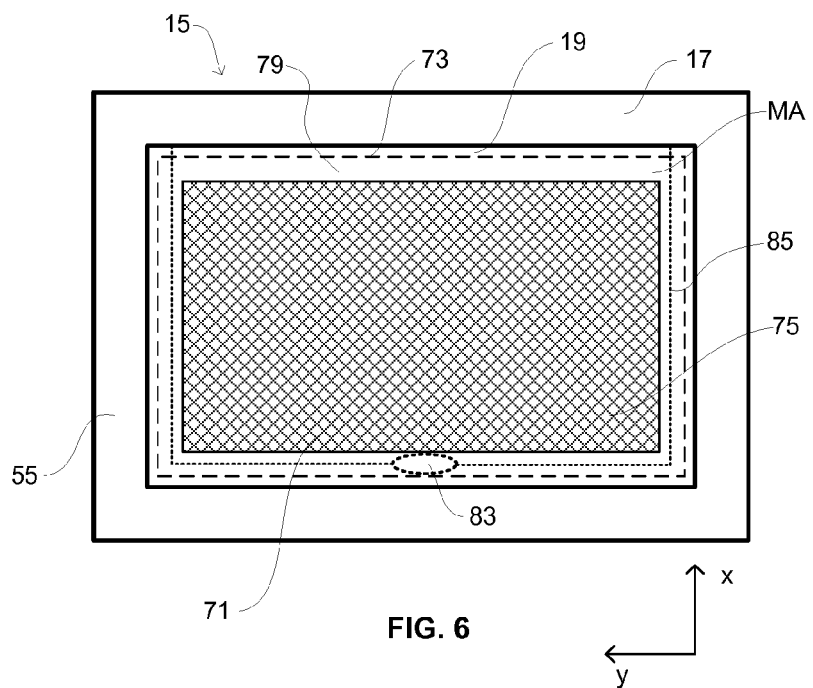
FIG. 6 is a schematic illustration of a pellicle assembly according to an embodiment.

FIG. 6 is a schematic illustration of a pellicle assembly 15 and a patterning device MA in which the pellicle 19 of the pellicle assembly 15 includes a breakage region 83. Many of the features of the pellicle assembly 15 and the patterning device MA of FIG. 6 are identical to the pellicle assembly 15 and the patterning device MA which were described above with reference to FIG. 5 and will not be described in further detail here. For ease of illustration some of the features which are shown in FIG. 5 are omitted from FIG. 6 (for example the exposure slit 75 and the markers 81 are not shown in FIG. 6).

The breakage region 83 of the pellicle 19 is situated within the available area 79 and does not therefore affect the radiation which is incident on the patterned region 71 or the patterned radiation beam which is reflected from the patterned region 71. The breakage region 83 is configured to preferentially break, during normal use of the pellicle 19 in a lithographic apparatus LA, prior to breakage of remaining regions of the pellicle. The breakage region 83 may, for example, comprise a region of the pellicle 19 which has a reduced thickness when compared with surrounding regions of the pellicle 19. For example, during manufacture of the pellicle 19 less material may be deposited in the breakage region 83 such that the thickness of the breakage region 83 is less than the thickness of surrounding regions of the pellicle 19. The breakage region 83 will therefore be structurally weaker than surrounding regions of the pellicle 19 and will preferentially break prior to breakage of the remaining regions of the pellicle 19.

Additionally or alternatively the breakage region 83 may comprise a region of the pellicle 19 which has been exposed to different conditions to the remainder of the pellicle 19. The different conditions to which the breakage region has been exposed cause the breakage region 83 to be structurally weaker than surrounding regions of the pellicle 19. For example, prior to use of the pellicle 19 in a lithographic apparatus LA, the breakage region 83 may be exposed to radiation to which the remainder of the pellicle 19 is not exposed. That is, radiation (e.g. EUV radiation) which acts to structurally weaken the pellicle 19 may be used to selectively expose the breakage region 83, whereas the remainder of the pellicle 19 may not be exposed to the radiation. The breakage region 83 will therefore be structurally weaker than surrounding regions of the pellicle 19 and will preferentially break prior to breakage of the remaining regions of the pellicle 19.

In some embodiments, the breakage region 83 may comprise a region of the pellicle 19 which has been exposed to different substances to the substances to which the remainder of the pellicle is exposed. For example, prior to use of the pellicle 19 in a lithographic apparatus LA, the breakage region 83 may be exposed to a substance which is configured to structurally weaken the breakage region when compared to the remainder of the pellicle 19. The breakage region 83 may, for example, be exposed to hydrogen radicals which may act to chemically alter the breakage region 83 so as to structurally weaken the breakage region 83. The breakage region 83 will therefore preferentially break prior to breakage of the remaining regions of the pellicle 19.

Additionally or alternatively the breakage region 83 may comprise a region of the pellicle 19 in which one or more holes and/or cracks are deliberately formed in the pellicle 19 prior to use of the pellicle 19 in a lithographic apparatus. One or more holes and/or cracks in the pellicle 19 will cause the breakage region 83 to be structurally weaker than surrounding regions of the pellicle 19. The breakage region 83 will therefore preferentially break prior to breakage of the remaining regions of the pellicle 19.

Once the breakage region 83 has broken, the breakage in the pellicle 19 may propagate to other regions of the pellicle 19. For example, the pellicle 19 may fracture along fracture lines 85 such that a crack in the pellicle 19 is formed along the fracture line 85. In some embodiments, the fracture lines 85 may be configured to be structurally weaker than surrounding regions of the pellicle 19 and may comprise further examples of breakage regions as was described above. The fracture lines 85 may therefore have any of the features described above with reference to the breakage region 83 and/or may be formed using any of the methods described above with reference to the breakage region 83.

Alternatively, the fracture lines 85 may be configured to be structurally stronger than surrounding regions of the pellicle 19. For example, the fracture lines may comprise reinforced regions of the pellicle which have a greater thickness than surrounding regions of the pellicle 19. If the pellicle 19 breaks at the breakage region 83, then cracks in the pellicle will be prevented from propagating across the pellicle 19 by the reinforced fracture line 85. In general, cracks tend to follow the weakest available path. Providing reinforced fracture lines 85, therefore causes the cracks to follow a path which lies in between the fracture lines 85 and the frame 17.

In embodiments in which a pellicle 19 includes a reinforced region and a breakage region 83, it may be desirable to position the breakage region 83 in between the reinforced region and the frame 17. Consequently, cracks in the pellicle 19 which form as a result of breakage of the breakage region 83 will be confined to regions of the pellicle 19 which lie in between the frame 17 and the reinforced region.

In other embodiments, the fracture lines 85 may not be configured to be structurally stronger or weaker than surrounding regions of the pellicle 19 and may naturally form as a consequence of the pellicle breaking at the breakage region 83. The breakage region 83 may be positioned such that subsequent breakage of the pellicle 19 occurs in preferential locations, such as along the fracture lines 85.

Figure 7:
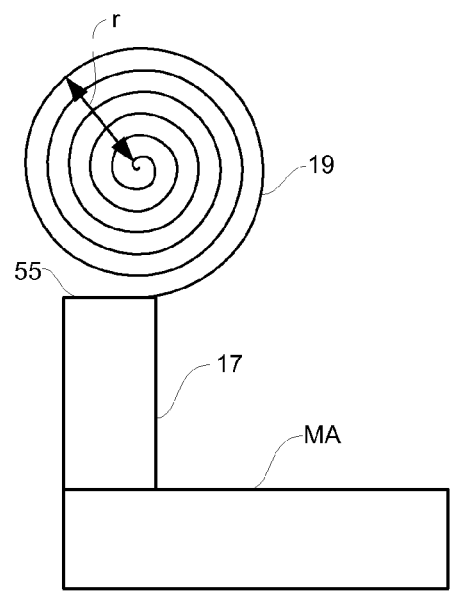
FIG. 7 is a schematic illustration of a portion of the pellicle assembly of FIG. 6 after a pellicle of the pellicle assembly has broken.

In some embodiments the pellicle 19 may be configured to cause the pellicle 19 to roll up in a controlled manner after breakage. For example, as the pellicle 19 breaks along the fracture lines 85, the pellicle 19 may roll up on itself in a controlled manner. FIG. 7 is a schematic illustration of a pellicle 19 after the pellicle 19 has rolled up on itself. Also shown in FIG. 7 is a portion of a pellicle frame 17 to which a section of the perimeter portion 55 of the pellicle 19 remains attached. In the arrangement which is shown in FIG. 7 the majority of the pellicle remains intact and attached to the pellicle frame 17. The broken pellicle 19 is contained within a small area and the pellicle 19 is prevented from contacting the patterning device MA. Breakage of the pellicle 19 has therefore resulted in little or no contamination of the surrounding environment. The patterning device MA may remain operational and may be used again. In such a case the broken pellicle 19 may simply be removed from the patterning device MA and replaced with a new pellicle 19.

A pellicle 19 may be configured to roll up on itself by introducing different tensions in different layers of the pellicle 19. For example, a pellicle may comprise at least a first layer having a first tension and a second layer having a second tension. The first tension may be higher than the second tension. The difference in tension between the first and second layer may cause the first layer to pull on the second layer in the event of breakage of the pellicle, such that the pellicle 19 rolls up on itself as shown in FIG. 7. In the embodiment which is shown in FIG. 7 the first layer of the pellicle having the higher tension is situated further from the pellicle frame 17 than the second layer of the pellicle 19 having the lower tension. This causes the pellicle to roll up on the opposite side of the pellicle to the side on which the patterning device MA is situated. This may advantageously avoid the pellicle 19 from contacting the patterning device MA as it rolls up.

In alternative embodiments, the first layer of the pellicle having the higher tension may be situated closer to the pellicle frame 17 than the second layer of the pellicle 19 having the lower tension. This may cause the pellicle 19 to roll up on the same side of the pellicle 19 as the side on which the patterning device MA is situated.

A radius r of a rolled-up pellicle 19 (as is labeled in FIG. 7) depends at least in part on the difference in tension between the first and second layers. In general, the larger the difference between the tension in the first layer and the tension in the second layer, the smaller the radius r of a resulting rolled up pellicle 19.

As was explained above with reference to FIG. 3 a pellicle 19 may include more than two layers. A pellicle 19 may be configured to roll up on itself if any two layers of the pellicle are provided with different tensions in the layers. In some embodiments all of the layers which form a pellicle may be provided with different tensions.

As was explained above, the tension in each of the layers of a pellicle may be determined by properties of a deposition process (e.g. a CVD) by which each of the layers are formed. In order to provide layers having different tensions, different layers may be deposited using different properties of the deposition process. For example, a first layer may be deposited using a first temperature and a first pressure and a second layer may be deposited using a temperature and/or a pressure which is different to the first temperature and first pressure. The first layer is therefore provided with a different tension to the tension of the second layer. Additionally or alternatively, the materials which are used to form different layers of a pellicle 19 may be selected in order to provide layers having different tensions in them.

In embodiments in which a pellicle 19 is configured to roll up on itself the pellicle 19 may include at least one breakage region 83. The breakage region 83 may be positioned so as to ensure that when the breakage region 83 breaks the pellicle 19 is caused to roll up on itself. For example, the breakage region 83 which is shown in FIG. 6 is located at a position which may ensure that breakage of the breakage region 83 causes the pellicle to roll up on itself. As was described above, the fracture lines 85 may also constitute breakage regions along which the pellicle 19 preferentially breaks. Breakage of the pellicle along the fracture lines 85 may ensure that the pellicle rolls up on itself in a controlled manner.

In the embodiment shown in FIG. 6, at least one breakage point 83 is provided which causes the pellicle 19 to break in a controlled manner which reduces any contamination of the surrounding environment with debris generated during breakage of the pellicle 19. In some embodiments a breakage region 83 may be configured such that breakage of the breakage region 83 does not cause critical failure of the whole pellicle. In such embodiments the breakage region 83 may be monitored and breakage of the breakage point 83 may be detected. Detection of breakage of the breakage region 83 may indicate that the remainder of the pellicle is close to breaking and consequently the pellicle 19 may be removed from operation prior to critical failure of the whole pellicle (which may cause contamination of the surrounding environment).

Figure 8:
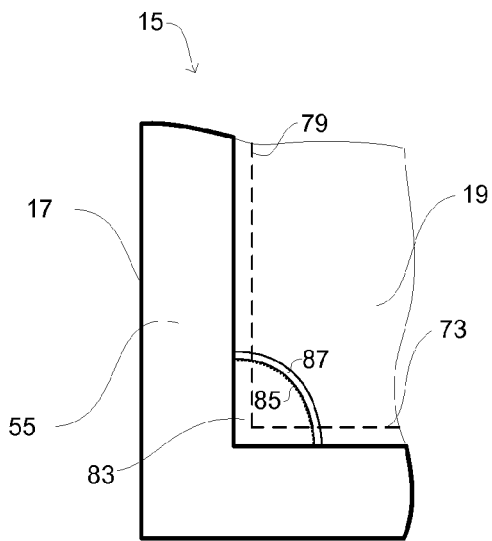
FIG. 8 is a schematic illustration of a portion of a pellicle assembly according to an alternative embodiment.

FIG. 8 is a schematic illustration of a portion of a pellicle assembly 15 comprising a pellicle 19 held by a pellicle frame 17. The pellicle assembly 15 may include any of the features described herein with reference to other embodiments. The pellicle 19 includes an available region 79 which lies within an exposure field 73 but which does not overlie a patterned region of a patterning device MA (not shown in FIG. 8). The pellicle 19 further includes a breakage region 83. The breakage region 83 comprises a portion of the pellicle 19 which is configured to preferentially break, during normal use, prior to breakage of remaining regions of the pellicle 19. At least part of the breakage region 83 is situated within the available region 79 of the pellicle 19. The breakage region 83 may be structurally weakened relative to surrounding portions of the pellicle 19. The breakage region 83 of FIG. 8 may be similar to the breakage regions described above with reference to FIG. 6 and may include any of the features of other breakage regions described herein. The breakage region 83 of FIG. 8 may be formed using any of the methods for formation of a breakage regions which are described herein.

The pellicle 19 further comprises a reinforced region 87 positioned adjacent to the breakage region 83. The reinforced region has an increased thickness when compared to the remaining regions of the pellicle 19. The reinforced region 87 is therefore structurally stronger than the breakage region 83 and is configured to resist further breakage of the pellicle 19 in the event that the breakage region 83 breaks. The breakage region 83 may, for example, break along a fracture line 85 which borders the reinforced region 87.

In the embodiment which is shown in FIG. 8 the reinforced region 87 traces out a curved shaped on the pellicle 19. This may improve the strength of the reinforced region 87 and may enable the reinforced region 87 to resist further breakage of the pellicle 19. The reinforced region 87 and the fracture line 85 extend between sections of the perimeter portion 55 of the pellicle 19 which is supported by the frame 17. The fracture line 85 and the reinforced region 87 enclose a portion of the pellicle 19 which is positioned at the edge of the unsupported portion of the pellicle 19 (the portion which is not in contact with the frame 17). The region of the pellicle 19 which is broken is therefore a small contained region and little or no debris is created with the rest of the pellicle remaining intact.

During normal use, the breakage region is exposed to similar forces and conditions to the rest of the pellicle 19. In the event that the breakage region 83 breaks this may indicate that other regions of the pellicle are close to breaking. The breakage region 83 may be monitored and if it is detected that the breakage region 83 is broken then the pellicle may be taken out of operation and replaced. Advantageously the pellicle is taken out of operation prior to critical failure of the pellicle. This may avoid generation of significant debris and contamination of the surrounding environment.

The breakage region 83 may be monitored using any form of sensor which is configured to detect breakage of the breakage region 83. For example, the breakage region may be illuminated with radiation and the reflection and/or transmission of radiation from the breakage region may be detected. A change in the reflectivity or transmission of the breakage region may indicate that the breakage region 83 is broken.

At least part of the breakage region 83 receives radiation (e.g. EUV radiation) during a lithographic exposure process and some radiation reflected from the patterning device MA which is subsequently incident on a substrate W will pass through the breakage region. If the breakage region breaks the transmission of the breakage region 83 will change. This may be detected by a change in intensity of radiation at the substrate W in a region of the substrate which receives radiation which has passed through the substrate W. Such a change in intensity may be detected and may indicate that the breakage region 83 has broken. A change in radiation intensity at a substrate W may be detected directly. Alternatively a change in radiation intensity at the substrate W may be detected by monitoring the substrate W after exposure to radiation. The substrate W may be provided with a photoresist which undergoes a state change upon exposure to radiation. Changes in the intensity of radiation to which the photoresist is exposed will be detectable in the photoresist and may indicate breakage of the breakage region 83. Regions of the substrate W which receive radiation which has passed through the breakage region 83 are outside a region of the substrate W in which patterned features are formed (since the breakage region 83 is situated outside of the patterned region of the pattering device MA). Breakage of the breakage region will not therefore affect a pattern which is formed in the substrate.

In some embodiments, a breakage region 83 (or another feature of a pellicle described herein) may be positioned outside of an image field which represents portions of the patterning device which are imaged onto a substrate W. A breakage region 83 (or another feature of a pellicle described herein) may not therefore influence the radiation to which a substrate W is exposed.

In some embodiments, a pellicle may include a plurality of breakage regions 83 similar to the breakage region 83 of FIG. 8. The plurality of breakage regions 83 may each be monitored in order to detect breakage of the breakage regions.

As was described above, the reinforced region 87 has an increased thickness when compared to the remaining regions of the pellicle 19. The increased thickness of the pellicle 19 may cause the reinforced region 87 to be heated to higher temperatures than other portions of the pellicle (e.g. due to an increased absorption of radiation). The reinforce region 87 is in contact with the frame 17 so as to provide a thermal connection between the reinforced region 87 and the frame. Heat from the reinforced region 87 may therefore be conducted to the frame 17 which may act as a heat sink and regulate the temperature of the reinforced region 87.

In the embodiments describe above with reference to FIGS. 5-8, at least breakage region 83 is provided in an available region 79 of the pellicle 19 which lies within an exposure field 73 but which does not overlie a patterned region of a patterning device MA. In some embodiments a pellicle frame 17 may be positioned at least partially within the exposure 73 such that at least part of the perimeter portion 55 of the pellicle receives exposure radiation. This may allow one or more breakage regions 83 or other modifications to the pellicle to be situated in the perimeter portion 55 of the pellicle 19, where it is supported by the frame 17.

Figure 9:
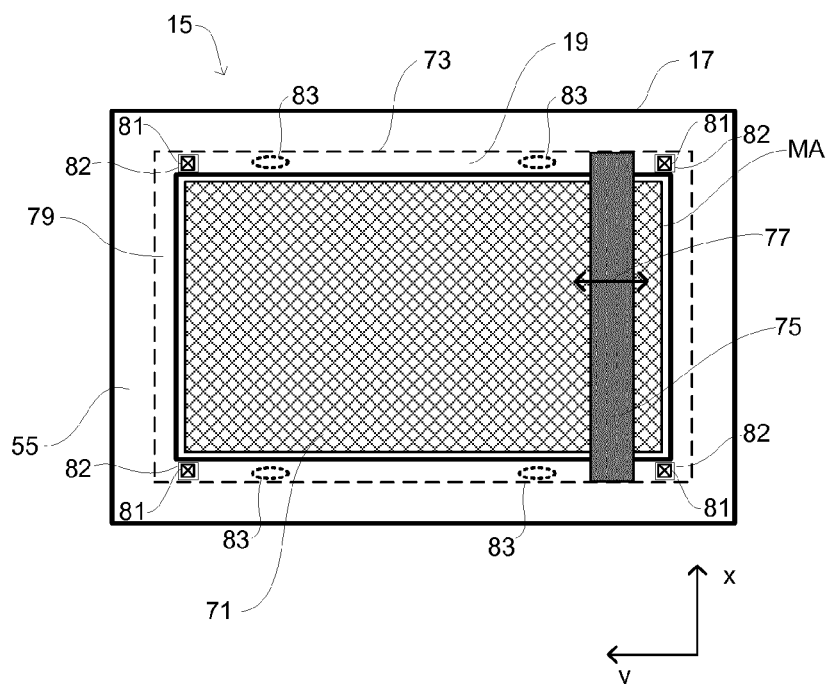
FIG. 9 is a schematic illustration of a pellicle assembly according to a further alternative embodiment.

FIG. 9 is a schematic illustration of a pellicle assembly 15 and a patterning device MA in part of a pellicle frame 17 is situated within an exposure field 73. The embodiment which is shown in FIG. 9 has many of the same features as the embodiment shown in FIG. 5. The same reference numerals are used to denote equivalent features in FIGS. 5 and 9 and many of these features are not described again in detail with reference to FIG. 9.

In the embodiment shown in FIG. 9, the pellicle frame 17 includes a portion which lies inside the exposure field 73 and therefore receives radiation (e.g. EUV radiation) during a lithographic exposure process. The available portion 79 of the pellicle 19 which lies within an exposure field 73 but which does not overlie a patterned region of a patterning device MA therefore includes part of the perimeter portion 55 which is supported by the frame 17. This allows one or more breakage regions 83 to be situated in the perimeter portion 55 which is supported by the frame 17. A plurality of breakage regions 83 which are situated in the perimeter portion of the pellicle 19 are shown in FIG. 9.

Since the breakage regions 83 which are shown in FIG. 9 are supported by the frame 17, breakage of the breakage regions will have little effect on the unsupported region of the pellicle 19 which is not in contact with the frame 17. The remainder of the pellicle 19 may therefore advantageously remain intact, thereby avoiding the generation of significant amounts of debris.

Similarly to was described above with reference to FIG. 8, the breakage regions 83 may be monitored in order to detect breakage of a breakage region. In the event that the breakage region 83 breaks this may indicate that other regions of the pellicle 19 are close to breaking. If it is detected that a breakage region 83 is broken, then the pellicle 19 may be taken out of operation and replaced. Advantageously the pellicle is taken out of operation prior to critical failure of the pellicle 19. This may avoid generation of significant debris and contamination of the surrounding environment.

In the embodiment of FIG. 9 there is less space available on the patterning device MA which is not occupied by the pellicle frame 17, for example, when compared to the embodiment of FIG. 5. This may provide limited or no available space on the patterning device MA in which markers 81 may be provided. In the embodiment of FIG. 9, windows 82 are provided in the pellicle frame 17 such that markers 81 on the patterning device MA may be viewed through the windows 82. This allows access to the markers 81, for example, during alignment of the patterning device MA.

As was described above with reference to FIG. 3, a pellicle 19 may include at least one layer which is electrically conductive. For example, a pellicle 19 may include an emissive layer 31a which may also be electrically conductive. An electrically conductive layer in a pellicle 19 may, for example, be formed from a metal (e.g. a transition metal such as ruthenium). Alternatively an electrically conductive layer in a pellicle 19 may be formed from graphene.

Electrical conductivity in a pellicle 19 may allow the electrical resistance of parts of the pellicle 19 to be monitored. As was mentioned above, an emissive layer 31a in a pellicle may over time undergo chemical changes. For example, an emissive layer 31a in a pellicle 19 may become oxidized. Oxidation of an emissive layer 31a may reduce the emissivity of the emissive layer 31a and may reduce the effectiveness with which the emissive layer 31a regulates the temperature of the pellicle 19. Oxidation of an emissive layer 31a may therefore increase the likelihood of damage to the pellicle 19 caused by overheating of the pellicle 19.

Oxidation of an emissive layer 31a will also cause the electrical resistance of the emissive layer 31a to increase. Oxidation of an emissive layer 31a may therefore be detected by monitoring the electrical resistance of all or part of a pellicle 19. A pellicle 19 may, for example, include electrical contacts which allow electrical connections to be made to an electrically conducting layer (e.g. an emissive layer 31a) of the pellicle 19. Electrical connections which are established with the electrically conducting layer allows the resistance through the electrically conducting layer and between the electrical contacts to be measured. An increase in the measured resistance may be indicative of oxidation of the electrically conducting layer (e.g. an emissive layer 31a). If the measured resistance exceeds a threshold value, then the pellicle 19 may be taken out of operation in order to avoid failure of the pellicle 19 due to overheating.

Figure 10:
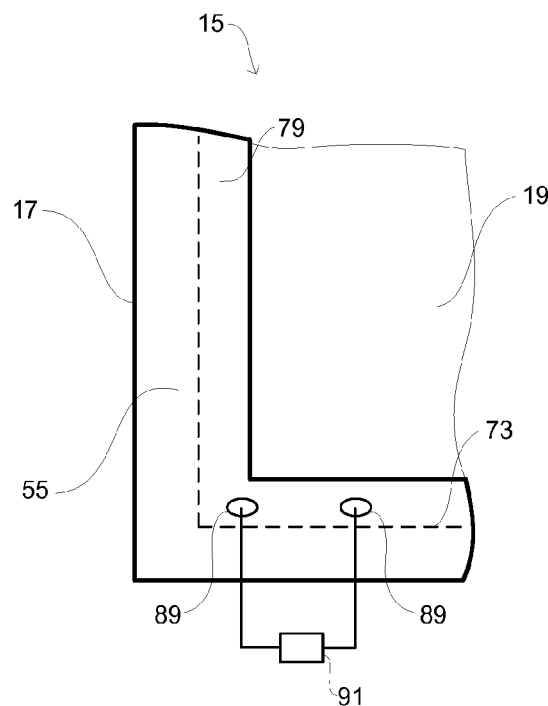
FIG. 10 is a schematic illustration of a pellicle assembly according to a still further alternative embodiment.

Electrical contacts on the pellicle may, for example, be situated on a perimeter portion 55 of the pellicle 19 which is supported by a frame 17. FIG. 10 is a schematic illustration of a portion of a pellicle assembly 15 comprising a pellicle frame 17 and a pellicle 19 which is supported by the pellicle frame 17 at a perimeter portion 55 of the pellicle 19.

The pellicle 19 includes electrical contacts 89 which allow electrical connections with an electrically conductive layer of the pellicle 19 to be established. The electrical contacts 89 are situated in the perimeter portion 55 of the pellicle 19. The perimeter portion 55 of the pellicle 19 is directly supported by the frame 17 and thus any damage to the perimeter portion 55 of the pellicle (which may, for example, result from the electrical connections with the pellicle) is less likely to cause damage to the unsupported portion of the pellicle 19 which is not in contact with the frame 17.

A sensor 91 is connected between two electrical contacts 89 and is configured to measure the resistance between the electrical contacts. The sensor 91 may be any form of sensor which is capable of measuring the resistance between two contact points.

The electrical contacts 89 are situated in an available region 79 of the pellicle 19 which lies within an exposure field 73 but which does not overlie a patterned region of a patterning device MA (not shown in FIG. 10). The region of the pellicle 19 which lies between the electrical contacts 89 will therefore be subjected to similar conditions to the unsupported portion of the pellicle 19. Oxidation of the region of the pellicle 19 which lies between the electrical contacts 89 which causes an increase in the resistance which is measured by the sensor 91 may therefore be indicative of oxidation of other regions of the pellicle 19. As was explained above, if the resistance which is measured by the sensor 91 exceeds a threshold value then the pellicle 19 may be taken out of operation in order to avoid failure of the pellicle 19 due to overheating.

The electrical resistance of a pellicle 19 may additionally or alternatively be monitored in order to detect cracks in the pellicle 19. In some instances, one or more cracks may form in a pellicle 19 which do not cause critical failure of the pellicle 19. A cracked pellicle 19 may indicate that critical failure of the pellicle 19 is imminent. It is therefore desirable to detect a crack in a pellicle 19 before critical failure of the pellicle 19 occurs such that the pellicle 19 may be removed from operation prior to the critical failure (thereby mitigating generation of significant amounts of debris and contamination of the surrounding environment).

Figure 11:
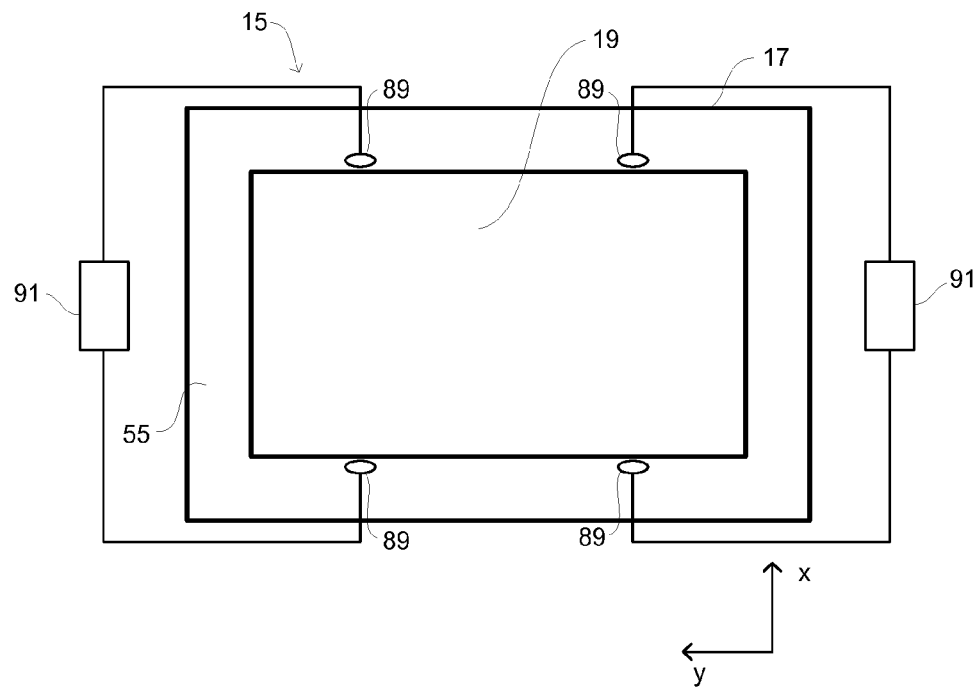
FIG. 11 is a schematic illustration of a pellicle assembly according to a still further alternative embodiment.

Cracks in a pellicle 19 may be detected by measuring the electrical resistance across the pellicle 19. FIG. 11 is a schematic illustration of a pellicle assembly 15 comprising a pellicle 19 and a pellicle frame 17 which supports a perimeter portion 55 of the pellicle. The pellicle 19 includes electrical contacts 89 which allow electrical connections with an electrically conductive layer of the pellicle 19 to be established. In the embodiment of FIG. 11, the electrical contacts 89 are situated in the perimeter portion 55 of the pellicle 19.

Sensors 91 are connected between respective pairs of electrical contacts 89 and are configured to measure the electrical resistance through the pellicle 19 and between the electrical contacts 89. Increases in the resistance which are measured by one or more of the sensors 91 may indicate that a crack has formed in the pellicle 19. In the event that an increase in the resistance which is measured by one or more of the sensors 91 is detected, the pellicle 19 may be taken out of operation in order to avoid further damage to the pellicle 19 and risk critical failure of the pellicle 19.

In the embodiment shown in FIG. 11, four electrical contacts 89 and two sensors 91 are shown. However, it will be appreciated that in other embodiments a pellicle 19 may include fewer than or more than four electrical contacts 89. In some embodiments several electrical contacts 89 may be distributed around the perimeter portion 55 of the pellicle and the resistance of a number of different electrical paths across the pellicle may be measured using a plurality of sensors 91. This may allow cracks which form at any position on the pellicle 19 to be detected.

In some embodiments, electrical pathways between electrical contacts 89 may be electrically isolated from other parts of the pellicle 19. For example, the pellicle 19 may include an electrically conductive path between two electrical contacts 89, where the electrically conductive path is electrically isolated from other regions of the pellicle 19 (e.g. due to an absence of electrically conductive material in the other regions). In such embodiments an electrical potential may be applied to specific regions of the pellicle 19 as opposed to subjecting the entire pellicle 19 to an electrical potential. Any current which flows along an isolated electrical pathway may be measured in order to derive the electrical resistance of the pathway. Any changes in the resistance of the pathway may indicate damage to the pellicle and/or the potential for imminent failure of the pellicle 19.

In some embodiments a pellicle assembly may include a sensor assembly configured to detect a change in a property associated with the pellicle 19. A change in the property associated with the pellicle 19 may be indicative of damage to the pellicle 19. For example, a sensor assembly may be configured to detect a change in the transmission or reflectivity of the pellicle to radiation and/or acoustic waves. In the event that a pellicle is damaged, for example, due to a crack forming in the pellicle, the reflectivity of a damaged region may increase. Detection of an increase in the reflectivity of a pellicle may therefore be indicative of damage to the pellicle 19.

Figure 12C:
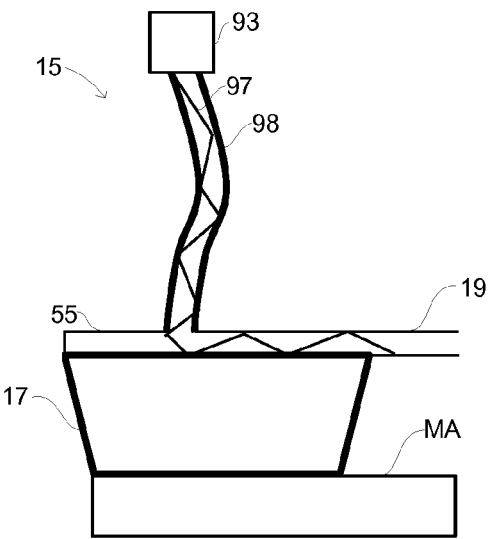
Figure 12C:
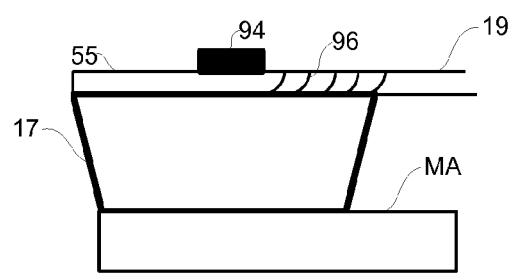
Figure 12C:
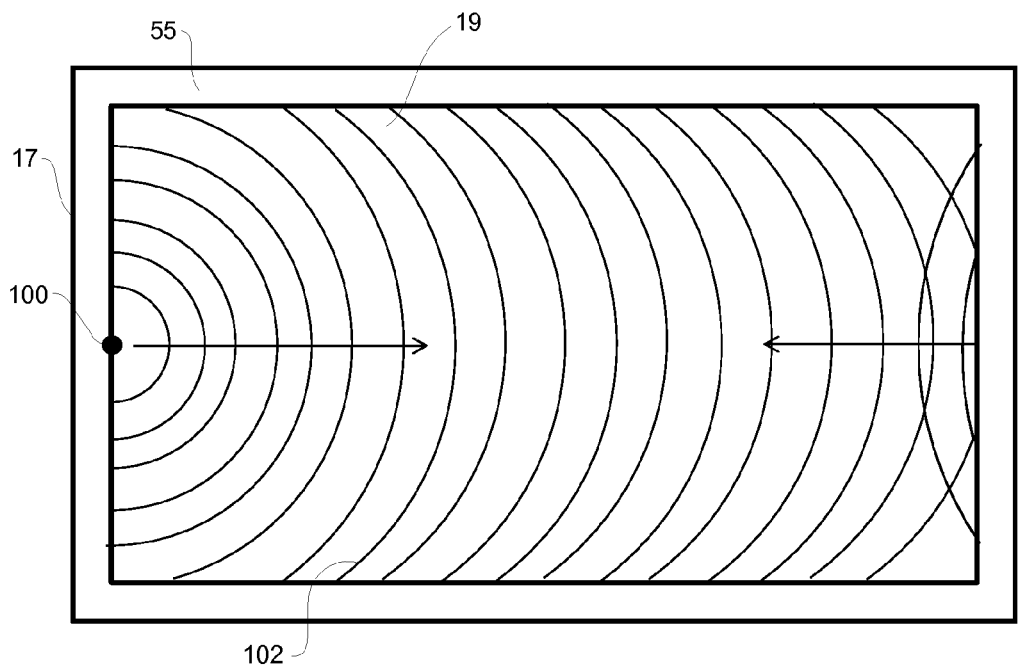

FIGS. 12A-12D are schematic illustrations of elements of pellicle failure detection apparatuses according to embodiments. FIG. 12A shows a portion of a pellicle assembly 15 and components of an embodiment of a sensor assembly. The pellicle assembly 15 comprises a frame 17 and a pellicle 19 which is supported by the frame around a perimeter portion 55 of the pellicle 19. The pellicle frame 17 is attached to a patterning device MA. The pellicle failure detection apparatus comprises a sensor assembly comprising a radiation source 93 and a radiation sensor (not shown in FIG. 12A). The radiation source 93 is configured to emit a radiation beam 97 which is input into a waveguide 98. The waveguide 98 is connected to the pellicle 19 and is configured to couple the radiation beam 97 into the pellicle 19 such that the radiation beam 97 is transmitted through the pellicle 19. The pellicle 19 acts as a waveguide and supports transmission of the radiation beam 97 along the pellicle 19.

FIG. 12B shows a portion of a pellicle assembly 15 and components of an alternative embodiment of a sensor assembly. The embodiment which is shown in FIG. 12B includes a transducer 94 (e.g. a piezoelectric transducer) which is situated in contact with the pellicle 19. The transducer 94 excites acoustic waves 96 in the pellicle 19 which are transmitted along the pellicle 19.

FIG. 12C schematically depicts the propagation of waves through a pellicle 19 held by a frame 17 around a perimeter portion 55 of the pellicle 19. A waveform is input into the pellicle 19 at an input point 100. Wavefronts are represented in FIG. 12C with lines 102. The waves may be electromagnetic waves (e.g. when a radiation beam is coupled into the pellicle 19 as shown in FIG. 12A) or may be acoustic waves (e.g. when a transducer generates acoustic waves in the pellicle as shown in FIG. 12B). The pellicle 19 acts as a waveguide and supports propagation of the waves across the pellicle 19. The waves propagate in a direction which is substantially parallel with surfaces of the pellicle 19.

In some embodiments, the transmission and/or the reflection of waves by the pellicle 19 may be measured. For example, a sensor may be positioned close to the input point 100 and may measure waves which are reflected back towards the input point. The sensor may, for example, measure a return time in between a waveform being input into the pellicle 19 and a corresponding reflection being measured by the sensor. In the case of an undamaged pellicle 19, waves may be reflected at the frame 17 on the opposite side of the pellicle 19 to the input point 100 (as is shown in FIG. 12C).

Figure 12D:
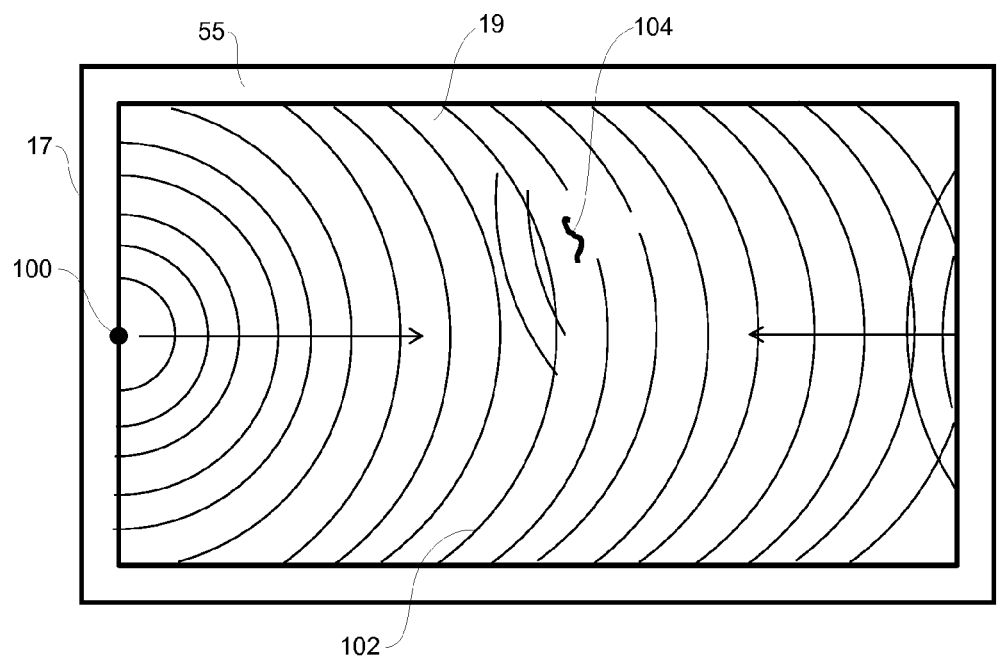

FIG. 12D shows a pellicle 19 which has developed a crack 104. The crack 104 serves to reflect waves which are incident upon it, thereby providing a source of reflection which is closer to the input point 100 than the frame 17 at the opposite end of the pellicle 19. The crack 104 in the pellicle 19 may therefore lead to a reduction in the return time in between a waveform being input into the pellicle 19 and a corresponding reflection being measured by a sensor. A change in a signal which is detected by a sensor may therefore be indicative of damage to the pellicle 19. In some embodiments, one or more sensors may be arranged to detect the intensity of waves which are transmitted and/or reflected by the pellicle 19. A change in the intensity of waves which are transmitted and/or reflected by the pellicle 19 may be indicative of damage to the pellicle 19.

In some embodiments a sensor assembly which may form part of a pellicle failure detection apparatus may comprise a sensor configured to measure a stress to which the pellicle 19 is subjected. For example, a stress sensor may be situated on a perimeter portion 55 of a pellicle 19 which is supported by a pellicle frame 17. A stress sensor may be configured to measure compressive stress to which a pellicle 19 is subjected. Additionally or alternatively a stress sensor may be configured to measure a tensile stress to which a pellicle 19 is subjected.

A suitable stress sensor may, for example, include a micro-bridge stress sensor comprising a thin bridge extending between two elements. In the event that the micro-bridge is subjected to compressive stress, the thin bridge may buckle or break under the stress, thereby providing an indication of the stress to which a pellicle 19, on which the stress sensor is situated, is subjected.

In some embodiments a suitable stress sensor may, for example, include one or more Guckel rings. A Guckel ring comprises a ring-shaped structure and one or more beams extending across the ring-shaped structure. A Guckel ring is configured to convert a tensile stress into a compressive stress. In the event that the Guckel ring is subjected to a tensile stress one or more of the beams extending across the ring may buckle under the stress, thereby providing an indication of the stress to which a pellicle 19, on which the Guckel ring is situated, is subjected.

In some embodiments more than one stress sensor may be situated on a pellicle 19. Different stress sensors which are situated on the pellicle 19 may be configured to measure stress in different positions, stress acting in different directions and/or stress of different magnitudes.

A pellicle 19 which is subjected to high levels of stress may be damaged by the stress. Positioning one or more stress sensors on the pellicle 19 may allow the stress to which the pellicle 19 is subjected to be monitored. In the event that the stress to which the pellicle 19 is subjected is large enough that damage to the pellicle 19 is likely, the pellicle 19 may be taken out of operation in order to avoid damage and critical failure of the pellicle 19.

Additionally or alternatively one or more strain gauges may be positioned on a pellicle 19. For example, one or more strain gauges may be positioned on a perimeter portion 55 of a pellicle 19. The one or more strain gauges may monitor a strain which the pellicle undergoes. In the event that the strain which the pellicle 19 undergoes is large enough that damage to the pellicle 19 is likely, the pellicle 19 may be taken out of operation in order to avoid damage and critical failure of the pellicle 19.

Figure 13A:
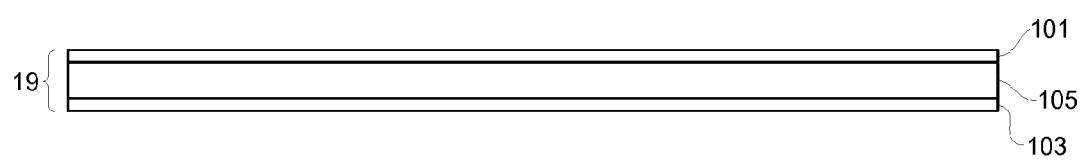
FIG. 13A is a schematic illustration of a pellicle according to an embodiment and FIG. 13B is a representation of a stress-strain curve which the pellicle of FIG. 13A may undergo.

In some embodiments a pellicle 19 may be configured to contain debris within itself in the event of breakage of part of the pellicle 19. FIG. 13A is a schematic illustration of a pellicle 19 according to an embodiment shown in cross-section. The pellicle 19 comprises a first layer 101, a second layer 103 and a third layer 105. As is shown in FIG. 13A, the third layer 105 is situated between the first 101 and the second layer 103. The first layer 101 has a first ductility, the second layer 103 has a second ductility and the third layer 105 has a third ductility. The third ductility is less than the first ductility and less than the second ductility.

Ductility is a measure of a material's ability to plastically deform under stress. For example, when a material is subjected to a tensile stress, the material will deform under the tensile stress so as to be stretched. Ductility is a measure of how much plastic deformation/elongation a material undergoes before it breaks. For example, a material having a relatively high ductility will undergo a large deformation before the material breaks. A material having a lower ductility is less susceptible to being deformed under tensile stress and may undergo only a small amount of deformation before breaking.

In the embodiment shown in FIG. 13A, each of the three layers 101, 103, 105 of the pellicle 19 will be subjected to the same stress during use. The third layer 105 has a lower ductility than the ductility of the first and second layers 101, 103 and is therefore relatively brittle when compared to the first and second layers 101, 103.

Figure 13B:
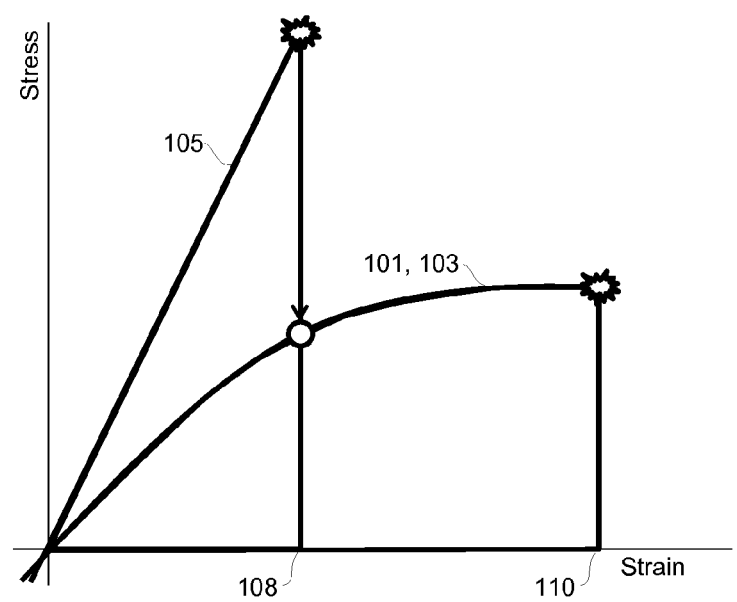

FIG. 13B is a schematic illustration of a stress-strain curve which may be experienced by the pellicle shown in FIG. 13A. When all of the layers 101, 103, 105 are intact, the strain which the pellicle 19 undergoes is determined by the total stiffness of the pellicle 19, which is dominated by the stiffest layer of the pellicle. The stiffest layer of the pellicle 19 is the third layer 105. Under an initial stress, the strain of the pellicle 19 therefore approximately follows the stress strain curve of the third layer 105 (denoted 105 in FIG. 3B). At a first critical strain 108, the third layer 105 is broken. Breakage of the third layer leads to a dissipation of energy in the pellicle 19, for example, due to the formation of cracks in the third layer 105 and/or the generation of sound waves etc.

After the third layer 105 breaks the stress-strain curve of the pellicle 19 as a whole follows the stress-strain curve of the first and second layers 101, 103 combined (denoted 101, 103 in FIG. 13B). Since the first and second layers 101, 103 have higher ductility's than the third layer 105, the first and second layers 101, 103 can undergo further deformation after the third layer 105 has broken. The further deformation of the first and second layers 101, 103 after breakage of the third layer 105 further dissipates potential energy in the pellicle 19 prior to critical fracture of the pellicle 19.

At a second critical strain 110 the first and second layers 101, 103 break and critical fracture of the pellicle 19 occurs. As was explained above, the strain which the first and second layers 101, 103 undergo after the third layer 105 has broken serves to dissipate potential energy. There is therefore less potential energy available when the first and second layers 101, 103 break and critical fracture of the pellicle 19 occurs. Consequently, the energy which is dissipated during the critical fracture is reduced. The presence of the first and second layer 101, 103 having relatively high ductility's serves to increase the amount of energy which can be dissipated by the pellicle 19 prior to catastrophic failure of the pellicle 19.

As was explained above with reference to FIG. 13B, in the event that the pellicle 19 is subjected to a stress which is sufficiently large to break the third layer 105, the third relatively brittle layer 105 will break prior to the first and second 101, 103 relatively ductile layers (due to the lower ductility of the third layer 105). As is shown in FIG. 13A the third layer 105 is situated between the first and second layers 101, 103. When the third layer 105 breaks, broken pieces of the third layer are therefore contained by the first and second layers 101, 103. Broken pieces of the third layer 105 will not therefore contaminate the surrounding environment and the pellicle 19 may be cleanly removed and/or replaced without causing substantial contamination. After the third layer 105 has broken, the first and second layers 101, 103 may still be able to withstand additional stress (due to their relatively high ductility's) and may safely contain the broken third layer 105.

The first and second relatively high ductility layers 101, 103 may form capping layers as were described above with reference to FIG. 3. The first and second layers 101, 103 may, for example, be formed from a metal and/or an alloy. For example, the first and second layers 101, 103 may, for example, comprise a titanium, niobium and/or zirconium alloy.

In some embodiments, a pellicle 19 may include more than three layers. For example, in addition to the three layers described above with reference to FIG. 13A a pellicle 19 may also comprise an emissive layer (e.g. an emissive layer similar to the emissive layer 31a described with reference to FIG. 3). In general, a pellicle 19 which acts to contain pellicle debris within itself may comprise any number of layers, where at least one of the layers has a ductility which is lower than the ductility's of two other layers which are situated either side of the low ductility layer. Relatively high ductility layers (i.e. the first and second ductility layers 101, 103) need not be directly in contact with a relatively low ductility layer (i.e. the third ductility layer 105). That is, one or more intermediate layers may be positioned in between the layers. In such an embodiment the third relatively low ductility layer is still considered to be situated between the first and second relatively high ductility layers even if there is no direct contact between the layers.

Figure 14:
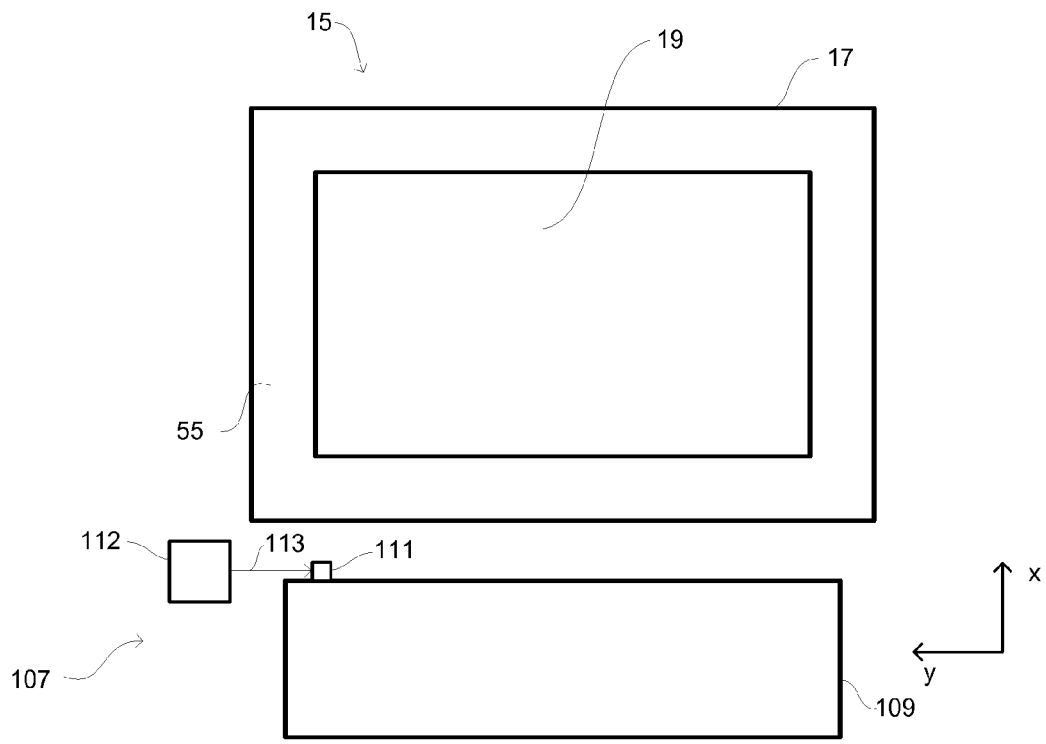
FIG. 14 is a schematic illustration of a debris mitigation apparatus according to an embodiment.

FIG. 14 is a schematic illustration of a debris mitigation device 107 according to an embodiment. The debris mitigation device 107 is situated close to a pellicle 19. In the embodiment shown in FIG. 14, the debris mitigation device 107 is situated adjacent to a pellicle assembly 15 comprising a pellicle frame 17 and a pellicle, which is held by the pellicle frame 17 around a perimeter portion 55 of the pellicle 19. The debris mitigation device 107 comprises a debris steering device configured to direct debris resulting from breakage of the pellicle 19 in a preferred direction. In the embodiment shown in FIG. 14, the debris mitigation device 107 further comprises a sensor 112 configured to monitor the pellicle 19 and detect breakage of the pellicle 19. The debris steering device is configured to react to a detection of breakage of the pellicle 19 (as detected by the sensor 112) and direct debris resulting from the breakage of the pellicle in a preferred direction.

In the embodiment shown in FIG. 14, the debris steering device comprises an enclosed chamber 109 and actuator 111. The inside of the chamber 109 is held at a pressure which is lower than the pressure at which the pellicle 19 is held. For example, the inside of the chamber 109 may be pumped down to a very low pressure by using a vacuum pump. The actuator 111 is configured to open the chamber 109 in reaction to a detection of breakage of the pellicle 19. For example, upon detection of breakage of the pellicle 19 by the sensor 112, the sensor 112 may send a signal 113 to the actuator 111. The actuator 111 responds to the signal 113 by opening the chamber 109. The actuator 111 may, for example, open a door (not shown) in the chamber 109 so as to expose the inside of the chamber 109. The lower initial pressure inside the chamber 109 will cause material to be sucked into the chamber 109 when the chamber 109 is opened by the actuator 111. For example, the broken pellicle 19 may be sucked into the chamber 109, thereby directing the debris from the broken pellicle 19 into the chamber 109 (which may be considered to be an example of a preferred direction). The debris may be safely contained within the chamber 109 and may avoid contamination of the surrounding environment (for example contamination of the patterning device MA).

In some embodiments, a debris mitigation device may comprise more than one chamber 109. For example, a plurality of chambers 109 may be positioned around a pellicle 19, each chamber 109 having an actuator configured to open the chamber 109 upon detection of breakage of the pellicle 109.

The sensor 112 may be any sensor which is capable of detecting breakage of the pellicle 109. For example, the sensor 112 may comprise any of the sensors described above in connection other embodiments. In general, any sensing method whether described herein or otherwise may be used to detect breakage of the pellicle 19.

In alternative embodiments, a chamber 109 which is situated close to a pellicle 19 (as is shown in FIG. 14) may be held at a pressure which is higher than the pressure at which the pellicle 19 is held. For example, a vacuum pumping mechanism may be configured to pump down the environment in which the pellicle 19 is held to a pressure which is lower than the pressure inside the chamber 109. In the event that the sensor 112 detects breakage of the pellicle 109 and the actuator 111 opens the chamber 109, the pressure difference will cause gas to be blown out of the chamber 109. Consequently, debris resulting from the broken pellicle 19 is blown away from the chamber 109 and in a preferred direction. For example, the debris may be blow away from a patterning device MA and may reduce any contamination of the patterning device MA.

Figure 15:
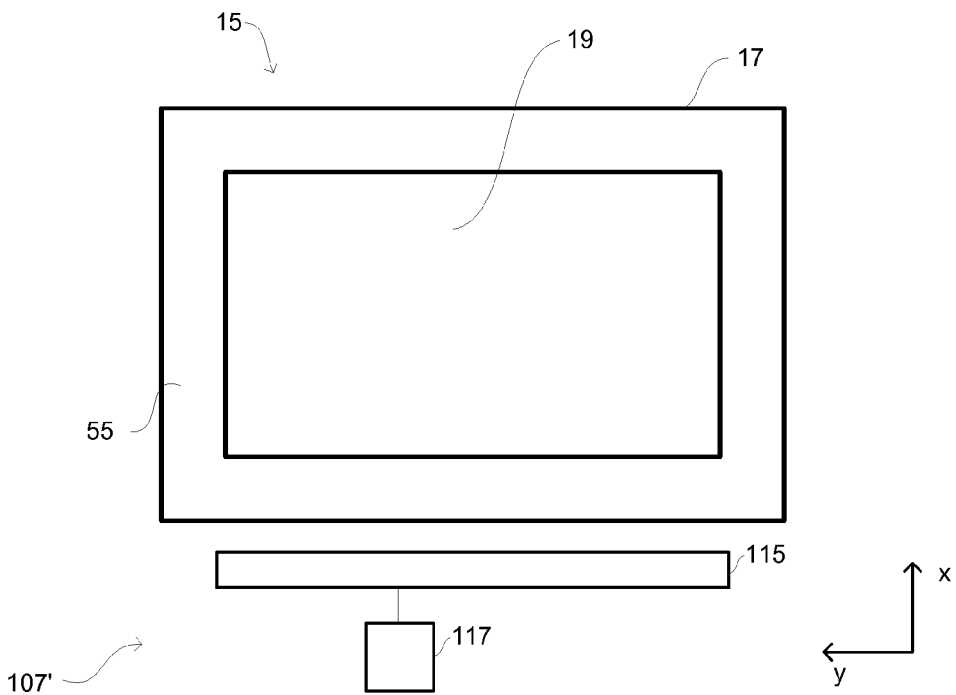
FIG. 15 is a schematic illustration of a debris mitigation apparatus according to an alternative embodiment.

FIG. 15 is a schematic illustration of a debris mitigation device 107' according to an alternative embodiment. The debris mitigation device 107' is situated close to a pellicle 19. In the embodiment shown in FIG. 15, the debris mitigation device 107 is situated adjacent to a pellicle assembly 15 comprising a pellicle frame 17 and a pellicle, which is held by the pellicle frame 17 around a perimeter portion 55 of the pellicle 19. The debris mitigation device 107' comprises a debris steering device configured to direct debris resulting from breakage of the pellicle 19 in a preferred direction. The debris steering device comprises an electrically charged surface 115 positioned close to the pellicle 19. The electrically charged surface 115 may, for example, comprise a charged plate. The electrically charged surface may, for example, be charged using a voltage source 117. In the event of breakage of the pellicle 19, debris from the pellicle is directed towards the electrically charged surface by electrostatic attraction. Directing the pellicle debris towards the charge surface 115 advantageously reduces contamination of other components (e.g. a patterning device MA).

In some embodiments, an electrically charged surface 115 may be used in conjunction with a sensor (e.g. the sensor 112) configured to detect breakage of the pellicle 19. For example, the surface 115 may only be charged (e.g. by turning on the voltage source 117) in response to detection of breakage of the pellicle 19 by the sensor.

Figure 16:
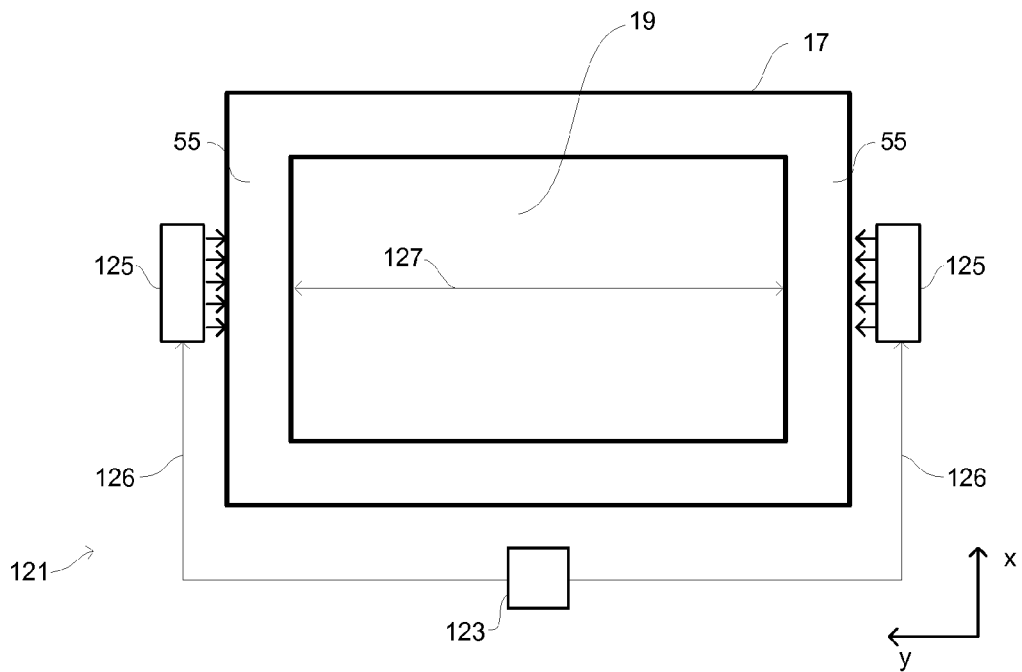
FIG. 16 is a schematic illustration of a debris mitigation apparatus according to a further alternative embodiment.

FIG. 16 is a schematic illustration of a debris mitigation device 121 according to an embodiment. The debris mitigation device 121 comprises a sensor 123 configured to monitor a pellicle 19 held by a frame 17 and detect damage to the pellicle 19. For example, the sensor may be configured to detect the formation of one or more cracks in the pellicle 19. Additionally or alternatively the sensor may be configured to detect breakage of one or more breakage regions which may be included in the pellicle 19. In general, any sensing method whether described herein or otherwise may be used to detect damage to the pellicle 19.

The debris mitigation device 121 further comprises a tension controlling device configured to react to detection (by the sensor 123) of damage to the pellicle 19 and reduce the tension in the pellicle, thereby limiting further damage to the pellicle 19.

In the embodiment shown in FIG. 16, the tension controlling device takes the form of a plurality of actuators 125 configured to compress the frame 17 on which the pellicle 19 is held. The actuators may, for example, respond to a signal 126 sent from the sensor 123 to the actuators 125 upon detection of damage to the pellicle 19. The actuators 125 compress the frame 17 by applying opposite forces on two sides of the frame 17 as indicated by arrows in FIG. 16. Compressing the frame 17 as shown in FIG. 16, slightly reduces a distance 127 between opposite sections of a perimeter portion 55 of the pellicle 19 which is held by the frame 17, thereby reducing a tension in an unsupported portion of the pellicle 19 (which is suspended between opposite parts of the frame 17).

Reducing the tension in the pellicle 19, reduces the stress to which the pellicle 19 is subjected and reduces the likelihood of further damage and critical failure of the pellicle 19. This may allow the pellicle 19 to be removed from operation and/or replaced prior to critical failure of the pellicle 19.

In other embodiments, the tension controlling device may take other forms. For example, the tension controlling device may comprise a temperature controlling device which is configured to increase the temperature of the pellicle 19 in response to detection of damage to the pellicle 19. Increasing the temperature of the pellicle 19 will cause the pellicle 19 to expand, thereby reducing the tension in the pellicle 19.

The temperature controlling device may, for example, be configured to increase the temperature of the pellicle 19 by resistive heating. For example, an electrical current may be passed through a resistive element which is positioned in contact with the pellicle 19. The resistance in the resistive element causes heating of the element which may cause transfer of thermal energy to the pellicle 19, thereby increasing the temperature of the pellicle 19. Additionally or alternatively, an electrical current may be passed through the pellicle 19 itself and the resistance of the pellicle 19 will cause the pellicle 19 to be heated directly.

In other embodiments, the temperature controlling device may comprise a radiation source configured to illuminate the all or part of the pellicle 19. The pellicle 19 may absorb a fraction of the illuminating radiation, thereby causing the pellicle 19 to be heated by the radiation.

In some embodiments, measures other than those which have been described above may be taken in order to reduce contamination of components of a lithographic apparatus. For example, in some embodiments one or more shutters may be positioned in proximity to a pellicle 19. The one or more shutters may be configured to shut in response to a detection of breakage of a pellicle 19. The one or more shutters may act to restrict regions of a lithographic apparatus LA to which debris from a broken pellicle 19 is allowed reach thereby, limiting the extent of contamination of the lithographic apparatus LA.

A lithographic apparatus may include masking blades situated close to a patterning device MA. The mask blades may, for example, be used to restrict the spatial extent of radiation which is incident on the patterning device MA. In some embodiments the masking blades may be configured to close together in response to a detection of breakage of a pellicle 19. This may prevent debris resulting from a broken pellicle 19 from passing into the illumination system IL and may therefore advantageously prevent contamination of the illumination system IL.

Some embodiments may include apparatus which is configured to deliberately break a pellicle in a controlled manner. For example, in the event that damage to a pellicle 19 is detected the pellicle 19 may be broken in a controlled manner so as to avoid an uncontrolled critical fracture of the pellicle 19 which may produce significant amounts of debris. In some embodiments one or more actuators may be provided which may break a pellicle in a controlled manner. In other embodiments one or more radiation sources operable to form cracks in a pellicle may be provided. For example, one or more lasers may be arranged to illuminate a pellicle with a high power laser beam which may cause fracture the pellicle. A laser beam may be moved across a pellicle in a controlled manner so as to form a controlled crack in the pellicle.

As was described above with reference to FIG. 5, during use in a lithographic apparatus LA, a pellicle 19 may be exposed to a slit of radiation 75 which is scanned across the pellicle 19 in a scanning direction (which is conventionally denoted as the y-direction). Exposure to radiation may cause local heating of the pellicle 19 which may reduce the tension in the pellicle 19. As will be appreciated, for example, from FIG. 5, the exposure slit of radiation 75 has different dimensions in the x and y-directions.

In particular, the dimension of the exposure slit 75 is greater in the x-direction then in the y-direction. Consequently, a large section of the width of the pellicle in the x-direction is heated by the radiation in the slit 75 and expands, thereby reducing the tension in the x-direction. In comparison, at a given position of the exposure slit 75 on the pellicle 19, only a small portion of the width of the pellicle 19 in the y-direction is heated by radiation in the exposure slit. Consequently, a reduction in tension in the pellicle 19 in the y-direction is smaller than a reduction in tension in the pellicle 19 in the x-direction. It may be desirable to provide a mechanism for compensating for the difference in tension reduction in the x and y-directions such that the pellicle 19 has approximately the same tension in the x and y-directions.

Figure 17A:
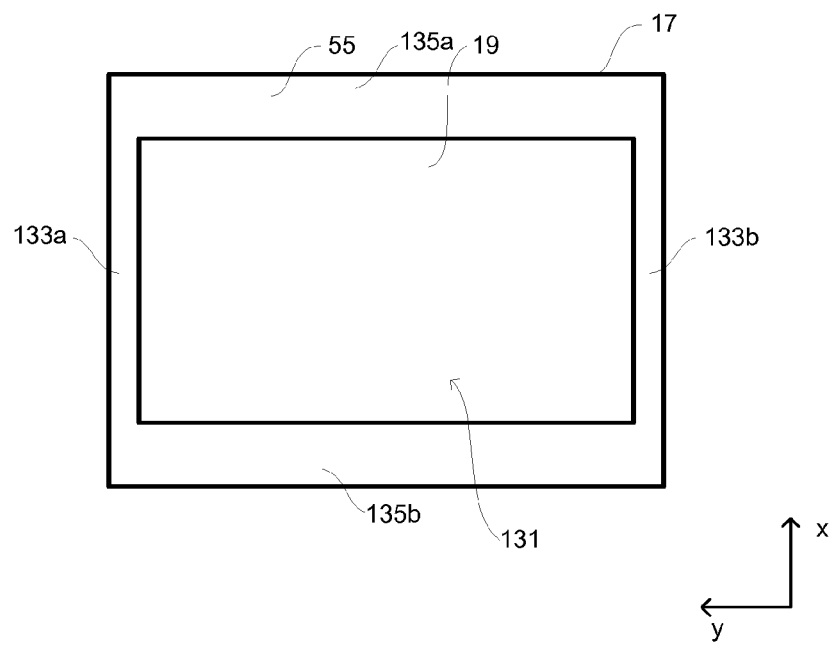
FIGS. 17A and 17B are schematic illustrations of pellicle frames according to embodiments.
Figure 17B:
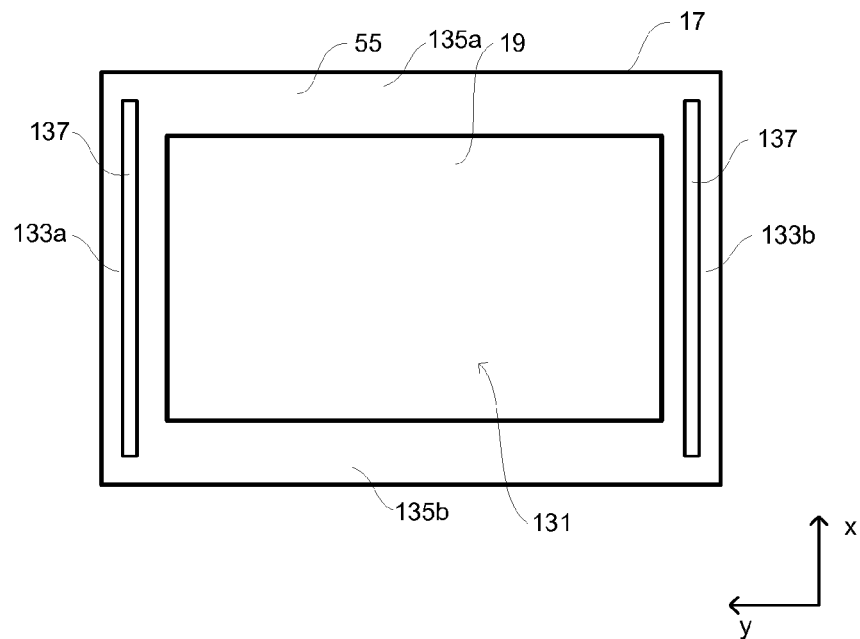

FIGS. 17a and 17b are schematic illustrations of alternative embodiments of a pellicle frame 17. Each of the embodiments of pellicle frames 17 shown in FIGS. 17a and 17b are configured to have different compliances in the x and y-directions. Each of the pellicle frames 17 shown in FIGS. 17a and 17b are configured to support a pellicle 19 around a perimeter portion 55 of the pellicle 19. The pellicle frames 17 enclose a suspended (or unsupported) region 131 of the pellicle. The pellicle frames 17 comprise a first pair of side portions 133a, 133b positioned at opposite ends of the suspended region 131 of the pellicle 19 and extending along the edges of the suspended region 131 of the pellicle 19 in the x-direction (which may be referred to as a first direction). The pellicle frames 17 further comprise a second pair of side portions 135a, 135b positioned at opposite ends of the suspended region 131 of the pellicle 19 and extending along the edges of the suspended region 131 of the pellicle 19 in the y-direction (which may be referred to as a second direction).

The first pair of side portions 133a, 133b are configured to have a compliance in the y-direction which is greater than a compliance of the second pair of side portions 135a, 135b in the x-direction. The greater compliance of the frame 17 in the y-direction means that the pellicle 19 which is supported by the pellicle frame 17 has an initial tension in the y-direction which is less than the initial tension of the pellicle in the x-direction. The initial tension may be considered to be a tension in the pellicle 19 prior to use of the pellicle in a lithographic apparatus LA. Equivalently, the initial tension in the pellicle 19 may be considered to be the tension in the pellicle 19 when the pellicle 19 as at thermal equilibrium (i.e. all regions of the pellicle 19 are at substantially the same temperature).

As was explained above, during exposure of the pellicle 19 to an exposure slit of radiation, the pellicle 19 may be heated differently in different directions. In particular, a reduction in the tension of the pellicle in the x-direction due to heating may be greater than a reduction in the tension of the pellicle in the y-direction due to heating. Since the initial tension is greater in the x-direction than in the y-direction, after heating of the pellicle by exposure to an exposure slit of radiation, the pellicle 19 may advantageously have a tension in the x-direction which is approximately equal to the tension in the y-direction.

In both of the embodiments which are shown in FIGS. 17a and 17b the first pair of side portions 133a, 133b of the pellicle frame have thicknesses in the y-direction which are less than the thicknesses of the second pair of side portions 135a, 135b in the x-direction. Consequently, the compliance of the frame 17 in the y-direction is greater than the compliance of the frame 17 in the x-direction. In the embodiment shown in FIG. 17b, the thicknesses of the first pair of side portions 133a, 133b is reduced relative to the thicknesses of the second pair of side portions 135a, 135b by forming slits 137 in the first pair of side portions 133a, 133b. The slits 137 extend in the x-direction along the first pair of side portions 133a, 133b. The thicknesses of the first pair of side-portions 133a are taken to be the total thicknesses excluding the slits 137 since the constitute portions of the frame 17 in which no material is present.

In an embodiment it is advantageous to monitor the pellicle presence and its integrity. A pellicle integrity detector may be operated based upon reflection of an optical beam (radiation beam 142) from a sensed surface. The pellicle integrity is monitored by detection of radiation beam 142 reflected from the pellicle surface. A beam transmitter and a receiver may be placed such as to allow the reflected beam to reach the receiver. The receiver will sense a signal when a pellicle membrane is present and no signal when it is not present or it is not intact (i.e. for a broken pellicle).

Figure 18:
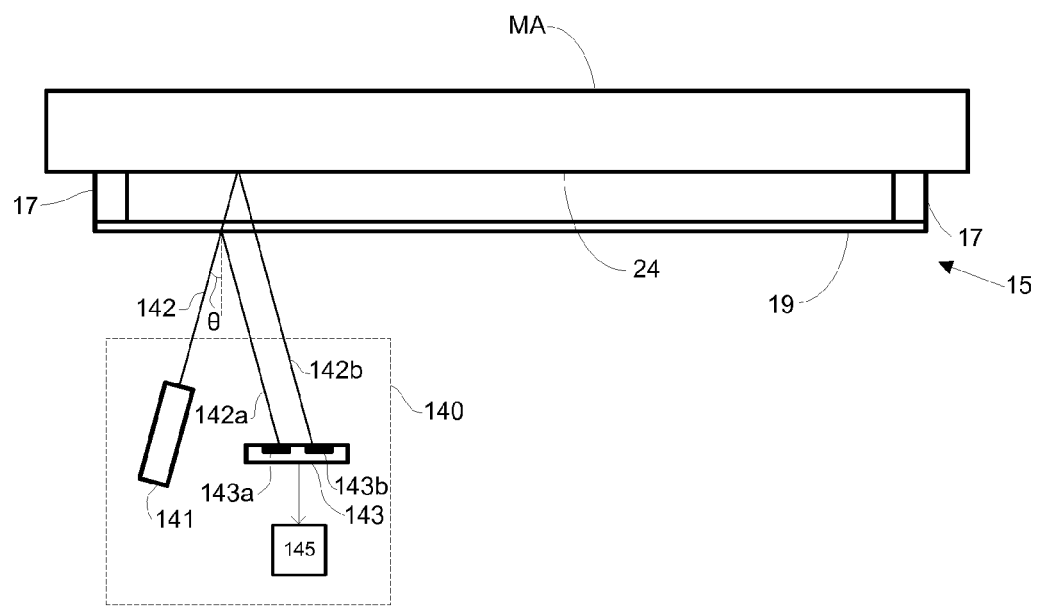
FIG. 18 is a schematic illustration of a pellicle failure detection apparatus according to an embodiment.
Figure 19:
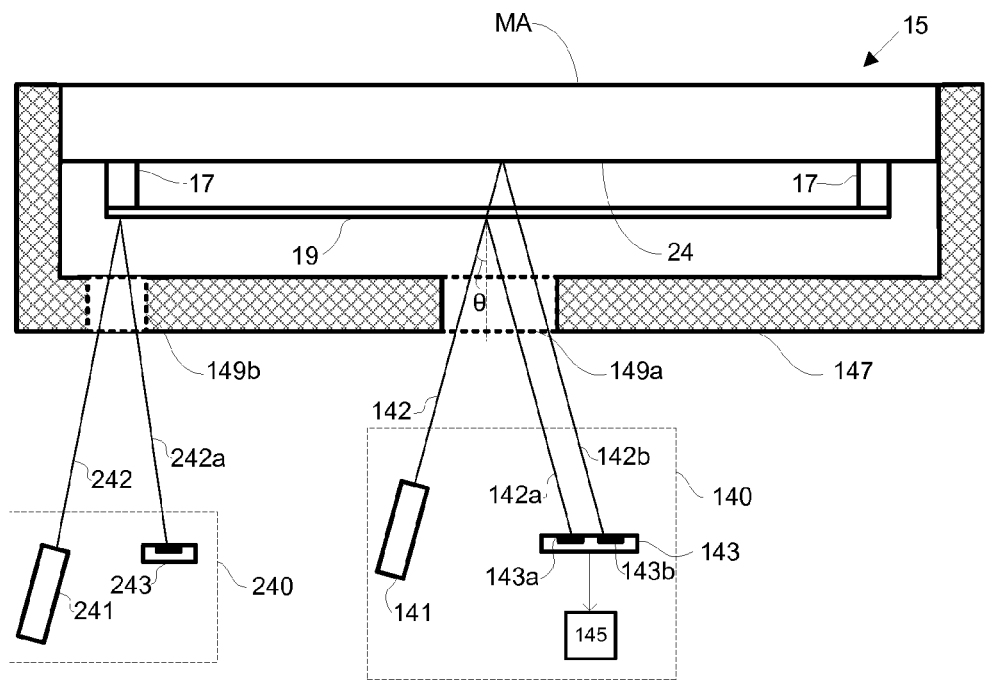
FIG. 19 is a schematic illustration of a patterning device and pellicle assembly situated inside a protective casing and being monitored by a pellicle failure detection apparatus according to an embodiment.

In embodiments described in FIGS. 18 and 19, the signal at a receiver sensor is sensitive to the distance of the pellicle from a transmitter. When the pellicle membrane moves up or down, the amplitude and position of the reflected radiation beam 142 will vary on the receiver. The receiver preferably is sensitive to either or both of these parameters, to allow monitoring of the pellicle membrane dynamic response to any external factors such as ambient pressure variations and vibrations. For example, position sensitive detectors can be used as receivers which are sensitive to the position of the reflected radiation beam 142.

A frame presence detector may also be desirable and can be operated based upon the reflected radiation beam 142. Multiple optical beam frame detectors may be used to detect the frame state, its presence, getting unglued or distorted, or any thermal effects from EUV radiation which may be deforming the frame.

Both the pellicle membrane and the pellicle frame detector may therefore comprise a radiation beam transmitter and a receiver. A radiation beam 142 may be provided by a single laser diode or an array of diode. It can however be provided by any other radiation beam sources. Fiber optics may be used to remote the transmitter and receiver. The radiation beam 142 is selected to have a wavelength that provides good reflection coefficient from the pellicle material, for the reticle material and for the pellicle (and mask) protective casing cover surfaces. It is also desirable to have little absorption of the beam in the pellicle in order to prevent undesired thermal effects. Although the detectors mentioned above are described to operate based on reflection of optical (radiation) beams, this is for illustration purpose only. Transmitted beams of other types, such as based on sound waves or any other feasible detectors may be used for this purpose.

The above mentioned detectors may use a bundle of mixed optical fibers having different receiving fiber numeric apertures (NA). Having different NA's allows for reflectivity compensation, which makes detection insensitive to the reflectivity changes in the sensed surface.

Detectors using an optical (radiation) beam approach will detect the pellicle motion and its motion frequency. The resonance frequency is for example indicative of the pellicle state. Any changes in the motion frequency may indicate changes related to an imminent pellicle failure, thermal effects or changes/degrading of the pellicle from use, etc. Both normal incidence and non-normal incidence beam scan may be used for such purpose. An optimal incidence angle may allow for fewer detectors in a smaller space. The status of the pellicle membrane may be measured at an initial moment and then monitored to detect any changes over time.

An array of optical transmitters/receivers (e.g. laser diodes, one- or two-dimensional arrays) may be used to detect multiple regions of the pellicle. The radiation beams may be angled differently for each transmitter to effectively check multiple regions from a small footprint. Examples of transmitter/detector pair configurations may be three sensors in a line, five or nine sensors forming a cross-shaped configuration, or a 3×3 array of sensors, with at least one frame sensor at the edge and at least one pellicle sensor in the center of the array.

A scanning beam concept may also be used to scan the pellicle surface for detecting changes in its integrity. This would require having a radiation beam with capability of rotation in 1D or 2D space (for example integrated with a rotating stage).

Pellicle and frame detection devices may be located in various positions inside and outside the lithographic apparatus or other devices (e.g. carriage casing, reticle inspection tools, etc.) to detect the pellicle state during storage, transportation etc. The pellicle integrity may also be monitored during reticle inspection, for example during the use of scatterometric instruments used to detect particle contamination on the reticle through the pellicle.

FIG. 18 is a schematic illustration of a pellicle failure detection apparatus 140 according to an embodiment. The pellicle failure detection apparatus 140 comprises a radiation source 141 and a radiation sensor 143. The radiation source 141 is configured to emit a radiation beam 142. The radiation sensor 143 is arranged to receive and detect reflections of the radiation beam 142.

Also shown in FIG. 18 is a patterning device MA and a pellicle assembly 15. The pellicle assembly 15 comprises a pellicle 19 and a pellicle frame 17 which holds the pellicle 19 in place so as to protect the patterning device MA from particle contamination. The radiation source 141 is arranged so as to illuminate a portion of the pellicle 19 and the patterning device MA (through the pellicle 19) with the radiation beam 142. The radiation sensor 143 is arranged to receive and measure reflections of the radiation beam 142 from the pellicle 19 and the patterning device MA. The radiation sensor is configured to illuminate a portion of the pellicle 19 at a non-normal angle of incidence. That is, the angle of incidence 6 of the radiation beam 142 at the pellicle 19 is greater than zero. In general, the pellicle 19 is approximately parallel with a patterned surface 24 of the patterning device MA. The angle of incidence with which the radiation beam 142 is incident on the patterned surface 24 of the patterning device MA is therefore generally approximately equal to the angle of incidence 6 of the radiation beam 142 on the pellicle 19.

Due to the non-normal angle of incidence 6 of the radiation beam 142 at the pellicle 19 and at the patterned surface 24, the position of a reflected beam 142a which is reflected from the pellicle 19 is different to the position of a reflected beam 142b which is reflected from the patterning device MA. The reflected beam 142a from the pellicle 19 is therefore incident on the radiation sensor 143 at a different position to the position of the reflective beam 142b from the patterning device MA. The radiation sensor 143 may be configured to determine the position at which radiation is incident upon it. The radiation sensor 143 may therefore be capable of differentiating between radiation which is reflected from the pellicle 19 and radiation which is reflected from the patterning device MA.

The pellicle detection apparatus 140 further comprises a controller 145 in communication with the sensor 143. The controller 145 is configured to detect failure of the pellicle from the detection of reflected radiation made by the sensor. For example, in the absence of a substantial reflection of radiation from the pellicle 19, the controller 145 may deduce that no pellicle 19 is present or that the pellicle 19 has broken (and is not therefore present in the optical path of the radiation beam 142). In some embodiments, the controller may be configured to detect failures of the pellicle when a measure of the intensity of the portion 142a of the radiation beam 142 which is reflected from the pellicle 19 falls below a threshold value. The measure of the intensity of the reflected portion 142a is made by the sensor 143 and may, for example, comprise the power and/or intensity of reflected radiation incident on the sensor 143.

In the embodiment shown in FIG. 18, the radiation sensor 143 comprises a first detector region 143a and a second detector region 143*b*. The first detector region is positioned to receive radiation 142*a* reflected from the pellicle 19 and the second detector region 143*b* is positioned to receive radiation 142*b* reflected from the patterning device MA.

If the first detector region 143*a* detects a substantial reflection from the pellicle 19 (e.g. radiation is measured having an intensity or power above a threshold amount) then the controller 145 may determine that the pellicle 19 is in place and has not failed. If the first detector region 143*a* does not detect a substantial reflection from the pellicle (e.g. an intensity or power measured at the first detector region 143*a* is below a threshold amount) then the controller 145 may determine that no pellicle is present or that the pellicle is broken (and is not therefore present in the optical path of the radiation beam 142).

In order to provide a comparison to radiation measured at the first detector region 143*a*, radiation may also be measured at the second detector region 143*b*. Radiation measured at the second detector region 143*b* may, for example, be used to verify the presence of the patterning device MA and/or to verify that the patterning device MA and/or the pellicle are correctly aligned in order to detect the presence or absence of a pellicle 19. For example, if no substantial reflection of radiation from the patterning device MA is measured at the second detector region 143*b*, then this may indicate that the pellicle failure detection apparatus 140 is not correctly positioned and/or aligned in order to detect the presence or absence of a pellicle.

In the event that the pellicle failure detection apparatus 140 is correctly positioned and aligned in order to detect the presence or absence of a pellicle 19 and the pellicle were to break, then the power and/or intensity of radiation measured at the second detector region 143*b* may reduce. When a pellicle 19 is present in the optical path of the radiation 142*b* reflected from the patterned surface 24 then a portion of the radiation may be absorbed by the pellicle 19 (as well as being reflected by the pellicle 19), thereby reducing the power of radiation incident on the second detector region 143*b*. For example, approximately 10-20% of EUV radiation incident on a pellicle 19 may be absorbed by the pellicle on each passage through the pellicle 19. In the event that the pellicle 19 breaks and is no longer present in the optical path of the radiation beam 142, radiation will no longer be absorbed by the pellicle 19. The power of radiation incident on the second detector region 143*b* will therefore increase. In some embodiments, the controller 145 may use a reduction in power of radiation incident on the second detector region 143*b* to detect that the pellicle 19 has failed.

In the embodiment shown in FIG. 18, the radiation sensor 143 comprises a first sensor region 143*a* configured to detect radiation 142*a* reflected from the pellicle 19 and a second detector region 143*b* configured to detect radiation 142*b* reflected from the patterning device MA. In other embodiments, the radiation sensor 143 may take other forms. For example, in some embodiments the second detector region 143*b* may be omitted. In such embodiments, measurements made by a first detector region 142*a* may alone be used to determine whether or not a pellicle 19 is present or has failed.

In general, any sensor may be used which is arranged to detect a portion 142*a* of the radiation beam 142 which is reflected from the pellicle 19. As is shown in the embodiment of FIG. 18, the sensor 143 may be further configured to detect a portion 142*b* of the radiation beam 142, which is reflected from the patterning device MA. Since the radiation beam is incident on the pellicle at a non-normal angle of incidence, the portion 142*b* of the radiation beam 142 which is reflected from the patterning device MA is incident on the sensor 143 at a different position to the portion 142*a* of the radiation beam 142 reflected from the patterning device MA.

As has been described above a pellicle 19 is placed on a pellicle frame 17 such that there is an initial tension in the pellicle 19. In the event that the pellicle 19 breaks, the initial tension in the pellicle may cause the pellicle to be removed from substantially the entire region bounded by the pellicle frame 17. For example, after breakage the pellicle 19 may roll up on itself and/or become disconnected from the frame 17. Breakage of the pellicle 19 may therefore be detected by monitoring the pellicle 19 at any position on the pellicle 19. In some embodiments a single pellicle failure detection apparatus may be used to determine failure of the pellicle 19 at any position on the pellicle 19. In other embodiments a plurality of pellicle failure detection apparatuses may be provided to monitor different portions of the pellicle 19.

In the embodiment shown in FIG. 18, the controller 145 is shown as being a separate component to the sensor 143. In other embodiments the controller 145 may form part of the sensor 143 or may form part of another component.

In the embodiment shown in FIG. 18, the sensor 143 is arranged to detect specular reflections of the radiation beam 142 from the pellicle 19. Accordingly, the radiation source 141 is arranged to illuminate the pellicle 19 at a non-normal angle of incidence such that specular reflection 142*a* from the pellicle 19 is in a different position to specular reflection from the patterning device MA.

In some embodiments, a sensor 143 may be arranged to detect diffuse reflection from the pellicle 19. Similarly to the methods described above, detection of diffuse reflection may be used to detect whether or not the pellicle 19 has failed. In such embodiments, the radiation source 141 may be arranged to illuminate the pellicle 19 at a non-normal angle of incidence or may be arranged to illuminate the pellicle at normal incidence. The angular profile of diffuse reflection from the pellicle 19 may be different to the angular profile of diffuse reflection from the patterning device. Consequently, measurements of diffuse reflection may be used to differentiate reflections from the pellicle 19 from reflections from the patterning device MA, in embodiments in which the radiation source SO illuminates the pellicle 19 at a normal angle of incidence.

A pellicle failure detection apparatus 140 (such as the pellicle detection apparatus described above with reference to FIG. 18) may be used at any stage of a process for handling and using a patterning device MA protected by a pellicle 19. For example, a pellicle failure detection apparatus 140 may be used in a load lock stage of a lithographic apparatus. A load lock stage may be used to transfer a patterning device MA protected by a pellicle 19 into or out of a lithographic apparatus. For example, a patterning device MA may be brought from atmospheric pressure conditions outside of the lithographic apparatus and placed inside a load lock. The load lock may be pumped down to vacuum pressure conditions with the patterning device MA inside the load lock, in preparation for use of the patterning device MA inside the lithographic apparatus. The patterning device MA may then be transferred from the load lock into the lithographic apparatus for use in a lithographic process.

In some embodiments a pellicle failure detection apparatus 140 may be located in a load lock stage of a lithographic apparatus. The pellicle failure detection apparatus 140 may be used to check a pellicle prior to a patterning device MA and pellicle being loaded into the lithographic apparatus for use. If the pellicle failure detection apparatus 140 detects that a pellicle has failed, then the patterning device MA may not be loaded into the lithographic apparatus and may not be used in the lithographic apparatus. Checking a pellicle prior to loading a patterning device MA into a lithographic apparatus may prevent a broken pellicle from entering a lithographic apparatus. Advantageously this may prevent pellicle debris from entering a lithographic apparatus and contaminating the lithographic apparatus.

A patterning device MA and a pellicle 19 protecting the patterning device MA, may be transported in a protective pod (which may be referred to as a reticle pod). For example, a patterning device may be loaded into a lithographic apparatus (e.g. through a load lock) whilst situated inside a protective casing. The patterning device MA may then be removed from the protective casing for use in a lithographic process. The protective casing may, for example, comprise inner and outer compartments which may be referred to as inner and outer pods, the inner pod being situated within the outer pod.

FIG. 19 is a schematic illustration of a portion of a protective casing 147 in which a patterning device MA and a pellicle assembly 15 are situated. The pellicle assembly 15 comprises a pellicle 19 and a pellicle frame 17. Also shown in FIG. 19 is a pellicle failure detection apparatus 140 which may be used to monitor the pellicle 19 for failure whilst the patterning device MA and the pellicle assembly are situated inside the protective casing 147. In order to facilitate monitoring of the pellicle 19, whilst it is situated inside the protective casing 147, the protective casing 147 is provided with a first transparent window 149a. The first transparent window 149a transmits at least a portion of the radiation beam 142 and the reflected portions 142a, 142b of the radiation beam 142.

In the embodiment shown in FIG. 19, the protective casing 147 is further provided with a second transparent window 149b. The second transparent window 149b may be used to monitor a further aspect of the pellicle assembly 15 and/or the patterning device MA. For example, in the embodiment which is shown in FIG. 19 a monitoring device 240 is situated to monitor for the presence of a pellicle frame 17.

The monitoring device 240 uses a similar principle to the pellicle failure detection apparatus 140 and comprises a radiation source 241 and a radiation sensor 243. The radiation source is configured to illuminate the pellicle frame 17 at a non-normal angle of incidence with a radiation beam 242. The radiation sensor 243 is configured to receive and measure a portion 242a of the radiation beam 242 which is reflected from the pellicle frame 17. The radiation sensor 243 may determine whether or not a pellicle frame 17 is present based upon measurements of reflected radiation 242a made by the sensor 243. For example, if the power or intensity of radiation which is measured by the radiation sensor 243 exceeds a threshold value then it may be determined that a pellicle frame 17 is present. If the power or intensity of radiation which is measured by the radiation sensor 243 is below a threshold value, then it may be determined that no pellicle frame 17 is present.

The monitoring device 240 may be used to distinguish between patterning devices MA which are intended to be protected by a pellicle and patterning devices MA which are not intended to be protected by a pellicle. For example, if the monitoring device 240 determines that a pellicle frame 17 is present on a patterning device, it may be deduced that the patterning device is intended to be protected by a pellicle. If the monitoring device 240 determines that there is no pellicle frame 17 in place, then it may be deduced that the patterning device MA is not intended to be protected by a pellicle. As was described above, the pellicle failure detection apparatus 140 may determine whether an intact pellicle 19 is protecting the patterning device MA.

In some embodiments, whether or not a patterning device is intended to be protected by a pellicle may be detected by other means. For example, a protective casing 147 in which a patterning device MA is situated may differ depending on whether or not the patterning device is intended to be protected by a pellicle. One or more features of the protective casing may therefore be monitored in order to determine whether or not the patterning device MA is intended to be protected by a pellicle. For example, in some embodiments a protective casing 147 which is designed for use with a patterning device MA which is to be protected by a pellicle 19, may include a recess for accommodating a pellicle frame 17 and a pellicle 19. A protective casing 147 which is designed for use with a patterning device MA, which is not to be protected by a pellicle 19 may not include a recess for accommodating a pellicle frame 17 and a pellicle. In such embodiments a monitoring device 240 may be configured to detect the presence or absence of a recess in a protective casing 147. The presence or absence of a recess in the protective casing 147 may indicate whether the protective casing is transporting a patterning device MA which is intended to be protected by a pellicle 19 or a patterning device MA which is not intended to be protected by a pellicle 19.

Whilst the use of a pellicle failure detection apparatus 140 and/or a monitoring device 240 have been described above in a load lock stage, a pellicle failure detection apparatus 140 and/or a monitoring device may be used at other locations. For example, they may be used in a patterning device MA handling stage of a lithographic apparatus at which a patterning device MA is prepared for use in a lithographic process. In some embodiments a plurality of pellicle failure detection apparatuses 140 and/or monitoring devices 240 may be used at a plurality of different locations.

Embodiments have been described above in which a pellicle failure detection apparatus is used to detect failure of a pellicle. In some embodiments, an optical apparatus may be used to measure the position of one or more regions of the pellicle during a time at which the pellicle is subjected to a pressure difference. As was described above, a patterning device and a pellicle may be pumped down to vacuum pressure conditions (e.g. in a load lock stage) as part of a process of loading a patterning device into a lithographic apparatus. A patterning device and a pellicle may be subjected to increases in pressure as part of a process of unloading a patterning device from a lithographic apparatus. For example, a patterning device may be positioned in a load lock stage which is vented to atmospheric pressure prior to the patterning device being unloaded from the load lock stage.

As a patterning device and a pellicle are subjected to changing pressure conditions, a pressure difference may occur across the pellicle. For example, the pressure in the volume in between the patterning device and the pellicle may change at a slower rate than the pressure outside of this volume, thereby resulting in a pressure difference across the pellicle. A pressure difference across a pellicle may exert a force on the pellicle which acts to bend the pellicle. For example, the pellicle may be bent towards the patterning device or may be bent away from the patterning device. Bending of the pellicle may result in damage to the pellicle and/or breakage of the pellicle. For example, the pellicle may be bent to such an extent that it comes into contact with the patterning device and/or a protective casing in which the patterning device and pellicle may be contained (such as the protective casing 147 which is shown in FIG. 19). Contact between the pellicle and another component may cause damage to the pellicle and may cause the pellicle to break.

In order to avoid damage to a pellicle, the rate at which pressure conditions are changed (e.g. during a pump-down or vent procedure) may be limited so as to ensure that any pressure difference across the pellicle is kept within safe thresholds, at which the pellicle is not damaged. This may be achieved, for example, by measuring the position of one or more regions of the pellicle during any pressure changes and adjusting the rate at which the pressure is changed in response to the measurements. For example, the position of a substantially central portion of the pellicle may be measured. If it is detected that the central portion of the pellicle is too close to the patterning device and/or too far away from the patterning device, then the rate of change of the pressure to which the patterning device is subjected may be reduced. If the position of the pellicle is detected to be well within safe limits (i.e. not too close to the patterning device or too far from the patterning device) then the rate of change of pressure may be increased so as to decrease the time required to complete a pump-down and/or venting procedure.

In general, a lithographic apparatus may be provided with a load stage for a lithographic apparatus, the load stage comprising a chamber configured to receive a patterning device protected by a pellicle, a sensor apparatus configured to measure the position of at least a portion of a pellicle situated in the chamber and a pressure changing apparatus configured to change the pressure inside the chamber. The pressure changing apparatus may be configured to control the rate at which the pressure inside the chamber is changed in response to the measurements of the positions of at least a portion of the pellicle. The pressure changing apparatus may, for example, be configured to reduce the rate at which the pressure inside the chamber is changed in response to measurements indicating that the position of the pellicle lies outside a desired range of the position of the pellicle. The desired range of the position of the pellicle may for example, lie between a minimum distance from a patterning device and a maximum distance from the patterning device. That is if the pellicle gets too close to the patterning device or too far away from the patterning device, then the rate of pressure change may be decreased.

Controlling the rate of change of pressure to which a patterning device and pellicle are subjected in response to measurements of the position of the pellicle, may advantageously allow the time required for a pump-down and/or venting procedure to be reduced, whilst simultaneously ensuring that the rate of change pressure is kept within safe limits.

In alternative embodiments, the rate of pressure change which a patterning device and pellicle may be subjected to during a pump-down and/or venting procedure may be modelled. For example, the response of a pellicle during a pump-down and/or venting procedure may be modelled at a number of different rates of pressure change. This may allow safe rates of pressure change, which do not cause damage to the pellicle, to be determined. For example, a maximum rate of pressure change to which a patterning device and pellicle may be subjected without causing damage to the pellicle may be determined by modelling.

However, modelling results may have associated uncertainties and may not accurately predict the behavior of a pellicle. For example, mechanical properties of a pellicle may be different for different pellicles and in practice may be different to mechanical properties which are input to a model. The behavior of a pellicle may therefore vary from modelling results. In order to account for modelling uncertainties, the rate of pressure change which is used in practice may be substantially less than a maximum safe rate of pressure change determined using a modelling process. That is, the rate of pressure change which is used in a pump-down and/or venting process may be reduced below a theoretically safe rate of pressure change (as determined as a result of a modelling process) in order to reduce the risk of causing damage to the pellicle.

One consequence of modelling uncertainties may therefore be that a rate of pressure change which is used in practice may be substantially below a maximum rate of pressure change which could be used without causing damage to a pellicle. As a result, an amount of time taken to perform a pump-down and/or venting process may be increased. Consequently, the rate at which patterning devices are loaded into and removed from a lithographic apparatus is reduced, which may reduce a throughput of the lithographic apparatus.

As was described above, in some embodiments a rate of pressure change which a patterning device and pellicle are subjected to may be controlled in response to measurements of the position of the pellicle. By controlling a rate of pressure change in response to measurements of the pellicle (as opposed to modelling results) the rate of pressure change may be increased without risking damage to the pellicle. That is, the rate of pressure change which is used when relying on real-time measurements may greater than when relying on modelling results. Consequently, patterning devices may be loaded into and/or out of a lithographic apparatus at a faster rate by controlling a pump-down and/or venting process in response to measurements of the pellicle. This may advantageously allow for an increase in the throughput of the lithographic apparatus.

Pump-down and/or venting procedures may be carried out whilst a patterning device and pellicle are situated inside a protective casing (e.g. the protective casing 147 which is shown in FIG. 19). As was described above with reference to FIG. 19, the protective casing 147 may include one or more transparent windows 149a, 149b.

A transparent window 149a, 149b in the protective casing may allow for optical measurements of a pellicle in order to determine the position of the pellicle. For example, a sensor similar to the pellicle failure detection apparatus 140 shown in FIG. 19 may be used to determine the position of a region of the pellicle 19. The pellicle failure detection apparatus 140 shown in FIG. 19 includes a radiation source 141, a radiation sensor 143 and a controller 145. The radiation source 141 illuminates a portion of a pellicle 19 with a radiation beam 142 at a non-normal angle of incidence. Consequently, the position of a portion 142a of the radiation beam 142 which is reflected from the pellicle 19 depends on the position of the illuminated portion of the pellicle 19. For example, if the illuminated portion of the pellicle 19 moves towards or away from the patterning device MA, then the position at which the reflected portion 142a is incident on the radiation sensor 143 may change.

The radiation sensor 143 may be operable to detect the position at which a reflected portion 142a is incident on the radiation sensor 143. For example, the radiation sensor 143 may comprise a plurality of different detector regions located at different positions on the radiation sensor 143. The plurality of detector regions may, for example, be arranged as an array of detector regions (e.g. a CCD array or a CMOS array). The controller 145 may receive measurements made by the radiation sensor 143 and may determine, from the measurements, the position of the reflected portion 142a on the radiation sensor 143. The controller 145 may further determine the position of the illuminated portion of the pellicle from the measurements. For example, the controller 145 may determine the distance of the illuminated portion of the pellicle 19 from the patterning device MA.

The radiation sensor 143 may additionally measure reflections of the radiation beam 142 from the transparent window 149a and/or the patterning device. The position of reflections from the transparent window 149a and/or the patterning device, on the radiation sensor 143 may serve as a reference measurement against which the position of reflections from the pellicle may be compared. For example, by comparing the positions of reflections from the pellicle to the positions of reflections from the transparent window 149a and/or the patterning device MA, the distance of the pellicle from the transparent window 149a and/or the patterning device MA may be determined.

In some embodiments a confocal imaging sensor may be used to determine the position of a portion of the pellicle. A confocal imaging sensor may include a radiation source configured to form a continuum of monochromatic images along an optical axis of the confocal imaging sensor. Reflections of the emitted radiation are imaged through a pinhole. A sensor may determine the wavelength of the imaged reflected radiation, where the wavelength depends on the location along the optical axis at which the imaged radiation is reflected. The wavelength of the imaged radiation is therefore indicative of the position of a reflective surface such as a pellicle. Using this principle, a confocal imaging sensor may be used to measure the position of an illuminated region of a pellicle.

In some embodiments, a confocal imaging sensor may be used to simultaneously determine the position of a plurality of reflecting surfaces. For example, a confocal imaging sensor may be used to determine the position of a transparent window 149a and/or a patterning device MA, whilst simultaneously determining the position of an illuminated portion of a pellicle. The determined position of the pellicle may, for example, be compared with a determined position of a patterning device and/or a transparent window so as to determine the distance of the pellicle from the transparent window and/or the patterning device MA. Other methods may be used to simultaneously measure the position of the pellicle and the position of a patterning device and/or a transparent window. For example, triangulation may be employed to simultaneously measure the position of the pellicle together with the position of the patterning device and/or the transparent window. The positions may be monitored simultaneously in the manner set out above in connection with FIG. 19.

As was described above, measurements of a position of a portion of a pellicle may be used to control a rate of pressure change which the pellicle is subjected to. The portion of the pellicle which is measured may, for example, be a substantially central portion of the pellicle. In some embodiments, the position of a plurality of portions of a pellicle may be measured (e.g. using multiple sensors). In some embodiments an optical sensor may be used to measure the position of a portion of the pellicle (for example, a sensor of the type described above with reference to FIG. 19). In general, any form of sensor may be used to measure the position of one or more portions of a pellicle.

The number of sensors in FIGS. 18 and 19 and their locations are shown for illustration purposes only. Additional sensors and locations with appropriate selection of wavelengths can be used with added functionality as desired or needed.

In some embodiments measurements of the position of one or more portions of a pellicle may additionally or alternatively be used as an indication of fatigue of a pellicle. For example, changes in position of a pellicle as a function of pressure may be measured during a plurality of different pump-down and/or venting procedures. If the position of the pellicle as a function of pressure is significantly different for different pump-down and/or venting procedures then this may be an indication that the mechanical properties of the pellicle have changed. This may, for example, be indicative of fatigue of the pellicle and may be used as a warning that a pellicle may be susceptible to further damage and breakage. Such a pellicle may subsequently be taken out of use to avoid further damage to the pellicle.

Figure 20:
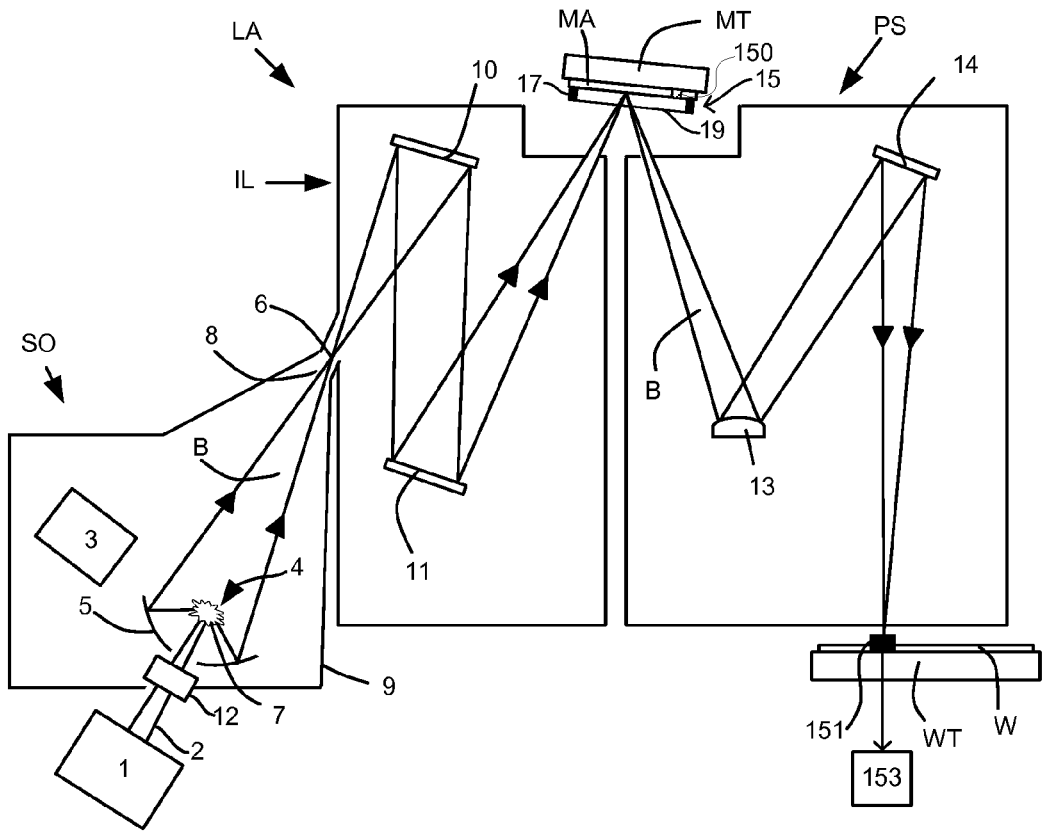
FIG. 20 is a schematic illustration of a lithographic apparatus including a pellicle failure detection apparatus according to an embodiment.

In some embodiments failure of a pellicle 19 may be detected through measurements of radiation which propagates through a pellicle 19. Such measurements may already be taken in a lithographic apparatus for other purposes. For example, measurements of radiation which has propagated through a pellicle 19 may be taken for alignment purposes and/or to measure wavefront aberrations. FIG. 20 is a schematic illustration of a lithographic apparatus LA which may be used to measure an alignment of components and/or wavefront aberrations. The lithographic apparatus LA which is shown in FIG. 20 is similar to the lithographic apparatus LA which is shown in FIG. 1. The same reference numerals are used in FIG. 20 to denote the same features described above with reference to FIG. 1. These features will not be described in any more detail with reference to FIG. 20.

In the embodiment shown in FIG. 20, the patterning device MA includes a fiducial 150. The fiducial 150 may be similar to the markers 81 shown in FIG. 5. The fiducial 150 may pattern a portion of the radiation beam B for the purposes of measurement. For example, the fiducial 150 may comprise a reflective diffraction grating, which when illuminated with the radiation beam B leads to the formation of a plurality of diffraction orders. In other embodiments, the fiducial 150 may not form part of the patterning device MA but may be positioned adjacent to the patterning device MA (e.g. on the support structure MT). Radiation which is reflected from the fiducial 150 passes through the pellicle 19.

Also shown in FIG. 20 is a sensor apparatus 151. The sensor apparatus 151 is configured to measure one or more properties of the radiation beam B which is output from the projection system PS. The sensor apparatus 151 may, for example, measure one or more properties of radiation which is reflected from the fiducial 150 (e.g. diffraction orders formed at the fiducial). Measurements made by the sensor apparatus 151 may be used to determine an alignment of the substrate table WT relative to the alignment of the patterning device MA and/or the support structure MT. For example, the sensor apparatus 151 may be used to determine the position of one or more features in the radiation beam B (e.g. one or more diffraction orders), which are formed by the fiducial 150. This may allow the alignment of the sensor apparatus 151 relative to the fiducial 150 to be determined.

In some embodiments a fiducial 150 and a sensor apparatus 151 may additionally or alternatively be used to determine wavefront aberrations which are introduced by the projection system PS. For example, the sensor apparatus 151 may be configured to perform sheering interferometry measurements. In such embodiments, the sensor apparatus 151 may comprise a transmissive diffraction grating and a radiation sensor disposed behind the transmissive diffraction grating. The radiation sensor may be configured to measure an interaction between diffraction orders formed at the fiducial 150 and diffraction orders formed at the transmissive diffraction grating at the sensor apparatus 151. The fiducial 150 and/or the sensor apparatus 151 may be moved relative to each other. For example, the sensor apparatus 151 may be stepped relative to the radiation beam B and measurements made at each stepping position. Measurements made by the sensor apparatus 151 may be fitted to a set of polynomials, such as the Zernike polynomials. Such a set of polynomials may characterize wavefront aberrations which are introduced by the projection system PS and may be used to adjust the projection system (e.g. to reduce the wavefront aberrations which are introduced by the projection system PS).

As was described above, measurements used to determine an alignment of components and/or wavefront aberrations may include measuring radiation which is transmitted through a pellicle 19. As was further described above, a pellicle 19 may absorb and/or reflect a portion of the radiation which is incident upon it. For example, approximately 10% of the power of an EUV radiation beam B may be absorbed by a pellicle 19 each time it passes through the pellicle 19. Since the radiation beam B passes through the pellicle 19 twice before reaching the radiation sensor 151, approximately 20% of the power of the EUV radiation beam B may be absorbed by the pellicle 19. Consequently, the intensity of radiation which is measured by the sensor apparatus 151 is reduced by the presence of a pellicle 19. In the event that the pellicle 19 were to break, then the pellicle 19 may be removed from the optical path of the radiation beam B. For example, the pellicle 19 may break into pieces and/or roll up such that it is no longer held across the patterning device MA by the pellicle frame 17. If the pellicle 19 is removed from the optical path of the radiation beam B then the intensity of radiation which reaches the sensor apparatus 151 will increase. This may be detected by an increase in the signal measured by the sensor apparatus 151. Such an increase may be used to detect failure of the pellicle 19.

In the embodiment shown in FIG. 20, the lithographic apparatus LA is further provided with a controller 153 in communication with the sensor apparatus 151. The controller 153 may receive a signal from the sensor apparatus 151 which is indicative of a measure of the intensity of radiation which is measured by the sensor apparatus 151. The controller 153 may detect an increase in the measure of the intensity of the radiation measured by the sensor apparatus 151 and may determine from the detected increase that the pellicle 19 has failed. The controller 153 may, for example, issue a signal and/or an alarm which indicates that failure of the pellicle 19 has been detected.

In the embodiment shown in FIG. 20, the radiation source SO, the sensor apparatus 151 and the controller 153 may be considered to form an example of a pellicle failure detection apparatus. The radiation source SO is configured to illuminate, with a radiation beam B, a portion of a patterning device MA protecting by a pellicle 19. The radiation beam B is transmitted through the pellicle 19. The sensor apparatus 151 is arranged to receive and measure at least a portion of the radiation beam B transmitted through the pellicle 19. The controller 153 is in communication with the sensor apparatus 151 and is configured to detect failure of the pellicle 19 when a measure of the intensity of the radiation received by the sensor apparatus increases. The measure of the intensity of the radiation may, for example, be the power of the radiation.

Figure 21:
FIG. 21 is a schematic illustration of a pellicle according to an embodiment, the pellicle including termination features.

Embodiments have been described above in which breakage of a pellicle is controlled and/or detected. In the above described embodiments it is generally assumed that if a pellicle begins to break then a crack in the pellicle will continue to propagate across the pellicle. However, in some embodiments a pellicle may include features configured to limit the propagation of a crack in a pellicle. FIG. 21 is a schematic illustration of a pellicle 19, which includes a plurality of termination features 301. For ease of illustration the termination features 301 are illustrated as being relatively large compared to the size of the pellicle 19. In practice the termination features 301 may be smaller than shown in FIG. 21, relative to the size of the pellicle 19. The pellicle 19 may additionally comprise more termination features 301 than are shown in FIG. 21.

The termination features 301 may be configured such that when the pellicle 19 is placed under tension (e.g. when suspended across a pellicle frame), the resulting stress in the termination features is less than the resulting stress in regions of the pellicle outside of the termination features. As will be explained in further detail below, the termination features 301 may, for example, comprise holes in the pellicle 19 (which therefore have no stress inside the termination features themselves). Alternatively, the termination features may comprise regions of the pellicle which are doped with a doping material.

Figure 22:
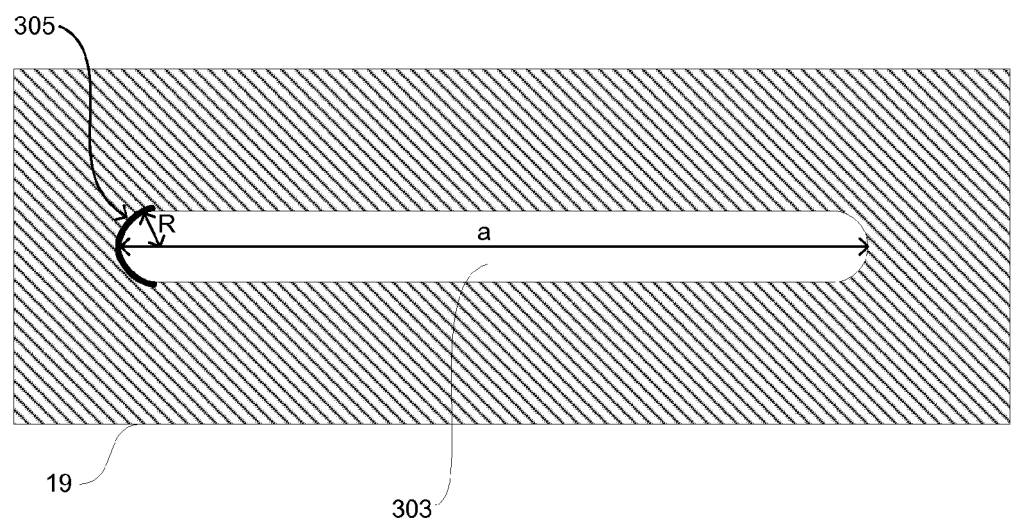
FIG. 22 is a schematic illustration of a crack in a pellicle.

FIG. 22 is a schematic illustration of a crack 303 formed in a pellicle 19. The crack 303 has a length a. The crack 303 has a tip 305 having a radius R. References herein to the crack tip 305 should be interpreted to refer to a region of the material of the pellicle which borders an end of the crack 303, as is indicated by the thick line labelled 305 in FIG. 22. References herein to stress at the crack tip should be interpreted to mean the stress experienced by the region of the material of the pellicle which borders an end of the crack 303.

When a crack 303 is first formed in a pellicle 19, the crack will continue to grow if the following condition is satisfied:

$$\sigma\sqrt{\pi a/2} > K_{IC} \quad (1)$$

where $\sigma$ is the stress at a tip of the crack, a is the length of the crack and $K_{IC}$ is the critical stress intensity factor or toughness of the pellicle material. The expression on the left-hand side of the condition given in (1) is approximately equivalent to a stress intensity factor $K_I$ at the tip of the crack. The critical stress intensity factor $K_{IC}$ is a constant property of the material of the pellicle.

The stress $\sigma$ in the pellicle material at the tip of the crack is typically initially (i.e. when the crack first forms) of the order of the stress caused by the pre-tension which the pellicle is placed under when it is attached to a pellicle frame. As a crack begins to propagate through a conventional pellicle, the stress $\sigma$ at the crack tip typically does not decrease. Instead the stress $\sigma$ at the crack tip increases with increasing crack length a. As a result, the condition in (1) will continue to be satisfied and the crack will continue to propagate until it reaches an edge of a suspended region of the pellicle 19 (i.e. until the crack reaches the pellicle frame).

In the embodiment of a pellicle which is shown in FIG. 21, the pellicle 19 includes termination features 301. The termination features 301 are configured such that in the event that a crack tip 305 propagates into the termination feature, the crack tip experiences a decrease in a stress $\sigma$ at the crack tip. The decrease in the stress $\sigma$ at the crack tip may decrease by an amount which is large enough such that the condition given in (1) no longer holds true. Consequently, propagation of the crack may be terminated and the crack will no longer continue to grow.

Figure 23:
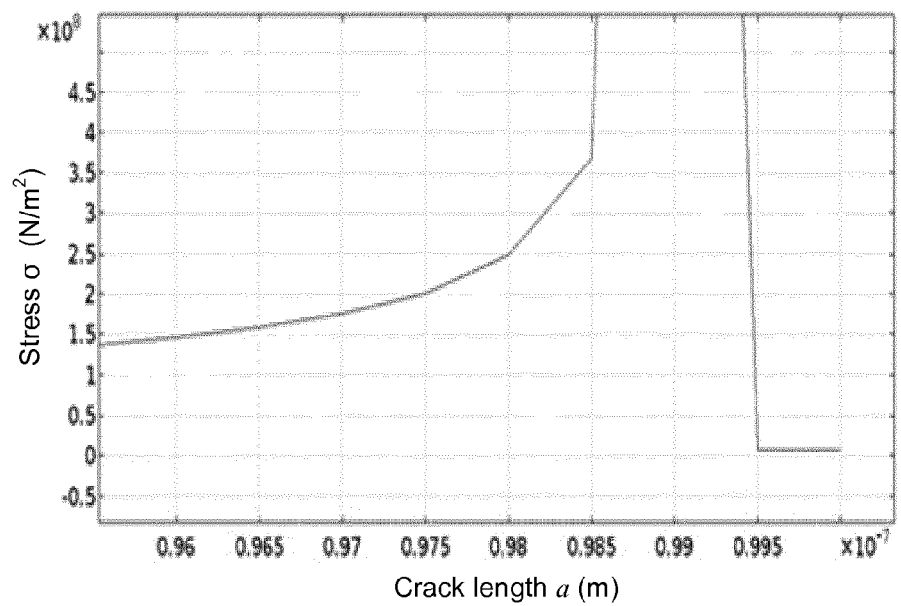
FIG. 23 is a schematic representation of a stress of at a tip of a crack in a pellicle as a function of the length of the crack.

FIG. 23 is a schematic representation of the stress σ at a crack tip, as a function of crack length a as a crack propagates towards and into a termination feature 301. The stress which is shown in FIG. 22 is the von Mises stress given in Newtons per meters squared. As the crack grows, the radius R of the crack tip remains substantially constant, whereas the length a of the crack increases. Consequently, the ratio a/R of the crack length a to the radius R of the crack tip increases and as a result the stress σ at the crack tip also increases with increasing crack length a.

An initial increase in the stress σ with increasing crack length a can be seen in FIG. 22. As the crack approaches a termination feature 301, the rate of increase of the stress σ increases until it tends to infinity. This is because in a region immediately surrounding a termination feature 301, the stress may be higher than in the remainder of the pellicle 19 and higher than in the termination feature 301 itself. A high stress region surrounding a termination feature may cause the crack to be drawn into the termination feature 301.

A termination feature 301 may have a radius which is greater than the radius R of the crack tip. As the crack enters the termination feature 301 the radius of the crack tip R becomes the radius of the termination feature 301 and therefore increases. Consequently, the ratio a/R decreases and so too does the stress σ at the crack tip. A large decrease in the stress σ can be seen in FIG. 23 at a crack length a of greater than about 0.985×10−7 m. The decrease in the stress σ means that the condition in (1) is no longer satisfied and the propagation of the crack is therefore terminated in the termination feature 301. In this way the crack is prevented from propagating further and the size of the crack is limited before it propagates across the entire pellicle 19.

As was described above a radius of the termination features 301 may be greater than a radius R of a propagating crack tip. A crack tip propagating through a pellicle 19 may have a radius R of the order of about 1-10 nanometers. The termination features 301 may therefore have a radius which is greater than about 10 nanometers. In some embodiments a radius of the termination features 301 may be larger than this, for example, the radius may be greater than about 20 nanometers, greater than about 50 nanometers or even greater than about 100 nanometers. A termination feature 301 having a radius which is greater than a radius R of a propagating crack tip advantageously ensures that as the crack tip enters the termination feature 301, the ratio a/R decreases, leading to a corresponding decrease in the stress σ at the crack tip.

In the embodiment shown in FIG. 21, the termination features 301 are each substantially circular. In other embodiments, the termination features 301 may have shapes other than substantially circular shapes. In general, the termination features 301 may have a lateral dimension, which is larger than the radius R of a crack tip. The lateral dimension may, for example, be a radius. The lateral dimension may be a width of the termination features 301. The lateral dimension may be greater than about 10 nanometers, greater than about 20 nanometers, greater than about 50 nanometers or even greater than about 100 nanometers.

As is shown in the embodiment of FIG. 21, the termination features 301 may be arranged in a substantially regular pattern. That is, a separation between adjacent termination features 301 may be substantially the same for several different adjacent sets of termination features 301. Arranging the termination features 301 in a substantially regular pattern may advantageously increase the likelihood of a crack propagating between two termination features and therefore being terminated at both of its ends before reaching the edge of the pellicle 19. This may serve to limit the extent of the crack and may advantageously prevent the crack from generating significant amounts of debris, which may lead to contamination. The termination features 301 therefore advantageously reduce contamination of surrounding components which may result from failure of the pellicle 19.

In some embodiments, some or all of the termination features 301 may comprise holes in the pellicle 19. The holes may, for example, be substantially circular holes. Circular holes are a relatively stable discontinuity in a material and may therefore reduce the changes of causing failure of the pellicle 19 themselves (when compared to holes having other shapes). Generally, a hole in a pellicle 19 causes a stress in the region of the pellicle 19 bordering the hole which is greater than a stress elsewhere in the pellicle 19. For example, the stress in the region of the pellicle 19 bordering the hole may be of the order of twice the stress elsewhere in the pellicle 19. However, the stress in the region of the pellicle 19 bordering a hole is typically less than the stress σ at a propagating crack tip.

Figure 24A:
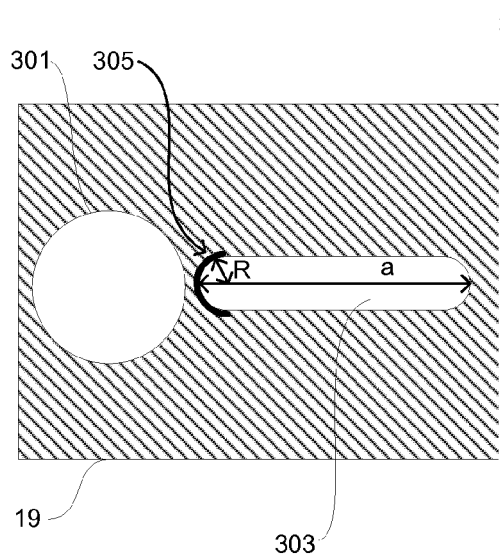
FIGS. 24A and 24B are schematic illustrations of stages of propagation of a crack in the pellicle.

FIG. 24A is a schematic illustration of a crack 303 which is propagating towards a termination feature 301 comprising a hole in the pellicle 19. Before the crack 303 reaches the termination feature 301, the crack 303 has a crack tip 305 having a radius R which is smaller than a radius of the termination feature 301. The stress σ at the crack tip is large enough that the condition in (1) is satisfied and the crack tip continues to propagate through the pellicle 19.

Figure 24B:
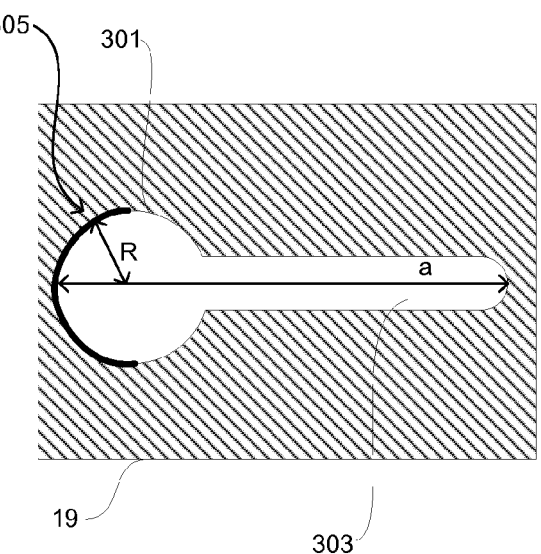

FIG. 24B is a schematic illustration of the crack 303 after it has reached the termination feature 305. Once the crack tip 305 enters the termination region 305, the radius R of the crack tip 305 becomes the radius of the termination feature 301 and the stress σ at the crack tip becomes the stress in the region of the pellicle 19 bordering the termination feature 301. As was described above, the stress in the region of the pellicle 19 bordering the termination feature 301 is typically larger than elsewhere in the pellicle (e.g. twice the stress elsewhere in the pellicle) but is typically smaller than the stress at a crack tip 305 when the crack tip 305 is propagating towards a termination feature 301 (as shown in FIG. 24A). Upon entering the termination feature, the stress σ at the crack tip therefore decreases, as was described above with reference to FIG. 22, and the propagation of the crack 303 is terminated.

In embodiments, which include termination features 301 comprising holes in the pellicle 19, the diameter of the holes (or other lateral dimension of the holes) may be smaller than a size of contamination particles which the pellicle 19 is configured to prevent from coming into contact with a patterning device MA. Termination features 301 comprising holes in the pellicle 19 may, for example, be formed by isotropically etching layers of the pellicle 19 so as to form holes in the pellicle 19. The size and/or shape of the holes may be controlled by controlling the etching process.

In some embodiments, some or all of the termination features 301 may comprise doped regions of the pellicle 19. Doped regions of the pellicle 19 are doped with a doping material. For example, a doping material such as boron may be used to dope regions of the pellicle. In some embodiments, a doping material other than boron may be used. In some embodiments, a doping material may be a p-type dopant. Additionally or alternatively a doping material may be an s-type dopant.

In some embodiments the pellicle may comprise silicon (e.g. a polysilicon film). In such embodiments the doping material may be a p-type dopant such as a dopant comprising one or more of boron, aluminum, nitrogen, gallium and/or indium. Additionally or alternatively, the doping material may be an n-type dopant such as a dopant comprising phosphorus, arsenic, antimony, bismuth and/or lithium.

In some embodiments the pellicle may comprise graphene. In such embodiments the doping material may comprise one or more of boron, nitrogen, titanium, chromium, platinum, cobalt, indium and/or sulfur. Additionally or alternatively the doping material may comprise one or more of organic molecules, acids, bases and/or halides. In some embodiments the doping material may comprise a transition metal such as copper, nickel, ruthenium, molybdenum and/or platinum.

Doped regions of the pellicle 19 may experience less stress than other non-doped regions of the pellicle. For example, when a pellicle 19 including doped regions is placed under tension (e.g. when it is suspended across a pellicle frame), the resulting stress in the doped regions may be lower than the resulting stress in regions of the pellicle 19 outside of the doped regions. In some embodiments doping regions of the pellicle 19 may lead to compressive stresses being introduced in the pellicle 19.

Since the stress in doped regions of the pellicle 19 is less than the other non-doped regions of the pellicle, in the event that a tip of a propagating crack enters a doped region, the stress $\sigma$ at the crack tip decreases as it enters the doped region. The decrease in stress $\sigma$ at the crack tip may be sufficient such that the condition in (1) above is no longer satisfied. Consequently, the propagation of the crack will be terminated in the doped region.

Regions of the pellicle may be selectively doped, for example, by first applying a mask to the pellicle 19. The mask may cover regions of the pellicle 19 other than regions to be doped such that only the regions to be doped are left exposed. The exposed regions may then be doped with a doping material. After the doping has been performed, the mask may be removed to expose the pellicle 19 including the doped regions. Since only portions of the pellicle 19 are doped, the mechanical properties of the pellicle 19 as a whole are substantially unaffected by the doped regions.

In some embodiments the doped regions may have a substantially circular shape. The mechanical properties of substantially circular doped regions may have similarities with the mechanical properties discussed above with reference to holes formed in a pellicle 19. By forming termination regions by doping, the doping process may be controlled in order to control the mechanical properties (e.g. the stress distribution which results from tensioning the pellicle) of the termination regions.

Figure 25:
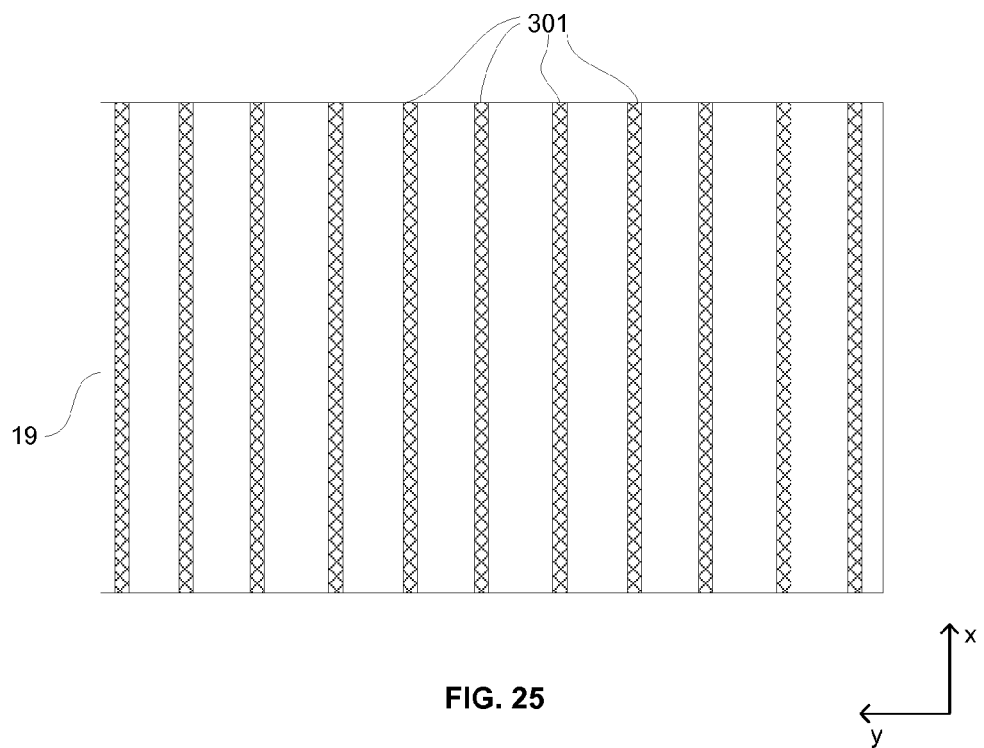
FIG. 25 is a schematic illustration of a pellicle according to an embodiment, the pellicle including termination features in the form of stripes of doped regions.

In some embodiments, doped regions may be formed in a manner other than a regular pattern of circularly shaped doped regions. FIG. 25 is a schematic illustration of a pellicle 19 including doped regions 301 in the form of a plurality of stripes of doped regions. In the embodiment of FIG. 25 the stripes extend across the entire extent of the pellicle 19 in the x-direction, which is shown in FIG. 25. In the embodiment of FIG. 25 the stripes of doped regions are substantially parallel to each other. By aligning the doped regions such that they are approximately or substantially parallel to each other, any crack which begins to propagate with a component in a direction perpendicular to the stripes (i.e. in the y-direction shown in FIG. 25) will reach a doped region 301 and will be terminated in the doped region 301. Furthermore, the stress distribution across the pellicle 19, which is caused by the striped doped regions 301 means that, in general, cracks will only develop and propagate in approximately the y-direction (or at least with a larger component in the y-direction than in the x-direction). The striped doped regions arranged as they are shown in FIG. 25 may therefore ensure that substantially all cracks which form in the pellicle, enter a doped region 301.

The stripes of doped regions 301 may have a lateral dimension which is greater than a radius R of a crack tip, which is terminated by the doped regions 301. The lateral dimension may be a width (in the y-direction shown in FIG. 25) of a doped region 301. The width of the doped regions 301 may, for example, be greater than about 10 nanometers, greater than about 20 nanometers, greater than about 50 nanometers or even greater than about 100 nanometers.

Figure 26:
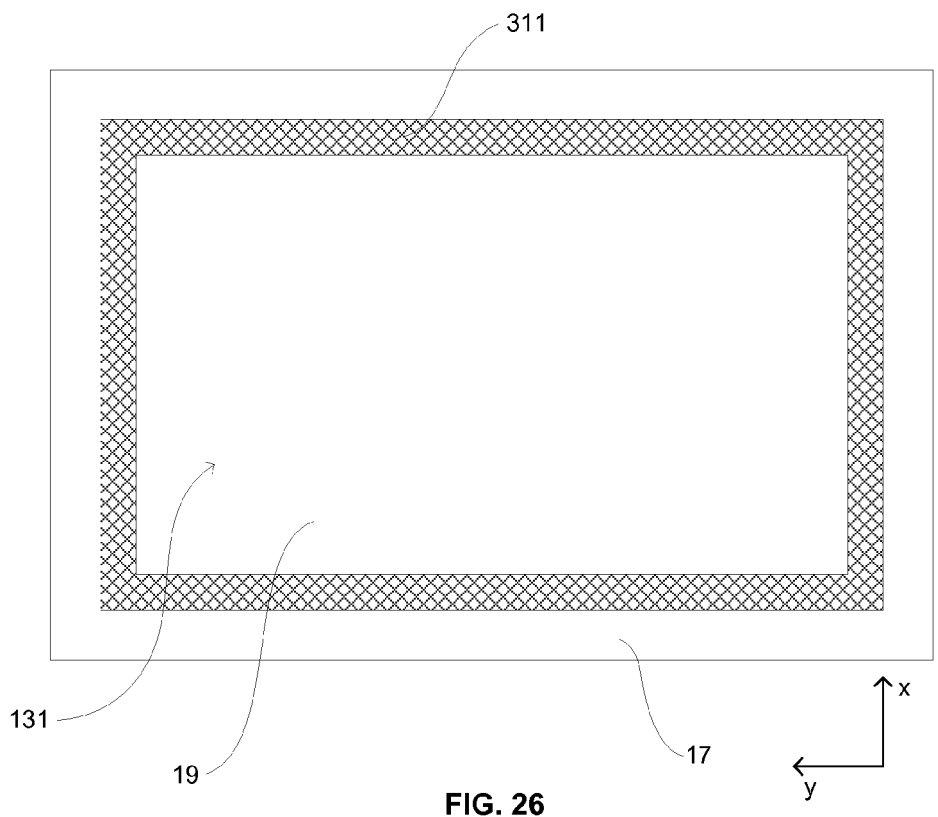
FIG. 26 is a schematic illustration of a pellicle assembly including a pellicle having a doped border portion.

In some embodiments, a doped region may be provided around a perimeter of a suspended region of the pellicle. FIG. 26 is a schematic illustration of an embodiment of a pellicle assembly, including a doped region provided around a perimeter of a suspended region of a pellicle. The pellicle assembly includes a pellicle 19 and a pellicle frame 17. The pellicle 19 is held by the pellicle frame 17. The pellicle frame 17 encloses a suspended (or unsupported) region 131 of the pellicle 19. The suspended region 131 of the pellicle 19 includes a border portion 311 arranged around the perimeter of the suspended region 131 of the pellicle 19. In the embodiment of FIG. 26, the border portion 311 is doped with a doping material (e.g. boron). As was described above, a doped region of a pellicle may experience less stress than other regions of the pellicle 19 outside of the doped region. The border portion may function as a termination feature, similar to the termination features described above.

Providing a doped region in the form of a border portion 311 may advantageously allow the stress in different directions across the pellicle to be controlled by controlling the doping of the border portion 311. For example, different amounts of dopant material may be provided at different positions on the border portion 311 in order to control the stress across the pellicle in the x and y-directions shown in FIG. 26.

In some embodiments, different forms of termination feature as described above with reference to FIGS. 21-27 may be combined in a single embodiment. For example, in some embodiments a doped border portion as shown in FIG. 26 may be combined with other termination features such as a pattern of circular doped regions and/or holes in the pellicle. In general, any of the different forms of termination feature described herein may be combined in a single embodiment.

In some embodiments, a pellicle may be subjected to a treatment process in order to increase the toughness of the pellicle prior to use of the pellicle. For example, all or part of a pellicle may be heated to a temperature which is greater than a Ductile to Brittle Transition Temperature (DBTT) of the pellicle, whilst being held at tension. As will be described in further detail below, heating all or part of a pellicle to a temperature which is greater than its DBTT whilst being held at tension may cause some regions of the pellicle to undergo plastic deformation. The plastic deformation may introduce compressive stress in regions in which defects are present in the pellicle. As has been described above, the presence of compressive stress in a pellicle may slow down or halt crack propagation through the pellicle.

As was described above, a pellicle may be formed from a plurality of layers of different materials. For example, a number of different layers may be deposited on top of each other in order to form a pellicle. During the manufacturing of a pellicle one or more layers may be deposited with defects in the layer due to imperfections in the deposition process. Defects in one or more layer may result in locally weak regions of the pellicle. Additionally or alternatively small cracks (e.g. having a size of the order of a few nanometers) may form in one or more layers of a pellicle. Such defects in a pellicle may cause local stress concentrations in the pellicle which may at a later point cause the pellicle to fatigue and/or fail. It may therefore be desirable to strengthen such defect regions of a pellicle in order to reduce the chances of causing pellicle failure.

In some situations, a ductile material may be strengthened by temporarily subjecting it to tension. The tension may result in a prolonged toughened state which has a greater resistance to crack growth in the material. For example, if a ductile pellicle including a small crack is held at tension the bulk of the material may undergo elastic deformation. However, in a region proximate to a tip of the crack, the pellicle may undergo plastic deformation, which may result in compressive stress being introduced at the tip of the crack. The compressive stress at the tip of the crack may slow down or prevent further propagation of the crack and thus may strengthen the pellicle against further damage. The resilience of the pellicle to fatigue will therefore be increased. This resilience of the pellicle to fatigue remains after the tension has been removed. The tension may for example be applied briefly, e.g. for less than a second. The tension may for example be applied as a shock load.

In general, a pellicle is formed of at least some layers which are relatively brittle. A pellicle at its normal operating temperature may not therefore exhibit sufficient ductility for the introduction of compressive stresses as described above. A pellicle may therefore first be heated to a temperature which is greater than the DBTT of the pellicle before subjecting the pellicle to a tension. Heating the pellicle to a temperature in excess of the DBTT increases the ductility of the pellicle. Whilst the pellicle has an increased ductility, the pellicle may be subjected to a high tension so as to cause regions of the pellicle in proximity to defects in the pellicle to undergo plastic deformation. As was described above, the plastic deformation may introduce regions of compressive stress to the pellicle which may toughen the pellicle against further crack growth.

Plastic deformation of regions of the pellicle should be kept to less than a critical plastic deformation. That is, the pellicle should not be subjected to tensions which cause stresses at crack tips in the pellicle to exceed the tensile strength of the pellicle. This ensures that plastic deformation occurs at the crack tips but that the cracks do not propagate through the pellicle.

Once the pellicle has been heated to a temperature which is greater than the DBTT of the pellicle, a tension may be applied to the pellicle, for example, by subjected the pellicle to a pressure difference across the pellicle. As was described above, a pressure difference may be established across the pellicle, if a patterning device and a pellicle are subjected to changing pressure conditions. For example, the pressure in the volume in between the patterning device and the pellicle may change at a slower rate than the pressure outside of this volume, thereby resulting in a pressure difference across the pellicle. A pressure difference across a pellicle may exert a force on the pellicle which acts to bend the pellicle. For example, the pellicle may be bent towards the patterning device or may be bent away from the patterning device. A force acting to bend the pellicle may increase the tension in the pellicle. As was described above, an increase in the tension in the pellicle whilst the temperature of the pellicle is greater than the DBTT may cause plastic deformation of regions of the pellicle. The plastic deformation may serve to introduce compressive stresses in the pellicle.

In some embodiments, a pellicle may be heated to a high enough temperature that the tension in a pellicle supported by a pellicle frame is sufficient to cause plastic deformation in some regions of the pellicle. In such embodiments it may not therefore be necessary to further increase the tension in the pellicle (e.g. by introducing a pressure difference across the pellicle). However, increasing the temperature of the entire pellicle to such an extent that no further increase in the tension is necessary to cause plastic deformation may serve to disadvantageously decrease the tension in the pellicle as a whole. Such heating may therefore be performed locally and may only be performed on limited regions of the pellicle.

In some embodiments, the corners of a suspended portion of the pellicle may be locally heated in order to reduce stress in the corners of the pellicle. Corners of suspended portions of the pellicle, where the pellicle meets a pellicle frame may typically be locations at which relatively high stress concentrations occur. By locally heating the corners to a temperature which is greater than a DBTT of the pellicle creep may occur in the corner regions. The creep may serve to locally reduce the stress in the pellicle in the heated regions.

A pellicle may be locally heated, for example, by illuminating one or more portions of the pellicle with radiation. For example, a laser may be used to illuminate one or more portions of a pellicle with a laser beam in order to heat the illuminated regions. Additionally or alternatively a pellicle may be locally heated by heating a pellicle frame which holds the pellicle in place. Heating the pellicle frame will cause regions of the pellicle in contact with or close to the pellicle frame to be heated. This may include corners of a suspended region of the pellicle. The remainder of the pellicle may undergo only limited or no heating and may remain below the DBTT of the pellicle. Consequently, the tension of the pellicle as a whole will not be reduced.

As was described above, one or more regions of a pellicle may be heated to a temperature which is greater than a DBTT of the pellicle. Heating of the pellicle may be performed such that the temperature of the pellicle does not exceed the melting point of the pellicle. For example, a pellicle comprising polysilicon materials may be heated to a temperature of about 1000° C. or more.

In some embodiments, a pellicle may be continuously heated whilst in operation in a lithographic apparatus. For example, a pellicle may be continuously heated such that the temperature of the pellicle remains above a threshold temperature. During lithographic exposures, each portion of a pellicle may be periodically exposed to radiation (e.g. EUV radiation) as radiation is scanned over a patterning device. A pellicle may absorb a portion of the radiation which is incident upon it, thereby causing the temperature of the pellicle to increase. Due to the cyclic nature with which a pellicle is exposed to radiation, the temperature of the pellicle may undergo cyclical heating. That is, the pellicle is heated during exposure to radiation and cools down in between being exposed to radiation.

In a lithographic apparatus the environment in which a pattering device and pellicle is typically pumped to vacuum pressure conditions. However, the environment may still include some gases such as water vapor. Some water vapor may condense on to a pellicle leading to the presence of water on the pellicle. Water in contact with a pellicle may lead to oxidation of the pellicle. Oxygen has a low transmissivity to EUV radiation. Oxidation of a pellicle therefore leads to a decrease in the transmissivity of the pellicle at EUV wavelengths.

Water may only condense on a pellicle at times at which the pellicle drops below a threshold temperature. For example, water may condense onto a pellicle which undergoes cyclic heating at times when the pellicle is not exposed to radiation (and is heated by the radiation). At times at which the pellicle is exposed to radiation the temperature of the pellicle may be sufficient to prevent substantial condensation of water on to the pellicle. Condensation of water onto a pellicle may therefore be reduced and/or prevented by heating the pellicle in between exposures to radiation, such that the temperature of the pellicle does not drop to a temperature at which substantial condensation of water may occur. For example, a pellicle may be continuously heated whilst in use such that the temperature of the pellicle does not drop below a threshold temperature. The threshold temperature may be a temperature at which no substantial condensation of water onto the pellicle occurs. The threshold temperature may, for example, be about 120° C.

Reducing and/or preventing condensation of water onto a pellicle by heating of the pellicle reduces oxidation of the pellicle (due to the lack of presence of water on the pellicle). Reducing oxidation of the pellicle advantageously reduces any reduction in EUV transmissivity of the pellicle due to oxidation.

A pellicle may be heated, for example, through resistive heating. As was described above, a pellicle may include at least one layer which is electrically conductive. Electrical connections may be made to the one or more electrically conductive layers and an electrical current passed through an electrically conductive layer such that resistive heating of the layer occurs.

In general, heating a pellicle may reduce the lifetime of the pellicle (e.g. due to causing fatigue of the pellicle). However, resistive heating of a pellicle so as to reduce oxidation of the pellicle may cause the pellicle to absorb a relatively low amount of power when compared to the power absorbed due to exposure to EUV radiation. For example, in some embodiments, a pellicle may absorb approximately 4 W cm$^{-2}$ due to exposure to EUV radiation. By comparison resistive heating of a pellicle to ensure that the pellicle remains above a threshold temperature of approximately 120° C. may only lead to power absorption of about 0.1 W cm$^{-2}$. Resistive heating may therefore contribute a relatively small amount of additional absorbed power and may not significantly increase fatigue of the pellicle.

As was described above, a pellicle may be heated through resistive heating. In order to heat a pellicle a current source may be provide as part of a pellicle assembly. According to some embodiments, a pellicle assembly may comprise, a frame configured to support a pellicle and a pellicle attached to the frame, wherein the pellicle comprises at least one electrically conductive layer. The pellicle assembly may further comprise a current source connected across the at least one electrically conductive layer and configured to generate an electrical current through the at least one electrically conductive layer. The current source may be configured to generate a current which heats the pellicle through resistive heating such that the temperature of the pellicle is greater than a threshold temperature. The threshold temperature may be about 120 degrees Celsius or more. The current source may be configured to generate a substantially continuous current through the at least one electrically conductive layer.

It will be appreciated that an electrical current required to heat a pellicle to a threshold temperature may be different for different materials. For example, a current required to heat a pellicle to a threshold temperature may depend on the resistivity of the conducting material of the pellicle and on the thermal mass of the pellicle. A current required to heat a given pellicle to a threshold temperature may be easily computed and/or established through experimentation by a person having ordinary skill in the art.

As has been described in detail above a pellicle is typically placed on a pellicle frame such that the pellicle is held at an initial tension. The initial tension in the pellicle serves to reduce bending and deflection of the pellicle, when a pressure difference is established across the pellicle. For example, during loading and unloading of patterning devices from a lithographic apparatus a patterning device and pellicle may be exposed to changing pressure conditions. Changing pressure conditions may lead to a pressure difference being established across the pellicle. Holding the pellicle at an initial tension reduces bending and deflection of the pellicle which is caused by the pressure difference. For example, it may be desirable to place a pellicle under an initial tension such that the pellicle does not deflect by more than about 500 μm when subjected to pressure differences of up to about 2 Pascals. A high initial tension in the pellicle may therefor result in advantageous effects when a pellicle is subjected to changing pressure conditions (e.g. during loading and/or unloading of patterning devices from a lithographic apparatus).

During a lithographic exposure process, the pressure to which a pellicle is exposed may be substantially constant. The pressure on either side of the pellicle may therefore be substantially the same and no substantial pressure difference may exist across the pellicle. There may therefore be a reduced requirement to place a pellicle under tension whilst undergoing a lithographic exposure process.

During a lithographic exposure process, a given portion of the pellicle may be subjected to cyclical heating as EUV radiation is scanned across the pellicle. Cyclical heating of portions of the pellicle causes an increase in the stress in some portions of the pellicle and a decrease in the stress in other portions of the pellicle. Changes in the stress in the pellicle due to cyclic heating have been shown to cause fatigue in the pellicle. That is the tensile strength of the pellicle decreases with time. The rate at which a pellicle fatigues increases with increasing initial tension in the pellicle. The initial tension in the pellicle may therefore serve to increase the rate at which pellicle fatigue occurs and decrease the lifetime of the pellicle. A high initial tension in the pellicle may therefore result in disadvantageous effects during a lithographic exposure process.

As was described above a relatively high initial tension in a pellicle may be advantageous during loading and/or unloading of a patterning device but may be disadvantageous during lithographic exposures. Methods and apparatus are therefore proposed which serve to increase and/or decrease the tension in the pellicle. This allows e tension to be controlled based upon the situation of the pellicle. For example, the tension in the pellicle may be increased prior to loading and/or unloading a pellicle into a lithographic apparatus. The tension in the pellicle may be decreased prior to exposing the pellicle to EUV radiation during a lithographic exposure process.

Figure 27:
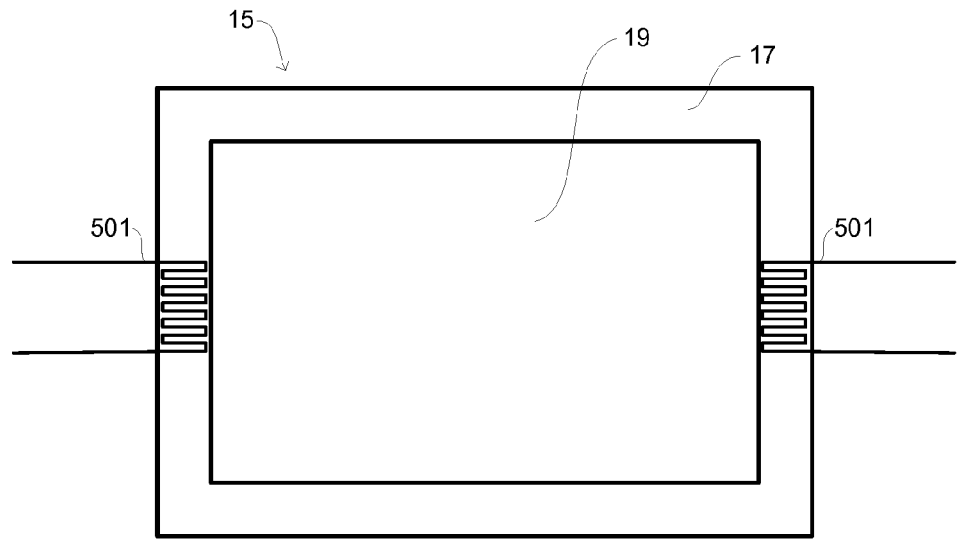
FIG. 27 is a schematic illustration of a pellicle assembly including heaters configured to heat a pellicle frame.

FIG. 27 is a schematic illustration of a pellicle assembly 15 configured to adjust the tension in a pellicle. The pellicle assembly 15 includes a pellicle 19 and a pellicle frame 17 configured to support the pellicle 19. The pellicle assembly 15 further comprises heaters 501. The heaters 501 are configured to heat the pellicle frame 17. The heaters may, for example, be configured to heat the pellicle frame 17 through resistive heating. The heaters 501 which are shown in FIG. 27 are thin film resistive heaters 501 positioned on the pellicle frame 17. Heating the pellicle frame 17 will cause the pellicle frame to expand, thereby stretching the frame and stretching the pellicle 19 across the frame 17. Stretching the pellicle 19 serves to increase the tension in the pellicle 19.

In the embodiment shown in FIG. 27, heaters 501 are only positioned on two opposite sides of the pellicle frame 17. The heaters 501 are thus only configured to increase the tension in the pellicle 19 in the y-direction which is shown in FIG. 27. As is shown in FIG. 27, the pellicle 19 is longer in the y-direction than in the x-direction. The tension in the y-direction may therefore be the dominant factor in determining how much the pellicle deflects when subjected to a pressure difference. In other embodiments, heaters 501 may be arranged on other sides of the pellicle frame 17. For example, heaters 501 may also be arranged to stretch the pellicle 19 in the x-direction.

In an embodiment (not depicted) a heater may be provided on each side of the pellicle frame 17. When a heater is provided on each side of the pellicle frame are used the pellicle expands isotropically. This is advantageous because it may reduce stress in the pellicle 19.

In some embodiments, a pellicle 19 may be placed on the pellicle frame 17 at an initial tension which is less than a desired tension for loading and unloading a patterning device into a lithographic apparatus. Prior to loading a patterning device into a lithographic apparatus, the heaters 501 may be switched on so as to heat the pellicle frame 17 and increase the tension in the pellicle 19. The tension in the pellicle 19 may, for example, be increased to a tension which resists deflection and bending of the pellicle when a pressure difference is established across the pellicle 19. The patterning device and the pellicle assembly 15 may then be pumped down to vacuum pressure conditions and loaded into a lithographic apparatus.

After having been loaded into a lithographic apparatus, the heaters 501 may be switched off and the pellicle frame 17 allowed to cool down. As the pellicle frame 17 cools down the tension in the pellicle 19 decreases. The patterning device and the pellicle may then be exposed to EUV radiation as part of a lithographic exposure process. Since the tension in the pellicle was reduced prior to exposure to EUV radiation the fatigue which results from exposure to EUV radiation is advantageously reduced.

Prior to unloading the patterning device and pellicle assembly from the lithographic apparatus, the heaters 501 may be turned on in order to heat the pellicle frame 17. Heating of the pellicle frame 17 stretches the pellicle frame and the pellicle 19 so as to increase the tension in the pellicle 19. The increased tension in the pellicle 19 allows the pellicle to resist deflection and bending when the pellicle 19 is vented to atmospheric pressure conditions during the unloading process.

In some embodiments, the pellicle frame 17 may be heated using a method other than resistive heating. For example, the pellicle frame 17 may be exposed to radiation which is absorbed by the pellicle frame 17 and heats the pellicle frame 17. In some embodiments, the pellicle frame 17 may be stretched using a method other than heating the pellicle frame 17. For example, one or more actuators (e.g. piezoelectric actuators) may be configured to apply a force to the frame so as to stretch the frame 17.

Figure 28A:
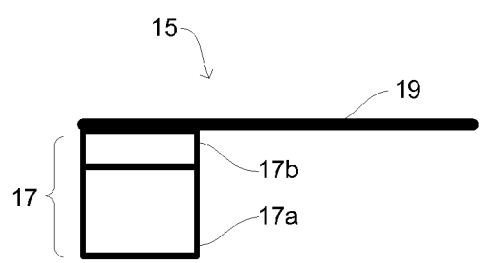
FIGS. 28A and 28B are schematic illustrations of portions of a pellicle assembly before and after a portion of a pellicle frame has been heated.
Figure 28B:
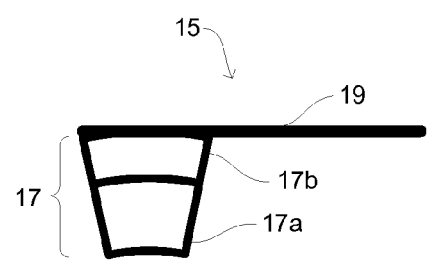

In some embodiments the tension in the pellicle 19 may be adjusted by bending the pellicle frame 17 as opposed to stretching the pellicle frame 17. FIGS. 28A and 28B are schematic illustrations of a portion of a pellicle assembly before (FIG. 28A) and after (FIG. 28B) bending a pellicle frame 17 so as to increase the tension in a pellicle 19. The pellicle frame 17 comprises a first layer 17a and a second layer 17b disposed on the first layer 17a. The pellicle 19 is attached to the second layer 17b.

The second layer 17b of the pellicle frame 17 has a higher Young's modulus and coefficient of thermal expansion than the first layer 17a of the pellicle frame 17. The second layer 17b may, for example, comprise ruthenium. When the pellicle frame 17 is heated, the second layer 17b expands at a faster rate than the first layer 17a. Consequently, the frame 17 is bent, as is shown in FIG. 28B. The bending of the frame 17 serves to pull the pellicle 19 so as to increase the tension in the pellicle 19.

The pellicle frame 17 may be heated so as to bend the pellicle frame 17 by, for example, resistive heating. For example, the second layer 17b may be electrically conductive and a current may be passed through the second layer 17b so as to heat the second layer 17b by resistive heating. Alternatively, the pellicle frame 17 may include a third electrically conducting layer through which a current is passed so as to heat the pellicle frame 17 by resistive heating. The third layer may, for example, be positioned in between the first layer 17a and the second layer 17b. It may be desirable to electrically isolate the pellicle 19 from the pellicle frame 17 such that the current does not extend into the pellicle 19. The pellicle 19 may, for example, be electrically isolated from a conducting layer by manufacturing etch lines in the top surface of the conducting layer.

In the arrangement shown in FIGS. 28A and 28B, the amount by which the pellicle frame bends when subjected to a given amount of heating may depend upon the relative thicknesses of the first and second layers 17a, 17b. The thicknesses of the first and second layers 17a, 17b may therefore be selected in order to provide a desired amount of bending for a given amount of heating.

Figure 29A:
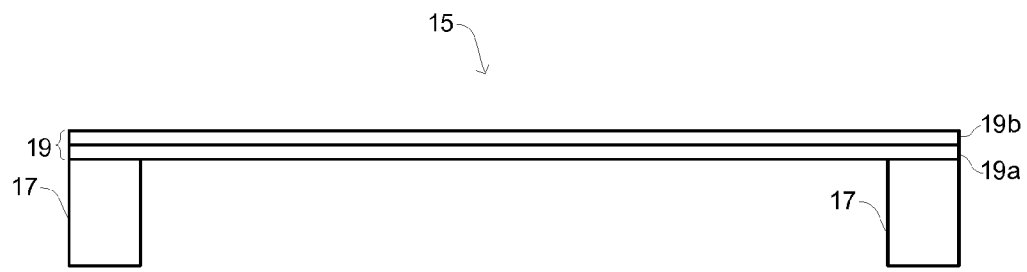
FIGS. 29A and 29B are schematic illustrations of a pellicle assembly before and after a pellicle has been heated.
Figure 29B:
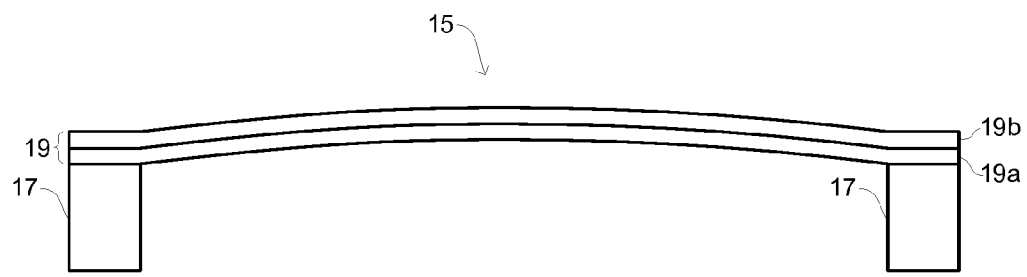

In some embodiments, the tension in the pellicle may be changed by bending the pellicle 19 itself rather than bending the pellicle frame 17. For example, the multi-layered structure described above with reference to FIGS. 28A and 28B may be used in a pellicle itself. FIGS. 29A and 29B are schematic illustrations of a pellicle assembly 15 according to an embodiment. The pellicle assembly 15 comprises a pellicle 19 supported by a pellicle frame 17. The pellicle 19 comprises at least a first layer 19a having a first Young's modulus and a first coefficient of thermal expansion and a second layer 19b having a second Young's modulus and a second coefficient of thermal expansion. The second Young's modulus is greater than the first Young's modulus and the second coefficient of thermal expansion is greater than the first coefficient of thermal expansion.

The second layer 19b may be positioned further from a patterning device than the first layer 19a. The pellicle 19 may include further layers other than the first and second layers 19a, 19b. For ease of illustration, no further layers are shown in FIGS. 29A and 29B.

FIG. 29A shows the pellicle 19 at an initial tension. The initial tension may be used, for example, during lithographic exposure processes. Prior to loading and/or unloading a patterning device and pellicle assembly to and/or from a lithographic apparatus, the tension in the pellicle 19 may be increased. In order to increase the tension in the pellicle 19, the pellicle 19 may be heated. For example, an electrical current may be passed through an electrically conductive layer of the pellicle (not shown in FIGS. 29A and 29B) so as to heat the pellicle through resistive heating. Additionally or alternatively, the pellicle 19 may be exposed to radiation which is absorbed by the pellicle and therefore serves to heat the pellicle.

FIG. 29B shows the pellicle assembly 15 after the pellicle 19 has been heated. Heating the pellicle 19 causes the second layer 19b to expand to a greater extent than the first layer 19a. This has the effect of bending the pellicle and increasing the tension in the pellicle. Consequently, the pellicle may better resist further bending when exposed to a pressure difference across the pellicle 19. In order to decrease the tension in the pellicle 19 (e.g. for use during a lithographic exposure) the pellicle 19 is allowed to cool such that it relaxes back into the position shown in FIG. 29A.

Figure 30:
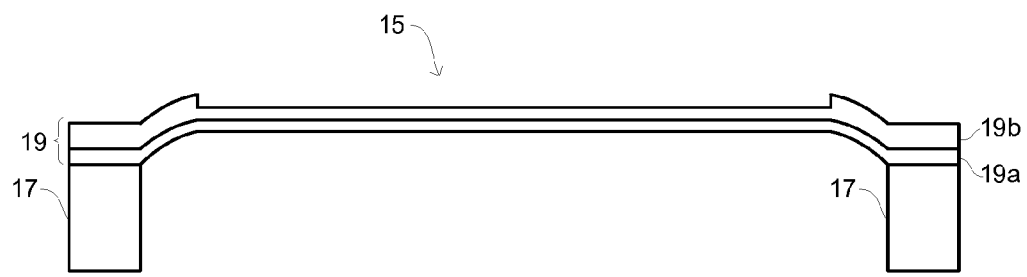
FIG. 30 is a schematic illustration of a pellicle assembly according to an alternative embodiment after a pellicle has been heated

In some embodiments, the pellicle 19 may be configured such that the stiffness of the pellicle is not uniform across the entire pellicle. FIG. 30 is a schematic illustration of a pellicle assembly 15 in which the stiffness of the pellicle in regions proximate to the edge of the pellicle 19. The pellicle assembly 15 which is shown in FIG. 30 is similar to the pellicle assembly 15 shown in FIGS. 29A and 29B and like components will not be described again in detail. In the embodiment of FIG. 30, the second layer 19b has an increased thickness in regions proximate to the edge of the pellicle 19. The region of the pellicle 19 which has an increased thickness may not cover an exposure field on a patterning device. The increased thickness of the pellicle 19 does not therefore affect the imaging performance of the pellicle.

In the embodiment of FIG. 30, the region of increased thickness of the pellicle 19 may be locally heated. By locally heating the region of increased thickness most of the bending of the pellicle 19 occurs in the regions of increased thickness (as is shown in FIG. 30). The main body of the pellicle is stretched by the bending of the regions of increased thickness and the tension in the pellicle is consequently increased. The region of the pellicle 19 which has an increased thickness also has an increased stiffness. This region is therefore well suited to withstanding the stress generated on the region by the bending of the pellicle 19.

The regions of increased thickness may be locally heated, for example, by placing heaters on the pellicle frame 17. The heaters will act to locally heat regions of the pellicle in proximity to the edge of the pellicle 19. The heaters may, for example, be resistive heaters.

In some embodiments, local heating of the pellicle may be configured to create desired stress distributions in the pellicle. This may allow non-uniform stress fields to be created in the pellicle. For example, local heating may be configured to reduce stress in one direction whilst maintaining stress in another direction. In general, local heating may be used to control stress distributions in the pellicle. This may, for example, allow stresses to be balanced so as to reduce wrinkling of the pellicle.

In the embodiment of FIG. 30, a region of the suspended portion of the pellicle 19 has an increased thickness. The increased thickness serves to increase the stiffness of the region. The increased stiffness of the pellicle has the consequence that the tension in the pellicle which is required to withstand pressure differences across the pellicle 19 is decreased. Advantageously, the tension in the pellicle may therefore be increased to a tension which is less than a tension used when no region of increased thickness is present.

In some embodiments, a transition between a region of increased thickness of the pellicle and the main body of the pellicle may be configured such that the thickness of the pellicle smoothly transitions between the regions (as opposed to the step change in thickness which is shown in FIG. 30). Such a transition may be formed, for example, by isotropically etching the pellicle during manufacturing of the pellicle. A smooth transition between regions of differing thickness may result in lower stress concentrations in the transition regions.

The methods and apparatus which have been described above for increasing stress tension in the pellicle may be used to introduce tension into a pellicle in materials in which it is difficult to introduce intrinsic tension. For example, in some embodiments a pellicle may comprise graphene. It is typically difficult to introduce tensions into a pellicle comprising graphene. The methods and apparatus described above may advantageously allow tension to be introduced to a pellicle comprising graphene.

Various embodiments have been described above in which tension in the pellicle is controlled. Apparatus which is configured to control the tension in a pellicle may be referred to as a tension controlling apparatus. A tension controlling apparatus may comprise a heater configured to heat a component of a pellicle assembly (e.g. the pellicle frame and/or the pellicle). A tension controlling apparatus may comprise one or more actuators configured to exert a force on a pellicle frame.

Various inventive aspects of a pellicle and a pellicle assembly have been described above and are shown in the figures in the context of specific embodiments. It will be appreciated that any of the described and/or illustrated aspects may be combined in a single embodiment. For example, one or more features of one embodiment may be combined with one or more features of another embodiment. It will further be appreciated that whilst some embodiments have been described that include more than one inventive aspect, embodiments that comprise only a single inventive aspect are also contemplated herein. In general, any of the features of any of the described embodiments may be used in isolation or may be used in any combination with any of the other features of the described embodiments.

Although specific reference may be made in this text to embodiments in the context of a lithographic apparatus, embodiments may be used in other apparatus. Embodiments may form part of a mask inspection apparatus, a metrology apparatus, or any apparatus that measures or processes an object such as a wafer (or other substrate) or mask (or other patterning device). These apparatuses may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin film magnetic heads, etc.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the clauses set out below.

This specification discloses one or more embodiments of features of the invention. The disclosed embodiment(s) merely exemplify the invention. The scope of the invention is not limited to the disclosed embodiment(s). The invention is defined by the clauses appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

It is to be appreciated that the Detailed Description section, and not the Summary and Abstract sections, is intended to be used to interpret the clauses. The Summary and Abstract sections may set forth one or more but not all exemplary embodiments of the present invention as contemplated by the inventor(s), and thus, are not intended to limit the present invention and the appended clauses in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and clauses and their equivalents.

1. A pellicle suitable for use with a patterning device for a lithographic apparatus, the pellicle comprising at least one breakage region which is configured to preferentially break, during normal use in a lithographic apparatus, prior to breakage of remaining regions of the pellicle.
2. The pellicle of clause 1, wherein the at least one breakage region comprises a region of the pellicle which has a reduced thickness when compared to surrounding regions of the pellicle.
3. The pellicle of clause 1 or 2, wherein the at least one breakage region comprises a region of the pellicle which has been exposed to radiation so as to structurally weaken the breakage region when compared to the remaining regions of the pellicle.
4. The pellicle of any preceding clause, wherein the at least one breakage region comprises a region of the pellicle in which one or more holes and/or cracks are formed.
5. The pellicle of any preceding clause, wherein the at least one breakage region comprises a region of the pellicle which has been exposed to a substance configured to structurally weaken the breakage region when compared to the remaining regions of the pellicle.
6. The pellicle of any preceding clause, further comprising a reinforced region positioned adjacent a breakage region, wherein the reinforced region has an increased thickness when compared to the remaining regions of the pellicle.
7. The pellicle of clause 6, wherein the reinforced region traces out a curved shape on the pellicle.
8. The pellicle of any preceding clause, wherein the at least one breakage region comprises a fracture line which is configured to preferentially break prior to breakage of remaining regions of the pellicle so as to form a crack in the pellicle along the fracture line.
9. The pellicle of any preceding clause, further comprising a sensor configured to monitor the at least one breakage region and detect breakage of the at least one breakage region.
10. A pellicle assembly comprising:
    the pellicle of any preceding clause; and
    a frame configured to support the pellicle;
    wherein the pellicle comprising a perimeter portion which is supported by the frame and an unsupported portion which is enclosed by the perimeter portion.
11. The pellicle assembly of clause 10, wherein the pellicle comprises the pellicle of clause 8 and wherein the fracture line extends between sections of the perimeter portion of the pellicle which is supported by the frame.
12. The pellicle assembly of clause 11, wherein the fracture line encloses a portion of the pellicle which is positioned at an edge of the unsupported portion.
13. The pellicle assembly of any of clauses 10-12 and clause 6 or 7 wherein part of the reinforced portion contacts the frame.
14. The pellicle assembly of any of clauses 10-13, wherein the at least one breakage region forms part of the perimeter portion of the pellicle which is supported by the frame.
15. A pellicle assembly suitable for use with a patterning device for a lithographic apparatus, the pellicle assembly comprising:
    a frame configured to support a pellicle; and
    a pellicle attached to the frame, wherein the pellicle comprises at least a first layer having a first tension and a second layer having a second tension wherein the first tension is higher than the second tension such that in the event of breakage of the pellicle the difference between the first and second tensions causes the pellicle to roll up.

16. The pellicle assembly of clause 15, wherein the pellicle further comprises at least one breakage region which is configured to preferentially break, during normal use in a lithographic apparatus, prior to breakage of remaining regions of the pellicle, the at least one breakage region being positioned such that breakage of the pellicle at the at least one breakage region ensures that the pellicle rolls up.
17. A pellicle suitable for use with a patterning device for a lithographic apparatus, the pellicle comprising:
at least one electrically conductive layer; and
a plurality of electrical contacts at which an electrical connection to the electrically conductive layer can be established, thereby allowing the electrical resistance of the electrically conductive layer between contacts to be measured.
18. A pellicle failure detection apparatus comprising:
the pellicle of clause 17; and
a sensor connected to at least two of the electrical contacts on the pellicle, the sensor being configured to measure the resistance between the electrical contacts.
19. A pellicle failure detection apparatus comprising a sensor assembly arranged to detect a change in a property associated with a pellicle situated on a pellicle frame, wherein a change in the property associated with the pellicle is indicative of damage to the pellicle.
20. The pellicle failure detection apparatus of clause 19, wherein the sensor assembly is configured to detect a change in optical transmission or optical reflection of radiation by the pellicle.
21. The pellicle failure detection apparatus of clause 20, wherein the sensor assembly comprises:
a radiation source configured to couple a radiation beam into the pellicle such that radiation is transmitted along the pellicle; and
a radiation sensor configured to receive radiation which is reflected back through the pellicle or to receive radiation which is transmitted through the pellicle, a change in the reflected or transmitted radiation received by the sensor being indicative of damage to the pellicle.
22. The pellicle failure detection apparatus of clause 19, wherein the sensor assembly is configured to detect a change in acoustic transmission or acoustic reflection of sound waves by the pellicle.
23. The pellicle failure detection apparatus of clause 22, wherein the sensor assembly comprises:
a transducer configured to generate sound waves in the pellicle; and
a sensor configured to receive sound waves reflected back through the pellicle or to receive sound waves transmitted through the pellicle, a change in the reflected or transmitted sound waves received by the sensor being indicative of damage to the pellicle.
24. The pellicle failure detection apparatus 20, wherein the sensor assembly comprises a stress sensor configured to measure a stress to which a pellicle is subjected.
25. The pellicle failure detection apparatus 20, wherein the sensor comprises a strain gauge configured to measure the strain which a pellicle undergoes.
26. A pellicle suitable for use with a patterning device for a lithographic apparatus, the pellicle comprising:
a first layer having a first ductility;
a second layer having a second ductility; and
a third layer having a third ductility, wherein the third layer is situated in between the first and second layers and wherein the third ductility is less than the first ductility and less than the second ductility.
27. A debris mitigation apparatus comprising a debris steering device arranged close to a pellicle for a lithographic apparatus, the debris steering device being configured to direct debris resulting from breakage of the pellicle in a preferred direction.
28. The debris mitigation apparatus of clause 27, further comprising a sensor configured to monitor a pellicle and detect breakage of the pellicle, wherein the debris steering device is configured to react to a detection of breakage of the pellicle and direct debris resulting from breakage of the pellicle in a preferred direction.
29. The debris mitigation apparatus of clause 28, wherein the debris steering device comprises:
an enclosed chamber positioned close to the pellicle wherein the inside of the chamber is held at a pressure which is lower than the pressure at which the pellicle is held; and
an actuator configured to open the chamber in reaction to a detection of breakage of the pellicle thereby causing the debris resulting from the broken pellicle to be sucked into the chamber.
30. The debris mitigation apparatus of clause 28, wherein the debris steering device comprises:
an enclosed chamber positioned close to the pellicle wherein the inside of the chamber is held at a pressure which is higher than the pressure at which the pellicle is held; and
an actuator configured to open the chamber in reaction to a detection of breakage of the pellicle thereby causing the debris resulting from the broken pellicle to be blown away from the chamber and in a preferential direction.
31. The debris mitigation apparatus of clause 27 or 28, wherein the debris steering device comprises an electrically charged surface positioned close to the pellicle such that in the event of breakage of the pellicle debris from the pellicle is directed towards the electrically charged surface by electrostatic attraction.
32. A debris mitigation apparatus comprising:
a sensor configured to monitor a pellicle held by a frame and detect damage to the pellicle; and
a tension controlling device configured to react to detection of damage to the pellicle and reduce the tension in the pellicle, thereby limiting further damage to the pellicle.
33. The debris mitigation apparatus of clause 32, wherein the tension controlling device comprises a plurality of actuators configured to compress a frame on which the pellicle is held, thereby reducing the tension in the pellicle which held by the frame.
34. The debris mitigation apparatus of clause 32, wherein the tension controlling device comprises a temperature controlling device configured to increase the temperature of the pellicle, thereby reducing the tension in the pellicle.
35. The debris mitigation apparatus of clause 34, wherein the temperature controlling device is configured to increase the temperature of the pellicle by resistive heating.
36. The debris mitigation apparatus of clause 34, wherein the temperature controlling device comprises a radiation source configured to illuminate all or part of the pellicle so as to increase the temperature of the pellicle.

37. A pellicle frame configured to support a pellicle around a perimeter portion of the pellicle so as to enclose a suspended region of the pellicle, wherein the pellicle frame comprises:
  a first pair of side portions positioned at opposite edges of the suspended region of the pellicle and extending along the edges of the suspended region of the pellicle in a first direction; and
  a second pair of side portions positioned at opposite edges of the suspended region of the pellicle and extending along the edges of the suspended region of the pellicle in a second direction, which is substantially perpendicular to the first direction;
  wherein the first pair of side portions are configured to have a compliance in the second direction which is greater than a compliance of the second pair of side portions in the first direction such that a pellicle supported by the pellicle frame has an initial tension in the second direction which is less than an initial tension of the pellicle in the first direction.
38. The pellicle frame of clause 37, wherein the first pair of side portions each have thicknesses in the second direction which are less than thicknesses of the second pair of side portions in the first direction.
39. The pellicle frame of clause 38, wherein the first pair of side portions each include slits which extend in the first direction along the first pair of side portions.
40. A pellicle failure detection apparatus comprising:
  a radiation source configured to illuminate, with a radiation beam, a portion of a pellicle arranged to protect a patterning device;
  a sensor arranged to detect a portion of the radiation beam reflected from the pellicle; and
  a controller in communication with the sensor and configured to detect failure of the pellicle from the detection of reflected radiation made by the sensor.
41. The pellicle failure detection apparatus of clause 40, wherein the radiation source is configured such that the radiation beam is incident on the pellicle at a non-normal angle of incidence.
42. The pellicle failure detection apparatus of clause 40 or 41, wherein the sensor is arranged to detect diffuse reflection of the radiation beam from the pellicle.
43. The pellicle failure detection apparatus of any of clauses 40 to 42, wherein the controller is configured to detect failure of the pellicle when a measure, made by the sensor, of the intensity of the portion of the radiation beam reflected from the pellicle falls below a threshold value.
44. The pellicle failure detection apparatus of any of clauses 40-43, wherein the sensor is further configured to detect a portion of the radiation beam reflected from the patterning device, the portion of the radiation beam reflected from the patterning device being incident on the sensor at a different position to the portion of the radiation beam reflected from the pellicle.
45. The pellicle failure detection apparatus of clause 44, wherein the sensor comprises a first sensor region configured to detect radiation reflected from the pellicle and a second sensor region configured to detect radiation reflected from the patterning device.
46. A pellicle failure detection apparatus comprising:
  a radiation source configured to illuminate, with a radiation beam, a portion of a patterning device protecting by a pellicle, wherein the radiation beam is transmitted through the pellicle;
  a sensor apparatus arranged to receive and measure at least a portion of the radiation beam transmitted through the pellicle
  a controller in communication with the sensor apparatus and configured to detect failure of the pellicle when a measure of the intensity of the radiation received by the sensor apparatus increases.
47. The pellicle failure detection apparatus of clause 46, wherein the patterning device includes a reflective fiducial and wherein the sensor apparatus is configured to measure a portion of the radiation beam which is reflected from the fiducial.
48. The pellicle failure detection apparatus of clause 47, wherein the sensor apparatus and the controller are further configured to determine an alignment of a feature formed in the portion of the radiation beam reflected from the fiducial.
49. The pellicle failure detection apparatus of clause 47 or 48, wherein the sensor apparatus and the controller are further configured to determine wavefront aberrations in the portion of the radiation beam reflected from the fiducial.
50. A pellicle suitable for use with a patterning device for a lithographic apparatus, the pellicle comprising a plurality of termination features, wherein the termination features are configured such that, in the event that a crack in the pellicle, having a crack tip, propagates into the termination feature, the crack tip experiences a decrease in a stress at the crack tip
51. The pellicle of clause 50, wherein the termination features are configured such when the pellicle is placed under tension the resulting stress in the termination features is less than the resulting stress in regions of the pellicle outside of the termination features.
52. The pellicle of clause 51, wherein the termination features are arranged in a substantially regular pattern.
53. The pellicle of any of clauses 50 to 52, wherein the termination features comprise holes formed in the pellicle.
54. The pellicle of clause 53, wherein the holes are substantially circular holes.
55. The pellicle of clause 53 or 54, wherein the holes have a lateral dimension which is greater than about 10 nanometers.
56. The pellicle of clause 55, wherein the holes have a lateral dimension which is greater than about 20 nanometers.
57. The pellicle of any of clauses 50-52, wherein the termination features comprise doped regions of the pellicle which are doped with a doping material.
58. The pellicle of clause 57, wherein the doping material comprises boron.
59. The pellicle of clauses 57 or 58, wherein the doped regions are substantially circular.
60. The pellicle of any of clauses 57 to 59, wherein the termination features comprise a plurality of stripes of doped regions which are doped with a doping material.
61. The pellicle of clause 60, wherein the stripes of doped regions are arranged substantially parallel to each other.
62. The pellicle of any of clauses 57-61, wherein the doped regions have a lateral dimension of greater than about 10 nanometers.
63. The pellicle of clause 62, wherein the doped regions have a lateral dimension which is greater than about 20 nanometers.
64. The pellicle of any of clauses 50-63, wherein the pellicle includes a termination feature comprising a border portion of the pellicle which is doped with a doping material, wherein the border portion is arranged around the perimeter of a suspended region of the pellicle, the suspended region being a region which is configured to be suspended across a pellicle frame.

65. A load stage for a lithographic apparatus, the load stage comprising:
    a chamber configured to receive a patterning device protected by a pellicle;
    a sensor apparatus configured to measure the position of at least a portion of the pellicle situated in the chamber; and
    a pressure changing apparatus configured to change the pressure inside the chamber, wherein the pressure changing apparatus is configured to control the rate at which the pressure inside the chamber is changed in response to the measurements of the position of at least a portion of the pellicle.

66. The load stage of clause 65, wherein the pressure changing apparatus is configured to reduce the rate at which the pressure inside the chamber is changed in response to measurements indicating that the position of the pellicle lies outside a desired range of the position of the pellicle.

67. The load stage of clause 66, wherein the desired range of the position of the pellicle lies between a minimum distance from a patterning device and a maximum distance from the patterning device.

68. The load stage of any of clauses 65-67, wherein the sensor apparatus comprises a radiation source configured to illuminate at least a portion of a pellicle with radiation and a radiation sensor arranged to receive and measure radiation reflected from the pellicle.

69. The load stage of clause 68, wherein the radiation source is configured to illuminate the pellicle at a non-normal angle of incidence and wherein the radiation sensor is configured to measure the position at which reflected radiation is incident on the radiation sensor.

70. The load stage of clause 68, wherein the sensor apparatus comprises a confocal imaging sensor.

71. The load stage of any of clauses 68-70, wherein the sensor apparatus is positioned outside of the chamber and wherein the chamber includes a window configured to allow radiation to propagate into and out of the chamber.

72. The load stage of any of clauses 65-71, wherein the pressure changing apparatus is configured to pump the chamber to vacuum pressure conditions when loading a patterning device into the lithographic apparatus.

73. The load stage of any of clauses 65-72, wherein the pressure changing apparatus is configured to vent the chamber to atmospheric pressure conditions when unloading a patterning device from a lithographic apparatus.

74. The load stage of any of clauses 65-73, further comprising a controller configured to record a change in the position of the pellicle as a function of pressure inside the chamber.

75. The load stage of clause 74, wherein the controller is further configured to detect fatigue of the pellicle from the recorded change in the position of the pellicle as a function of pressure inside the chamber.

76. A method of treating a pellicle, the method comprising:
    heating at least a portion of the pellicle to a temperature greater than a ductile to brittle transition temperature of the pellicle; and
    placing the pellicle under tension, wherein the tension in the pellicle is sufficient to cause plastic deformation of at least a portion of the heated portion of the pellicle.

77. The method of clause 76, wherein heating at least a portion of the pellicle comprises locally heating only some portions of the pellicle.

78. The method of clause 77, wherein heating at least a portion of the pellicle comprises heating a pellicle frame to which the pellicle is attached.

79. The method of clause 77 or 78, wherein heating at least a portion of the pellicle comprises illuminating at least a portion of the pellicle with radiation.

80. The method of clause 79, wherein heating at least a portion of the pellicle comprises illuminating at least a portion of the pellicle with a laser beam.

81. The method of any of clauses 76-80, wherein placing the pellicle under tension comprises suspending the pellicle across a pellicle frame.

82. The method of clause 81, wherein placing the pellicle under tension further comprises creating a pressure difference across the pellicle.

83. A pellicle assembly suitable for use with a patterning device for a lithographic apparatus, the pellicle assembly comprising:
    a frame configured to support a pellicle;
    a pellicle attached to the frame, wherein the pellicle comprises at least one electrically conductive layer; and
    a current source connected across the at least one electrically conductive layer and configured to generate an electrical current through the at least one electrically conductive layer, wherein the current source is configured to generate a current which heats the pellicle through resistive heating such that the temperature of the pellicle is greater than a threshold temperature.

84. The pellicle assembly of clause 83, wherein the threshold temperature is about 120 degrees Celsius.

85. The pellicle assembly of clause 83 or 84, wherein the current source is configured to generate a substantially continuous current through the at least one electrically conductive layer.

86. A pellicle assembly suitable for use with a patterning device for a lithographic apparatus, the pellicle assembly comprising:
    a frame configured to support a pellicle;
    a pellicle attached to the frame; and
    a tension controlling apparatus configured to adjust the tension in the pellicle.

87. The pellicle assembly of clause 86, wherein the tension controlling apparatus comprises at least one heater configured to heat a component of the pellicle assembly, wherein heating the component of the pellicle assembly causes an increase in the tension in the pellicle.

88. The pellicle assembly of clause 87, wherein the at least one heater is configured to heat at least a portion of the pellicle frame.

89. The pellicle assembly of clause 88, wherein the pellicle frame comprises a first layer having a first Young's modulus and a first coefficient of thermal expansion and a second layer having a second Young's modulus greater than the first Young's modulus and a second coefficient of thermal expansion greater than the first coefficient of thermal expansion, wherein the second layer is arranged closer to the pellicle than the first layer.

90. The pellicle assembly of clause 88, wherein the at least one heater is configured to heat at least a portion of the pellicle.

91. The pellicle assembly of clause 90, wherein the pellicle comprises a first layer having a first Young's modulus and a first coefficient of thermal expansion and a second layer having a second Young's modulus greater than the first Young's modulus and a second coefficient of thermal expansion greater than the first coefficient of thermal expansion, wherein the first layer is arranged closer to the pellicle frame than the second layer.

92. The pellicle assembly of clause 90 or 91, wherein the pellicle includes at least one region in which the thickness of the pellicle is greater than the thickness of the remainder of the pellicle.

93. The pellicle assembly of clause 92, wherein the at least one region is proximate to the edge of the pellicle.

94. The pellicle assembly of clause 92 or 93, wherein in the at least one region, the thickness of the second layer is greater than the thickness of the second layer in the remainder of the pellicle.

95. The pellicle assembly of any of clauses 92-94, wherein the at least one heater is configured to locally heat the at least one region of the pellicle having a thickness which is greater than the thickness of the remainder of the pellicle.

96. The pellicle assembly of any of clauses 87-95, wherein the heater is configured to heat at least one component of the pellicle assembly through resistive heating.

97. The pellicle assembly of any of clauses 86-96, wherein the tension controlling apparatus comprises at least one actuator configured to apply a force to the pellicle frame so as to stretch the pellicle frame and increase the tension in the pellicle.

The invention claimed is:

1. A pellicle failure detection apparatus comprising:
a sensor arranged to detect a portion of a radiation beam reflected from a portion of a pellicle arranged to protect a patterning device; and
a controller in communication with the sensor and configured to detect that the pellicle has failed from the detection of reflected radiation made by the sensor, wherein the pellicle has failed if the pellicle has cracked, the pellicle has severed or fractured, the pellicle has at least a part thereof missing or the pellicle has broken.

2. The apparatus of claim 1, further comprising a radiation output configured to illuminate the portion of the pellicle with the radiation beam such that the radiation beam is incident on the pellicle at a non-normal angle of incidence.

3. The apparatus of claim 1, wherein the sensor is arranged to detect diffuse reflection of the radiation beam from the pellicle.

4. The apparatus of claim 1, wherein the controller is configured to detect failure of the pellicle when a measure, made by the sensor, of the intensity of the portion of the radiation beam reflected from the pellicle falls below a threshold value.

5. The apparatus of claim 1, wherein the sensor is further configured to detect a portion of the radiation beam reflected from the patterning device, the portion of the radiation beam reflected from the patterning device being incident on the sensor at a different position to the portion of the radiation beam reflected from the pellicle.

6. The apparatus of claim 5, wherein the sensor comprises a first sensor region configured to detect radiation reflected from the pellicle and a second sensor region configured to detect radiation reflected from the patterning device.

7. A pellicle failure detection apparatus comprising:
a radiation output configured to illuminate, with a radiation beam, a portion of a pellicle protecting a patterning device, wherein the radiation beam is transmitted through the pellicle;
a sensor arranged to receive and measure at least a portion of the radiation beam transmitted through the pellicle; and
a controller in communication with the sensor and configured to detect that the pellicle has failed when a measure of intensity of the radiation received by the sensor increases, wherein the pellicle has failed if the pellicle has cracked, the pellicle has severed or fractured, the pellicle has at least a part thereof missing or the pellicle has broken.

8. The apparatus of claim 7, wherein the patterning device includes a reflective fiducial and wherein the sensor is configured to measure a portion of the radiation beam which is reflected from the fiducial.

9. The apparatus of claim 8, wherein the sensor and the controller are further configured to determine an alignment of a feature formed in the portion of the radiation beam reflected from the fiducial.

10. The apparatus of claim 8, wherein the sensor and the controller are further configured to determine a wavefront aberration in the portion of the radiation beam reflected from the fiducial.

11. A load stage for a lithographic apparatus, the load stage comprising:
a chamber configured to receive a patterning device protected by a pellicle;
a sensor apparatus configured to measure a position of at least a portion of the pellicle situated in the chamber; and
a pressure changing apparatus configured to change a pressure inside the chamber and configured to control a rate at which the pressure inside the chamber is changed to multiple non-zero rates in response to the measurement of the position of at least a portion of the pellicle.

12. The stage of claim 11, wherein the pressure changing apparatus is configured to reduce the rate at which the pressure inside the chamber is changed in response to the measurement indicating that the position of the pellicle lies outside a desired range of the position of the pellicle.

13. The stage of claim 12, wherein the desired range of the position of the pellicle lies between a minimum distance from a patterning device and a maximum distance from the patterning device.

14. The stage of claim 11, wherein the sensor apparatus comprises a radiation source configured to illuminate at least a portion of the pellicle with radiation and a radiation sensor arranged to receive and measure radiation reflected from the pellicle.

15. The stage of claim 14, wherein the radiation source is configured to illuminate the pellicle at a non-normal angle of incidence and wherein the radiation sensor is configured to measure the position at which reflected radiation is incident on the radiation sensor.

16. The stage of claim 14, wherein the sensor apparatus is positioned outside of the chamber and wherein the chamber includes a window configured to allow radiation to propagate into and out of the chamber.

17. The stage of claim 11, wherein the pressure changing apparatus is configured to pump the chamber to vacuum pressure conditions when loading a patterning device into a lithographic apparatus.

18. The stage of claim 11, wherein the pressure changing apparatus is configured to vent the chamber to atmospheric pressure conditions when unloading a patterning device from a lithographic apparatus.

19. The stage of claim 11, further comprising a controller configured to record a change in the position of the pellicle as a function of pressure inside the chamber.

20. The stage of claim 19, wherein the controller is further configured to detect fatigue of the pellicle from the recorded change in the position of the pellicle as a function of pressure inside the chamber.

* * * * *